United States Patent [19]

Ikeda et al.

[11] Patent Number: 5,705,963
[45] Date of Patent: Jan. 6, 1998

[54] LC ELEMENT COMPRISING A REVERSE BIASED PN JUNCTION

[75] Inventors: Takeshi Ikeda, Tokyo; Akira Okamoto, Ageo, both of Japan

[73] Assignee: T.I.F. Co., Ltd., Tokyo, Japan

[21] Appl. No.: 358,770

[22] Filed: Dec. 19, 1994

[30] Foreign Application Priority Data

Dec. 29, 1993 [JP] Japan ................... 5-351823
Sep. 27, 1994 [JP] Japan ................... 6-257537

[51] Int. Cl.$^6$ ................... H04H 7/01; H01L 29/93
[52] U.S. Cl. ................... 333/184; 333/185; 257/531
[58] Field of Search ................... 333/167, 181–185;
327/558; 257/595, 596, 597, 598, 599, 600, 601, 602, 531, 532, 534, 277

[56] References Cited

U.S. PATENT DOCUMENTS

| | | | |
|---|---|---|---|
| 3,022,472 | 2/1962 | Tanenbaum et al. | 257/531 X |
| 3,258,723 | 6/1966 | Osafune et al. | 333/167 |
| 3,328,600 | 6/1967 | Turja et al. | 327/558 |
| 3,778,643 | 12/1973 | Jaffe | 333/81 A X |
| 4,721,985 | 1/1988 | Pavlidis et al. | 333/172 X |
| 5,023,578 | 6/1991 | Kaneko et al. | 333/185 |
| 5,283,462 | 2/1994 | Stengel | 257/595 |
| 5,420,553 | 5/1995 | Sakamoto et al. | 333/185 X |
| 5,492,856 | 2/1996 | Ikeda et al. | 437/60 |

FOREIGN PATENT DOCUMENTS 60-225449 11/1985 Japan.
3-259608 11/1991 Japan.

OTHER PUBLICATIONS

Millman, *Microelectronics: Digital and Analog Circuits and Systems*, 1979, McGraw–Hill, p. 106.

*Primary Examiner*—Benny Lee
*Assistant Examiner*—Justin P. Bettendorf
*Attorney, Agent, or Firm*—Oliff & Berridge

[57] ABSTRACT

An LC element for use with a semiconductor device features excellent attenuation characteristics. The element includes a pn junction that has a predetermined shape and which is formed near the surface of a semiconductor substrate. The predetermined shapes include a spiral shape, a meander shape, a straight shape, and a curved shape. An inductor electrode is formed on the pn junction, and the pn junction is reverse biased with a specified voltage to form a distributed capacitor having a desired capacitance. One of the p and n layers functions as an inductor. The element is easily manufactured and requires minimal assembly, and may also be integrally formed as part of an IC or LSI device.

102 Claims, 47 Drawing Sheets

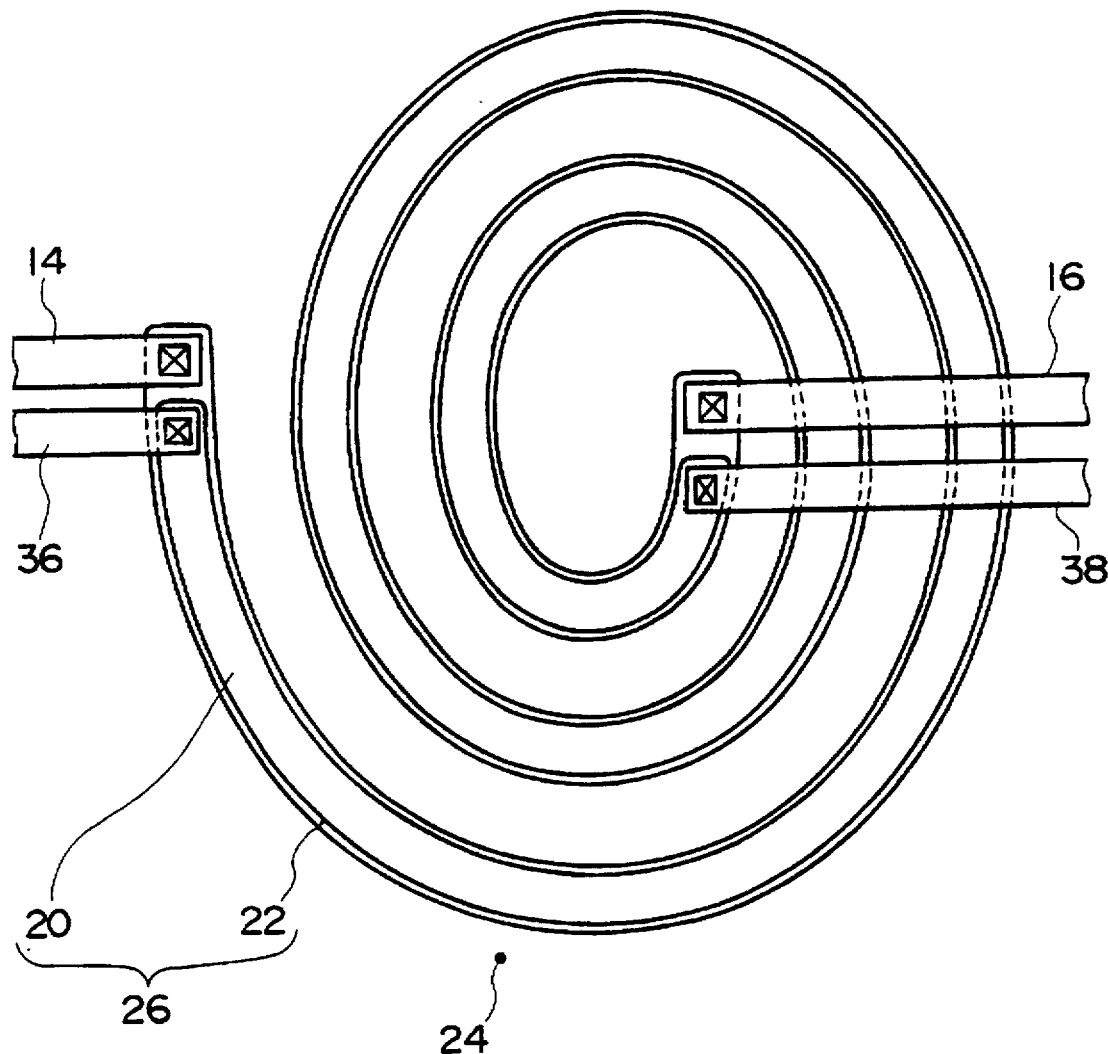

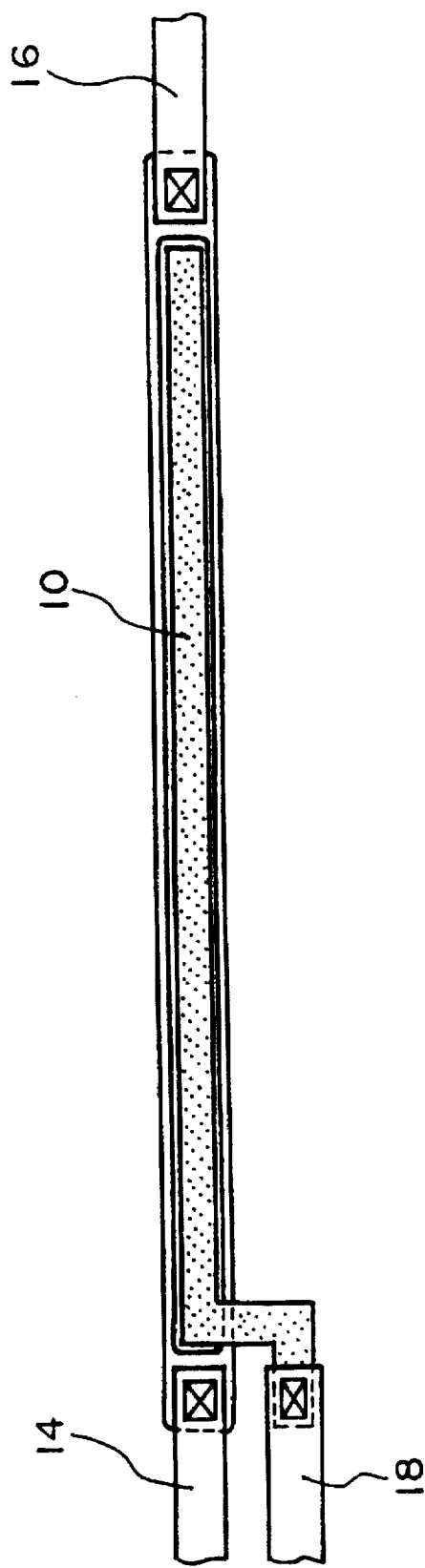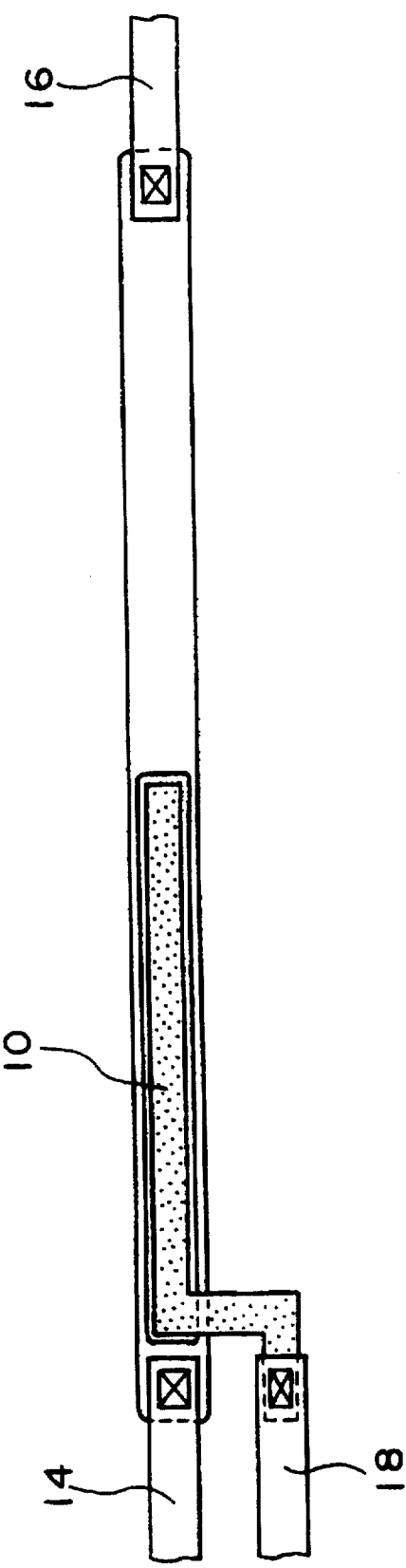

5,705,963

LC ELEMENT COMPRISING A REVERSE BIASED PN JUNCTION

BACKGROUND OF THE INVENTION

1. Field of the Invention

The present invention relates to an LC element and a semiconductor device capable of attenuating a predetermined frequency band and used either as part of a semiconductor or other device, or as a discrete element, and a method for manufacturing such an LC element.

2. Background Art

The rapid advancement of electronics technology in recent years has brought about the use of electronic circuits in an increasingly broad range of fields. Therefore, stable operation of these electronic circuits is sought without being affected by external conditions.

However, electronic circuits are directly or indirectly subject to the incursion of external noise. Consequently, a problem exists whereby operating error is caused in electronic products using electronic circuits in not a few cases.

In particular, there are many cases of using switching regulators as DC power supplies for electronic circuits. As a result of transient current produced by such operations as switching, and by load fluctuations arising from switching operation of utilized digital ICs, large noise having many frequency components is often produced in the switching regulator power supply line. This noise is conveyed via the power supply line or by radiation to other circuits in the same product, giving rise to such effects as operating error and impaired signal to noise ratio, and in some cases even causing operating error in other nearby electronic products.

Various types of noise filters are presently being used with respect to electronic circuits in order to remove noise having such properties. In particular, since a great many electronic products of numerous types have come into use in recent years, the restrictions in regard to noise have grown ever more strict, and development of an LC element having functions as a compact high performance noise filter capable of reliably removing such noise is desired.

One example of this type of LC element is an LC noise filter disclosed in Japanese Patent Application Laid-open No. 3-259608. In the case of this LC noise filter, the L (inductance) and C (capacitance) components exist as distributed constants, and compared to an lumped constant type LC filter, favorable attenuation response can be obtained over a relatively wide band.

However, since this LC filter is manufactured by forming conductors of given shapes on both surfaces of an insulation sheet and by folding over this insulator sheet, manufacturing process of this LC filter has added complexity associated with the folding and other processes.

Also, wiring is required when directly inserting this LC filter into power supply or signal line of an IC or LSI, thus necessitating time and labor for installing the components.

In addition, since this LC filter is formed as a discrete component, inclusion in an IC or LSI circuit, i.e., insertion into the internal wiring of an IC, LSI or other device is nearly impossible.

Furthermore, in the case of this LC noise filter, since a capacitor formed in the manner of a distributed constant is determined by the respective shape and arrangement of the conductors, after completion of the product, the capacitance is fixed. Consequently, the problem arises whereby the overall characteristics are also fixed and use for general purpose applications is restricted. For example, in order to change the capacitance, the shape of the conductor forming the capacitor must be changed. Therefore, freely changing the capacitance according to requirements after incorporation into a particular circuit is difficult.

SUMMARY OF THE INVENTION

Considering the above mentioned points, objects of the present invention are to provide an LC element, and a semiconductor device which enable simplified manufacturing, eliminate the parts assembly operations in subsequent processing, and which can be formed as a part of an IC or LSI device, and to provide a method of manufacturing the LC element.

Another object of the present invention is to provide an LC element, and semiconductor device which allow characteristics to be freely changed by changing the distributed constant type capacitance according to requirements, and a method of manufacturing the LC element.

In order to resolve the above mentioned problems, an LC element according to this invention comprises:

an inductor electrode having a predetermined shape formed on the surface of a semiconductor substrate, and a pn junction layer having a predetermined shape formed at a position along the inductor electrode in a portion of the semiconductor substrate, wherein the pn junction layer comprises a first region comprising a p region or an n region and a second region comprising an inverted region with respect to the first region, and functions as a capacitor when used in the reverse bias state, the first region being connected to the inductor electrode, the inductor electrode and the second region respectively comprise inductors, a distributed constant type capacitor is formed by the pn junction layer in correspondence to these inductors, and at least one of the inductor electrode and the second region is used as a signal transmission line.

In the case of this LC element, the pn junction layer and the electrode formed on the surface thereof have predetermined shapes. The electrode and second region of the pn junction layer respectively function as inductors. The pn junction layer having a predetermined shape used in the reverse bias state is located between these inductors. A distributed constant type capacitor is formed by this pn junction layer between the inductor electrode and the second region of the pn junction layer.

Consequently, a signal input to at least one of the inductor electrode or the second region of the pn junction layer is transmitted via the distributed constant type inductors and capacitor. As a result, excellent attenuation characteristics can be obtained over a wide band.

Since this LC element can be manufactured by forming the pn junction layer on a semiconductor substrate, and then forming the inductor electrode on the surface of the pn junction layer, manufacturing is extremely easy. Also, the LC element can be formed as a portion of an IC or LSI device, in which case assembly work in subsequent processing can be abbreviated.

Another LC element according to this invention comprises an inductor electrode having any one of the shapes spiral, meander, wave, curved line, or straight line.

In the case of this LC element, although the inductor electrode functioning as an inductor and the electrode formed by the pn junction layer are specified as having any one of the shapes spiral, meander, wave, curved line, or straight line, the operation and effects are the same as the above mentioned LC element. Although parameters other than these differences in shape are the same, since the inductance and capacitance of the electrode and second region differ according to the shape, the LC element characteristics also differ according to the shape. But in these cases as well, the electrodes and second regions of each shape respectively function as inductors, while the pn junction layer between them forms a distributed constant type capacitor, thereby functioning as an LC element having excellent attenuation characteristics over a wide band.

Another aspect of this invention relates to any one of the above mentioned LC elements wherein at least the second region of the pn junction layer is formed longer or shorter than the inductor electrode, thereby providing partial correspondence between the inductor electrode and the second region of the pn junction layer.

In the case of this LC element, at least the second region of the pn junction layer is formed longer or shorter than the inductor electrode. In this case as well, the differing length inductor electrode and second region of the pn junction layer respectively function as inductors, while between these, a distributed constant type capacitor is formed by the pn junction layer. Consequently, this LC element has excellent attenuation characteristics over a wide band, while manufacturing is easy and formation as a portion of a substrate is enabled.

Another aspect of this invention relates to any one of the above mentioned LC elements wherein the inductor electrode or at least the second region of the pn junction layer is divided into a plurality and each of the divided segments is electrically connected respectively.

This LC element is used with either the inductor electrode or the pn junction layer divided into a plurality and one portion of the divided segments electrically connected. In this case, by using the undivided side as the signal transmission line, a distributed constant type LC element can be comprised having different characteristics from the LC elements mentioned above. In particular, since each divided segment inductance is small, an LC element can be obtained wherein the influence of the divided segment inductances is small.

Another aspect of this invention relates to any one of the above mentioned LC elements and further comprises:

first and second input/output electrodes respectively provided near the respective ends of either the inductor electrode or the second region of the pn junction layer, and a ground electrode provided near one end of the other one of the inductor electrode and the second region of the pn junction layer.

When an input signal is applied to either the first input/output electrode or the second input/output electrode, an output signal is obtained from the other of these, while the ground electrode is connected to a fixed potential power supply or grounded.

In the case of this LC element, first and second input/output electrodes are respectively provided near the respective ends of either the inductor electrode or the second region of the pn junction layer, while a ground electrode is provided near one end of the other one of these. Either the inductor electrode or the second region of the pn junction layer, provided with the first and second input/output electrodes, is used as the signal transmission line, so that a three-terminal type LC element can be easily comprised.

Another aspect of this invention relates to any one of the above mentioned LC elements and further comprises:

first and second input/output electrodes respectively provided near the respective ends of either the inductor electrode or the second region of the pn junction layer, and third and fourth input/output electrodes respectively provided near the respective ends of the other one of the inductor electrode and the second region of the pn junction layer, wherein:

the inductor electrode and the second region of the pn junction layer are respectively used as signal transmission lines to enable use as a common mode type element.

In the case of this LC element, by also providing third and fourth input/output electrodes at the respective ends of the other one of the inductor electrode and the second region of the pn junction layer, a four-terminal common mode type LC element can be easily comprised.

Another aspect of this invention relates to any one of the above mentioned LC elements wherein:

by changing reverse bias voltage applied to the pn junction layer, the capacitance of the pn junction layer is changed.

In the case of this LC element, the reverse bias voltage applied to the pn junction layer can be variably set. As a result, the pn junction layer capacitance can be changed and the attenuation characteristics, i.e., frequency response, can be variably controlled according to requirements.

Another aspect of this invention relates to any one of the above mentioned LC elements and further comprises:

a buffer connected to the output side of the signal transmission line.

In the case of this LC element, a buffer is connected for amplifying the output signal via the signal transmission line, thereby enabling such functions as signal amplification, output impedance adjustment, and preventing influence from subsequent stage circuits.

According to another aspect of this invention, any one of the above mentioned LC elements is formed on a semiconductor substrate further comprising terminals by forming an insulation layer on the entire surface of this semiconductor substrate;

opening perforations in portions of this insulation layer by etching or laser light emission; and then closing the perforations by solder applied to the extent of protruding slightly from the surface.

As a result, a surface mounting type LC element can be easily manufactured, in which case work for installing this LC element can be easily performed.

A semiconductor device according to this invention comprises any one of the above mentioned LC elements formed as a portion of a semiconductor substrate, wherein:

at least one of the inductor electrode or second region of the pn junction layer is inserted into the signal line or power supply line.

In the case of this semiconductor device, any one of the above mentioned LC elements is formed in a portion of the substrate and inserted into the signal line or power supply line of the semiconductor device. As a result, the LC element can be manufactured in unitized manner with other components on the semiconductor substrate, in which case, manufacturing is easy and parts assembly work in subsequent processing is unnecessary.

Another aspect of this invention relates to any one of the above mentioned LC elements and semiconductor device wherein:

the inductor electrode is omitted and this function is performed by the first region of the pn junction layer.

In this case, the first and second regions of the pn junction layer respectively function as inductors, while a distributed constant type capacitor is formed between these by the pn junction layer.

Consequently, in the same manner as the above mentioned LC elements, such advantages as excellent attenuation characteristics and ease of manufacture can be obtained. In addition, since the inductor electrode is not formed on the semiconductor surface, this electrode forming process is unnecessary. Manufacturing ease is further increased, while the vacated semiconductor surface area can be effectively utilized for other purposes.

An LC element manufacturing method according to this invention comprises the steps of:

- a first process whereby a pn junction layer having a predetermined shape and comprising a first region and a second region inverted with respect thereto is formed on a semiconductor substrate;
- a second process whereby an inductor electrode electrically connected over the entire length of the first region is formed on the surface of the pn junction layer; and
- a third process whereby a wiring layer is formed respectively connected to both ends or one end of the inductor electrode and the second region of the pn junction layer.

Another LC element manufacturing method according to this invention comprises the steps of:

- a first process whereby a pn junction layer having a predetermined shape and comprising a first region and a second region inverted with respect thereto is formed on a semiconductor substrate; and
- a second process whereby an inductor electrode electrically connected over the entire length of the first region is formed on the surface of the pn junction layer.

These LC element manufacturing methods utilize semiconductor manufacturing technology for manufacturing any one of the above mentioned LC elements. In other words, a pn junction layer having a predetermined shape is first formed, or a pn junction layer having a predetermined shape is first formed together with an inductor electrode, then a wiring layer connected thereto is formed to complete the LC element.

In this manner, the LC element can be manufactured by using ordinary semiconductor manufacturing technology, thereby enabling down-sizing and cost reduction, as well as simultaneous mass production of a plurality of individual LC elements.

BRIEF DESCRIPTION OF THE DRAWINGS

FIG. 20 indicates an example of a variation of an LC element in accordance with the fifth embodiment;

FIGS. 30A and 30B are a plan views of LC elements in accordance with a ninth embodiment of this invention;

DETAILED DESCRIPTION OF THE PREFERRED EMBODIMENTS

Following is a description of the preferred embodiments of the LC elements in accordance with this invention with reference to the attached drawings.

FIRST EMBODIMENT

Figure 1:
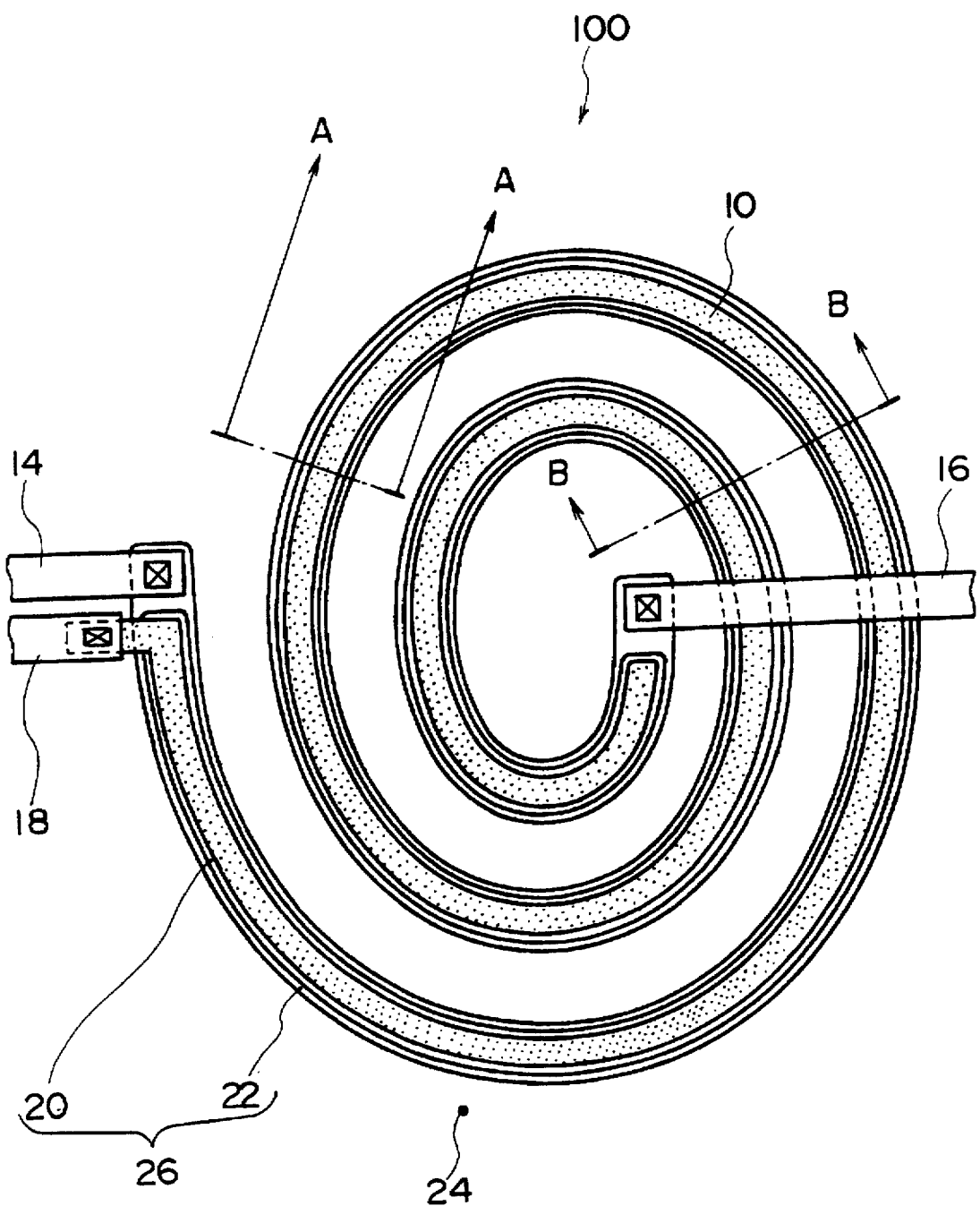
FIG. 1 is a plan view of an LC element in accordance with a first embodiment of this invention.
Figure 2:
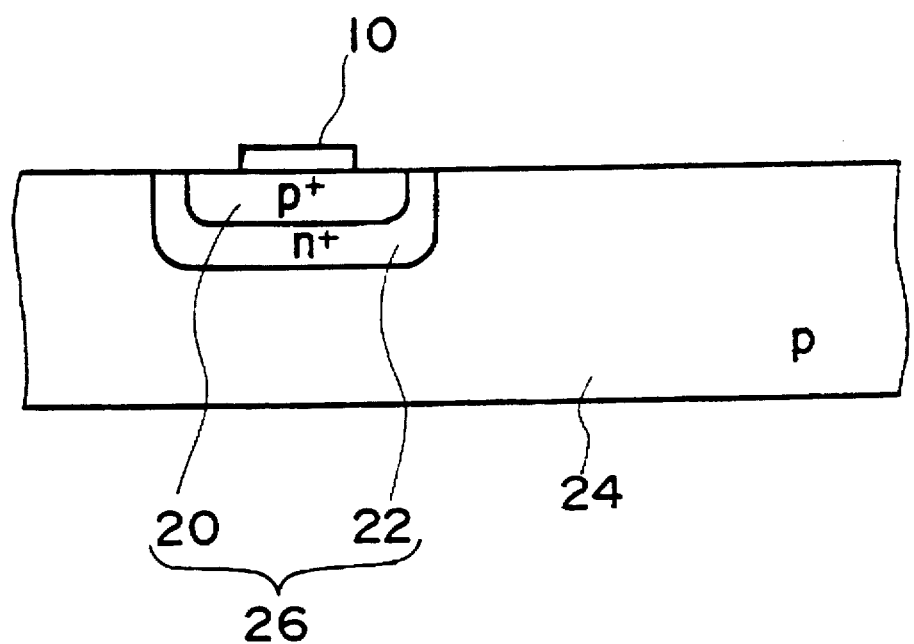
FIG. 2 is an enlarged cross-sectional view viewed along line A—A in FIG. 1.

FIG. 1 is a plan view of an LC element in accordance with a first embodiment of this invention. FIG. 2 is an enlarged cross-sectional view viewed along line A—A in FIG. 1.

As indicated in the figures, the LC element 100 of this embodiment comprises a spiral shaped $n^+$ region 22 formed near the surface of a p type silicon (p-Si) substrate 24 and a $p^+$ region 20 further formed in a portion of the $n^+$ region 22. The $n^+$ region 22 and $p^+$ region 20 form a pn junction layer 26.

Also the $n^+$ region 22 and $p^+$ region 20 are respectively provided with higher impurity than the p-Si substrate 24. By applying reverse bias voltage between the p-Si substrate 24 and $n^+$ region 22, the p-Si substrate 24 functions as an isolation region. In practice, the reverse bias voltage can be applied by setting the potential of the p-Si substrate 24 to be the same as that of the ground electrode 18 (described below).

The LC element 100 of this embodiment further comprises a spiral shaped inductor electrode 10 formed at a position along the $p^+$ region 20 on the $p^+$ region 20 surface. A ground electrode 18 is connected to one end (for example, the outer end) of the inductor electrode 10. Two input/output electrodes 14 and 16 are respectively connected to the respective ends of the $n^+$ region 22 abovementioned.

As indicated in FIG. 1, the ground electrode 18 attachment to the inductor electrode 10 is performed outside the active region so as not to damage the thin $p^+$ region 20. Also, insulation is needed when connecting the inductor electrode 10 and ground electrode 18 (and other electrodes as well) in order to prevent contact between the ground electrode 18 and the $n^+$ region 22 or p-Si substrate 24. Therefore, an oxide film or other insulation layer is formed beforehand in portions where insulation is required.

When the LC element 100 has this type of construction, the spiral shaped inductor electrode 10 and the $n^+$ region 22 respectively function as inductors. Also, when the pn junction layer 26 of which $p^+$ region 20 electrically connected to the inductor electrode 10 is used in the reverse bias state, the function of a spiral shaped capacitor is obtained. Consequently, the LC element 100 comprises distributed constant type inductors formed by the inductor electrode 10 and $n^+$ region 22, and a capacitor formed by the pn junction layer 26.

Figure 3A:
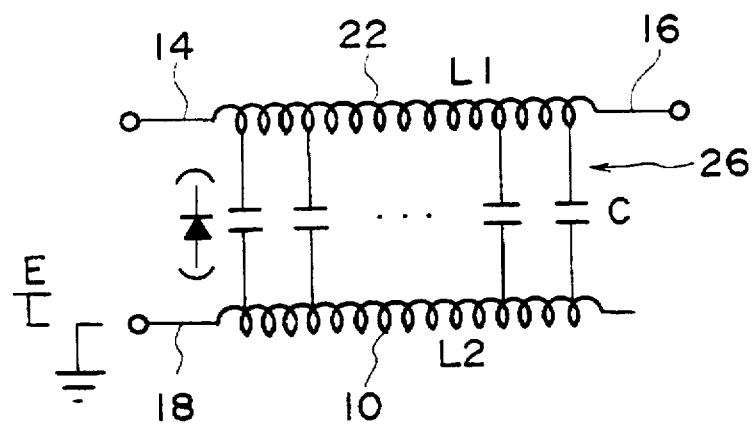
FIGS. 3A, 3B and 3C are schematic diagrams indicating equivalent circuits of LC elements in accordance with the first embodiment.
Figure 3B:
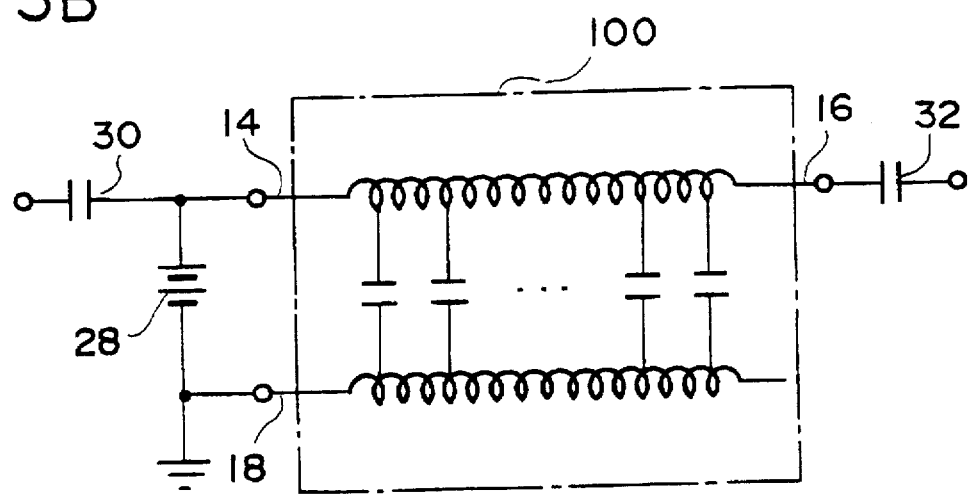
Figure 3C:
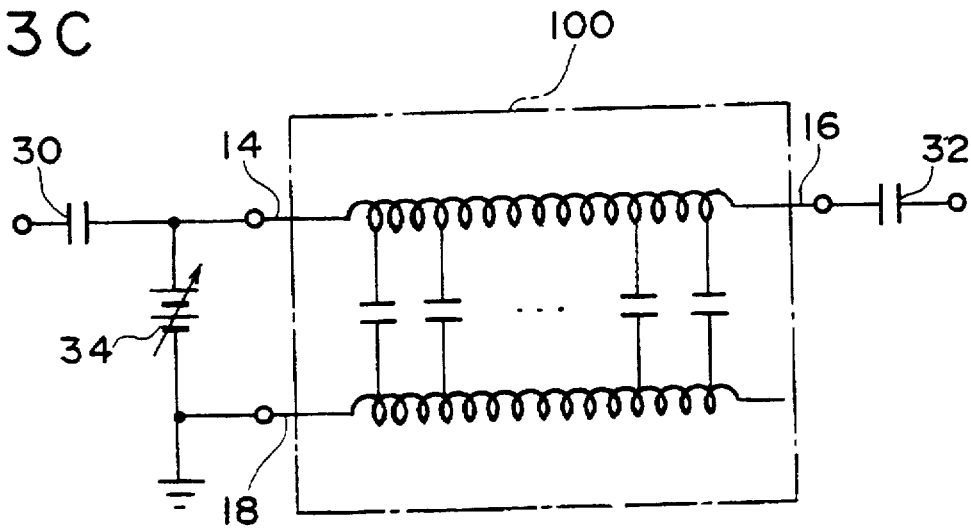

FIGS. 3A, 3B and 3C indicate equivalent circuits of the LC element 100. As indicated in FIG. 3A, the $p^+$ region 22 of the pn junction layer 26 functions as an inductor having inductance L1. A signal input to one input/output electrode 14 is transmitted via the $p^+$ region 22 and output from the other input/output electrode 16. Also, the inductor electrode 10 functions as an inductor having inductance L2 with the ground electrode 18 connected to one end thereof grounded or connected to a fixed potential E power supply.

Since this type of connection mode applies reverse bias to the pn junction layer 26 comprising $n^+$ 22 and $p^+$ 20 regions, when the voltage level of a signal input to the input/output electrode 14 is set higher than the voltage level of the ground electrode 18 (0 V or fixed potential E), the pn junction layer 26 functions as a capacitor having capacitance C. Also, this capacitor is formed as a distributed constant over the entire length of the inductor electrode 10 and thus, superb attenuation characteristics can be obtained that were unavailable with conventional lumped constant type LC elements.

FIG. 3B shows an example of forcibly applying reverse bias to the pn junction layer 26 and thereby ensuring the pn junction layer 26 operation as a capacitor. In practice, a bias power supply 28 is connected for applying a predetermined reverse bias voltage between the input/output electrode 14 and ground electrode 18, while a capacitor 30 is connected to the input/output electrode 14 side for removing only the DC component from the input signal. By providing this type of circuit, a fixed reverse bias voltage can be continuously applied with respect to the pn junction layer 26, while a signal overlapped on this reverse bias can be reliably input to the LC element 100.

Since reverse bias voltage is applied to the signal output from the input/output electrode 16, inserting an additional capacitor 32 is recommended for removing this reverse bias voltage.

In place of the abovementioned bias power supply 28, a variable bias power supply can be connected as indicated in FIG. 3C to enable changing the reverse bias voltage level as required. In general, since the depletion layer width produced in the pn junction plane varies according to the size of the reverse bias voltage applied to the pn junction layer 26, the capacitance C also varies accordingly. Consequently, by varying the reverse bias voltage applied to the pn junction layer 26 via the input/output electrode 14 and ground electrode 18, the distributed constant type capacitance C is changed, thereby allowing the overall attenuation characteristics of the LC element 100 to be adjusted or changed.

FIGS. 4A–4D are cross-sectional views viewed along line B—B in FIG. 1 showing the state at each stage of a manufacturing process for the LC element 100.

1) Epitaxial layer growth

Figure 4A:
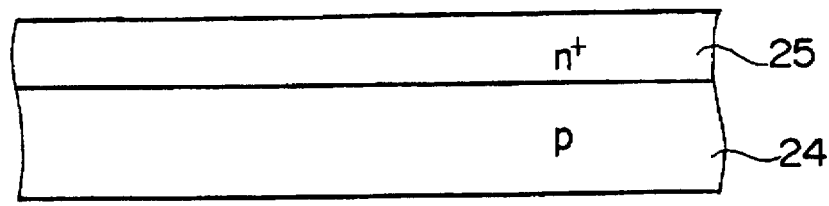
FIGS. 4A–4D indicate an example of a manufacturing process for an LC element in accordance with the first embodiment.

After removing oxide film from the surface of a p-Si substrate 24 (wafer), an $n^+$ type epitaxial layer 25 is grown on the p-Si substrate 24 (FIG. 4A).

2) Isolation region formation

Except for the areas of the $n^+$ region 22 and $p^+$ region 20 indicated in FIG. 1, p type impurities are injected by diffusion or ion implantation for forming an isolation region.

Figure 4B:
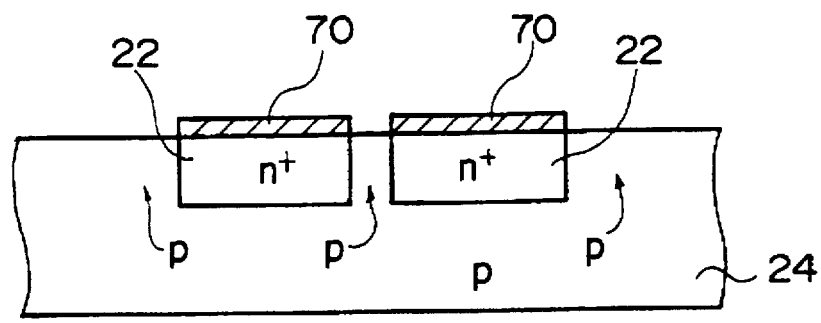

In practice, an oxidation film 70 is formed on the surface of the epitaxial layer 25 by thermal oxidation. The oxidation film 70 is removed from the position for forming the p region by photo-lithography. The p region is then selectively formed by selectively adding p type impurities by thermal diffusion or ion injection. The p region formed in this manner comprises an isolation region in a portion of the p-Si substrate 24 (FIG. 4B).

As a result of forming the isolation layer in this manner, the spiral shaped $n^+$ region 22 is formed by the remaining epitaxial layer 25.

3) pn junction layer formation

A spiral shaped $p^+$ region 20 is formed in a portion of the spiral shaped $n^+$ region 22 by introducing p type impurities by thermal diffusion or ion injection.

In practice, an oxidation film 72 is formed by thermal oxidation on the surface of the p-Si substrate 24 which includes the $n^+$ region 22. The oxidation film 72 is removed from the position for forming the $p^+$ region 20 by photolithography. The $p^+$ region 20 is then selectively formed by selectively adding p type impurities by thermal diffusion or ion injection.

Figure 4C:
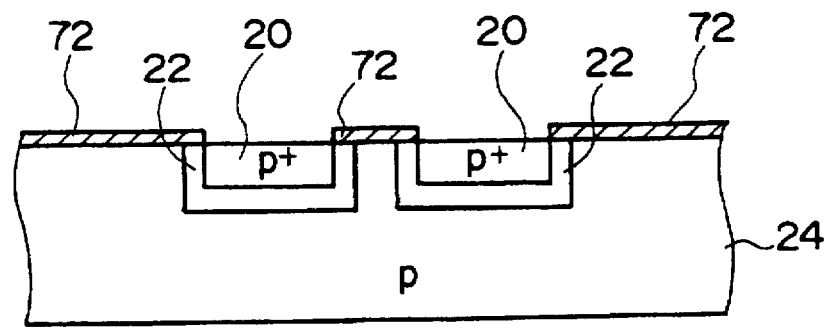

Since this $p^+$ region 20 needs to be formed in the previously formed $n^+$ region 22, the $p^+$ region 20 is formed by adding p type impurities in an amount exceeding the already introduced n type impurities (FIG. 4C).

In this manner the spiral shaped pn junction layer 26 is formed comprising the $n^+$ region 22 and $p^+$ region 20.

4) Inductor electrode formation

Figure 4D:
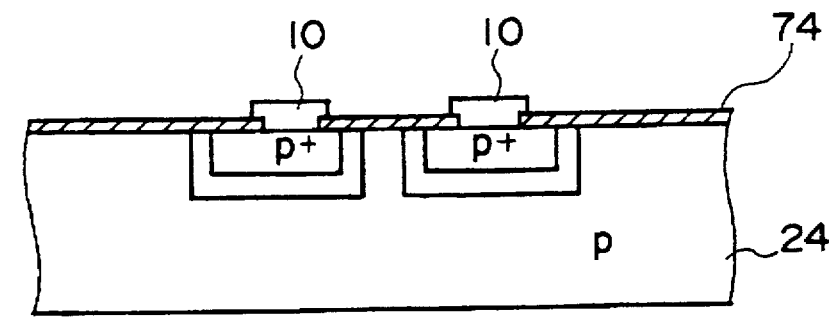

An oxidation film 74 is formed in the surface by thermal oxidation. A spiral shaped channel is opened in the $p^+$ region 20 surface by photo-lithography, then the inductor electrode 10 is formed (for example, by aluminum vapor deposition) in the spiral shaped channel portion (FIG. 4D). Afterwards, the ground electrode 18 is formed near one end of the inductor electrode 10, and two input/output electrodes 14, 16 are formed near the respective ends of the $n^+$ region 22 by vapor deposition of aluminum or other material.

Finally, P-glass is applied to the entire surface and heated to provide a flat surface, thereby completing the LC element 100.

The LC element 100 manufacturing process basically resembles that of an ordinary bipolar transistor or diode and differs only in such aspects as shape and/or dimensions of the pn junction layer 26 and intervening isolation region. Consequently, the ordinary bipolar transistor manufacturing process can be used by changing the form of the photomask, while manufacturing is easy and suitable for down-sizing. The LC element 100 can also be formed on the same substrate with an ordinary semiconductor components such as bipolar transistors or MOSFETs, and can be formed as a portion of an IC or LSI device. Also, when formed as a portion of an IC or LSI device, assembly work in subsequent processing can be abbreviated.

The above manufacturing process description referred to an example of first forming an $n^+$ region on the entire surface by epitaxial growth, then performing isolation. However, an example of an alternative process can comprise:

first, form an oxidation film on the p-Si substrate 24, then open a window corresponding to the spiral shaped $n^+$ region 22 by photo-lithography;

form the $n^+$ region 22 in this portion by introducing n type impurities by thermal diffusion or ion injection, then directly form the $p^+$ region 20 by the same method as in the above manufacturing process description. Also, ordinary semiconductor manufacturing technology can be used as a method for forming the pn junction layer.

In this manner, the inductor electrode 10 and $n^+$ region 22 of the pn junction layer 26 respectively form inductors, while a capacitor function is obtained by using the spiral shaped pn junction layer 26 formed along the inductor electrode 10 with reverse bias. Also, since the pn junction layer 26 is formed over the entire length of the inductor electrode 10, the inductors formed by the $n^+$ region 22 and the inductor electrode 10 respectively have inductances L1 and L2, while the distributed constant type capacitor formed by the pn junction layer 26 has capacitance C.

Consequently, by grounding or connecting the ground electrode 18 provided at one end of the inductor electrode 10 to a fixed potential and using the $n^+$ region 22 of the pn junction layer 26 as the signal input/output line, an LC element is comprised having excellent attenuation characteristics over a wide band with respect to the input signal.

Since the above described LC element 100 can be manufactured using ordinary bipolar transistor type manufacturing technology, manufacturing is easy and applicable to such objectives as down-sizing. Also, when the LC element is manufactured as a portion of a semiconductor substrate, wiring can be performed simultaneously with other components and work such as assembly can be abbreviated in subsequent processing.

Also, by changing the reverse bias voltage applied to the pn junction layer 26, the capacitance C of the distributed constant type capacitor can be variably controlled, and the overall frequency response of the LC element 100 can be adjusted or changed.

The above description referred to an example of using the spiral shaped $n^+$ region 22 as the signal transmission line. However, by providing the ground electrode 18 at one end of the $n^+$ region 22, and providing input/output electrodes 14 and 16 at the respective ends of the inductor electrode 10, the inductor electrode 10 side can be used as the signal transmission line. In general, since the comparative resistance of the $n^+$ region 22 is higher than the inductor electrode 10, by changing the signal transmission line, an LC element having different attenuation characteristics, frequency response, can be comprised.

Also, the above description referred to an example of using the inductor electrode 10 as one inductor and the $n^+$ region 22 of the pn junction layer 26 as another inductor. However, the inductor electrode 10 can be deleted and the region 20 of the pn junction layer 26 used as one inductor. In other words, in this case, while the pn junction layer 26 functions as a capacitor, both the $p^+$ region 20 and $n^+$ region 22 comprising the pn junction layer 26 can be used as inductors.

Figure 5:
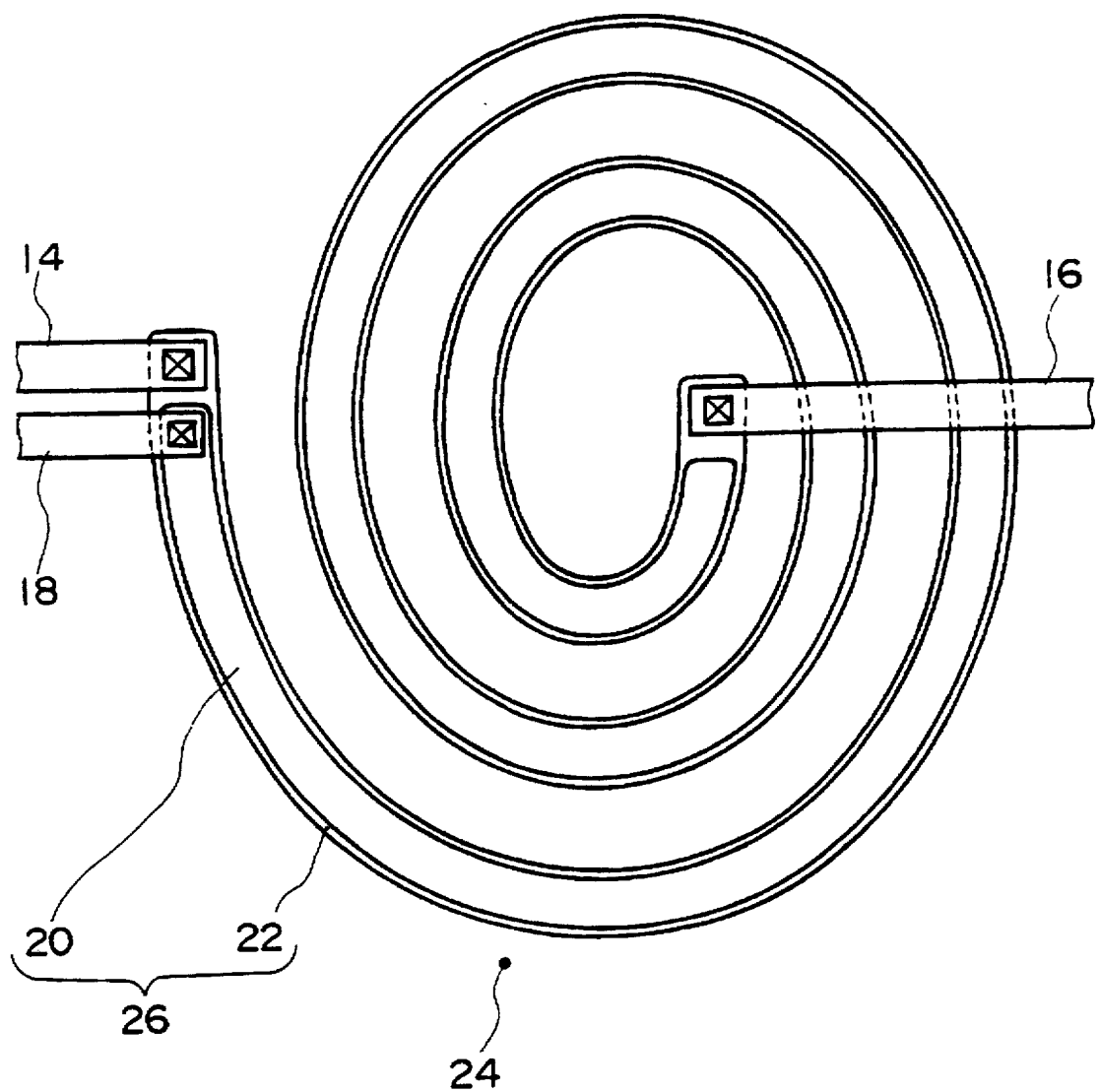
FIG. 5 indicates an example of a variation of an LC element in accordance with the first embodiment.

FIG. 5 indicates an example of a variation of the LC element according to this embodiment wherein an inductor electrode is not used. As indicated in the figure, the ground electrode 18 is provided at one end of the $p^+$ region 20 comprising the pn junction layer 26, while two input/output electrodes 14 and 16 are provided at the respective ends of the $n^+$ region 22. In this case, both the $p^+$ region 20 and $n^+$ region 22 comprising the pn junction layer 26 function as inductors, while the pn junction layer 26 formed by these functions as a distributed constant type capacitor. In the same manner as the LC element 100 indicated in FIG. 1, such advantages as excellent attenuation characteristics and ease of manufacture are obtained. Also, when manufacturing this LC element, the inductor electrode 10 forming process indicated in FIG. 4D can be omitted.

Also, in the case of the LC element shown in FIG. 5, the connection relationships of the two input/output electrodes 14 and 16, and the ground electrode 18 can be interchanged, and the $p^+$ region 20 used as the signal transmission line.

SECOND EMBODIMENT

An LC element according to a second embodiment of this invention is fundamentally the same as the first embodiment and differs mainly by having non-spiral shapes for the inductor electrode 10 and pn junction layer 26. In the drawings, the same designations are used for items that correspond to those of the first embodiment.

Figure 6:
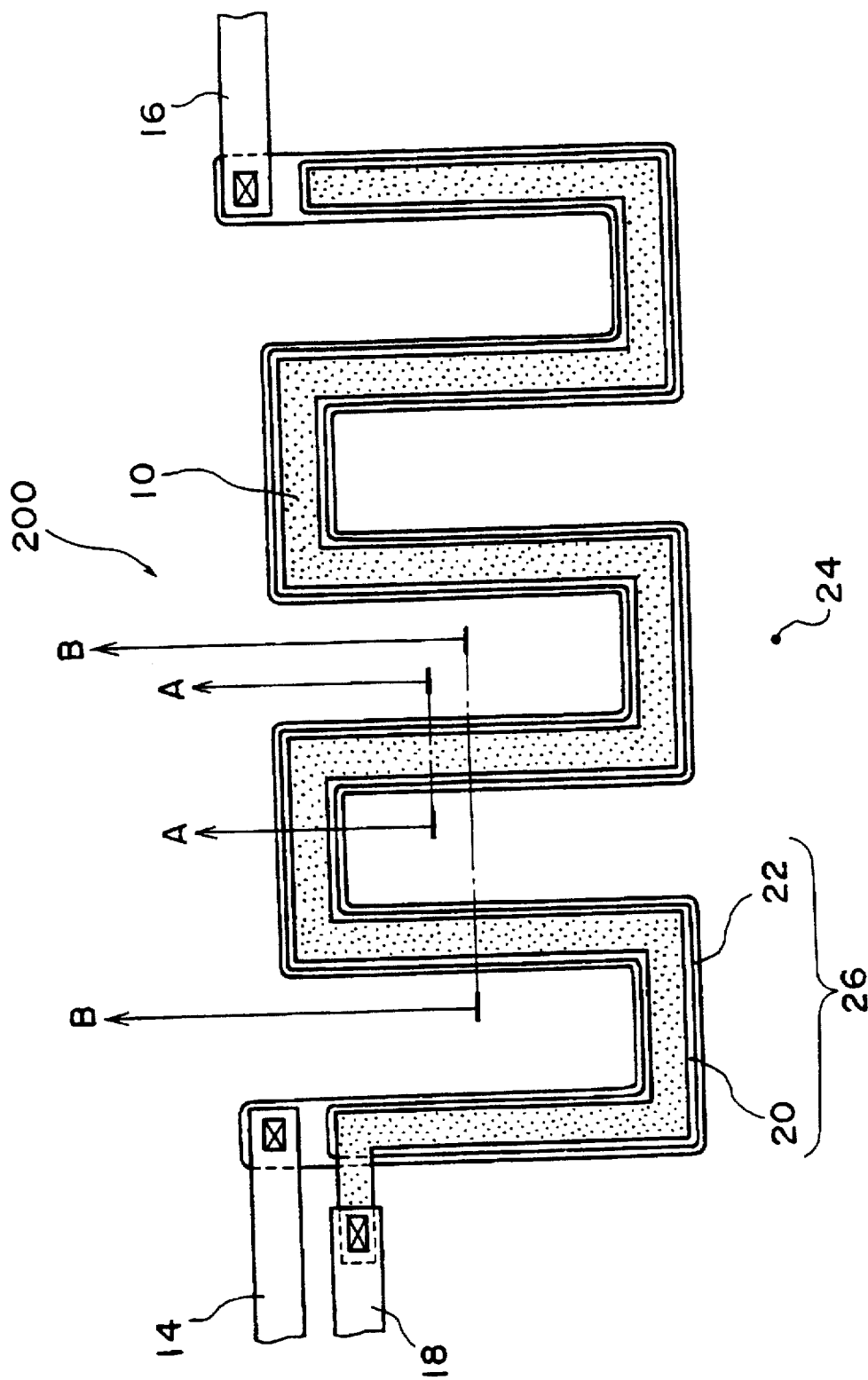
FIG. 6 is a plan view of an LC element in accordance with a second embodiment of this invention.

FIG. 6 is a plan view of an LC element according to the second embodiment. FIG. 2 is an enlarged cross-sectional view viewed along line A—A in FIG. 6.

As indicated in the figures, the LC element 200 of this embodiment comprises a meander shaped $p^+$ region 22 formed near the surface of a p type silicon (p-Si) substrate 24 and a meander shaped $p^+$ region 20 further formed in a portion of the $n^+$ region 22. The $n^+$ region 22 and $p^+$ region 20 form a pn junction layer 26. Also the $n^+$ region 22 and $p^+$ region 20 are respectively provided with higher impurities than the p-Si substrate 24. By applying reverse bias voltage between the p-Si substrate 24 and $n^+$ region 22, the p-Si substrate 24 functions as an isolation region. In practice, setting the potential of the p-Si substrate 24 to be the same as that of the ground electrode 18 (described below) is equivalent to applying reverse bias voltage.

The LC element 100 of this embodiment further comprises a meander shaped inductor electrode 10 is formed on a position along the $p^+$ region 20 on the $p^+$ region 20 surface. A ground electrode 18 is connected to one end (for example, the outer end) of the inductor electrode 10. Two input/output electrodes 14 and 16 are respectively connected to the respective ends of the $n^+$ region 22.

As indicated in FIG. 6, the ground electrode 18 attachment to the inductor electrode 10 is performed outside the active region so as not to damage the thin $p^+$ region 20. Also, insulation is needed when connecting the inductor electrode 10 and ground electrode 18 (and other electrodes as well) in order to prevent contact between the ground electrode 18 and the $n^+$ region 22 or p-Si substrate 24. Therefore, an oxide film or other insulation layer is formed beforehand in portions where insulation is required.

When the LC element 200 has this type of construction, the meander shaped inductor electrode 10 and the $n^+$ region 22 respectively function as inductors. Also, when the pn junction layer 26 of which $p^+$ region 20 electrically connected to the inductor electrode 10 is used in the reverse bias state, the function of a meander shaped capacitor is obtained. Consequently, the distributed constant type LC element 200 is formed comprising inductors formed by the inductor electrode 10 and $n^+$ region 22, and a capacitor formed by the pn junction layer 26.

Figure 7:
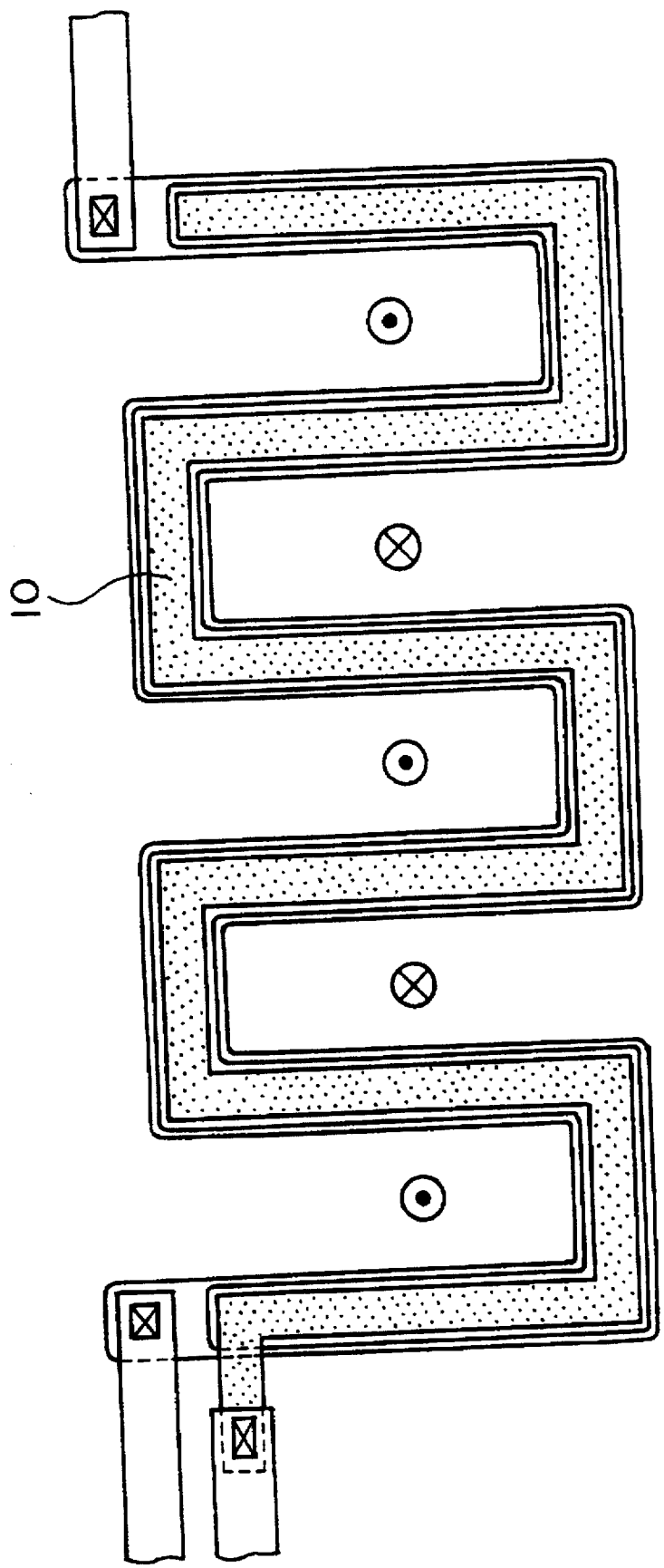
FIG. 7 indicates the principle of an inductor formed by a meander shaped electrode.

FIG. 7 indicates the principle of an inductor formed by a meander shaped electrode. When current flows in a single direction in a meander shaped electrode 10 having concave and convex bends, magnetic flux is alternately produced so as to reverse the direction in adjacent concave and convex bends (for example, perpendicularly upward from the figure near the locations indicated by circled dots in FIG. 7, and perpendicularly downward near the locations indicated by circled Xs), thereby resembling the state when ½ turn coils are connected in series. Consequently, an element having a meander shape such as indicated in FIG. 7 can be made to function as an inductor having an overall predetermined inductance.

Equivalent circuits of the LC element 200 are the same as those of the LC element 100 shown in FIGS. 3A, 3B and 3C and their operations are also the same as described for the first embodiment.

Manufacture of the LC element 200 is also the same as described for the LC element 100 of the first embodiment.

The LC element 200 manufacturing process also basically resembles that of an ordinary bipolar transistor or diode and differs only in such aspects as shape and/or dimensions of the pn junction layer 26 and intervening isolation region. Consequently, the ordinary bipolar transistor manufacturing process can be used by changing the form of the photomask, while manufacturing is easy and suitable for down-sizing. The LC element 200 can also be formed on the same substrate with an ordinary semiconductor components such as bipolar transistors or MOSFETs, and can be formed as a portion of an IC or LSI device. Also, when formed as a portion of an IC or LSI device, assembly work in subsequent processing can be abbreviated.

In this manner, the inductor electrode 10 and $p^+$ region 22 of the pn junction layer 26 respectively form inductors, while a capacitor function is obtained by using the meander shaped pn junction layer 26 formed along the inductor electrode 10 with reverse bias. Also, since the pn junction layer 26 is formed over the entire length of the inductor electrode 10, the inductors formed by the $n^+$ region 22 and the inductor electrode 10 respectively have inductances L1 and L2, while the distributed constant type capacitor formed by the pn junction layer 26 has capacitance C.

Consequently, by grounding or connecting the ground electrode 18 provided at one end of the inductor electrode 10 to a fixed potential and using the $n^+$ region 22 of the pn junction layer 26 as the signal input/output line, an LC element is comprised having excellent attenuation characteristics over a wide band with respect to the input signal.

Since the above described LC element 200 can be manufactured using ordinary bipolar transistor type manufacturing technology, manufacturing is easy and applicable to such objectives as down-sizing. Also, when the LC element is manufactured as a portion of a semiconductor substrate, wiring can be performed simultaneously with other components and work such as assembly can be abbreviated in subsequent processing.

Also, by changing the reverse bias voltage applied to the pn junction layer 26, the capacitance C of the distributed constant type capacitor can be variably controlled, and the overall frequency response of the LC element 200 can be adjusted or changed.

The above description referred to an example of using the meander shaped $n^+$ region 22 as the signal transmission line. However, by providing the ground electrode 18 at one end of the $n^+$ region 22, and providing input/output electrodes 14 and 16 at the respective ends of the inductor electrode 10, the inductor electrode 10 can be used as the signal transmission line. In general, since the comparative resistance of the $n^+$ region 22 is higher than the inductor electrode 10, by changing the signal transmission line, an LC element having different attenuation characteristics, i.e., frequency response, can be comprised.

Also, the above description referred to an example of using the inductor electrode 10 as one inductor and the $n^+$ region 22 of the pn junction layer 26 as another inductor. However, the inductor electrode 10 can be deleted and the $p^+$ region 20 of the pn junction layer 26 used as one inductor. In other words, in this case, while the pn junction layer 26 functions as a capacitor, both the $p^+$ region 20 and $n^+$ region 22 comprising the pn junction layer 26 can be used as inductors.

Figure 8:
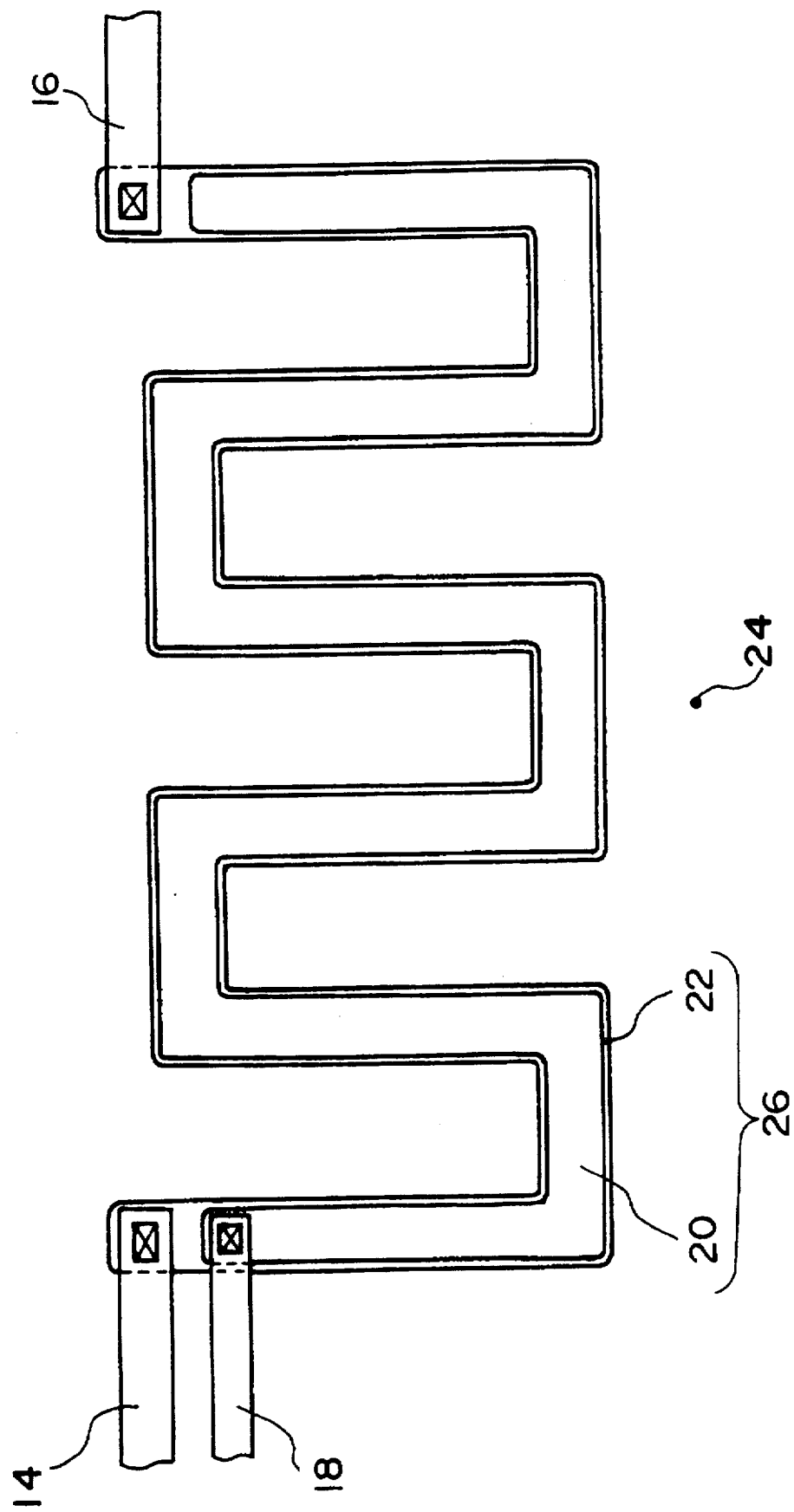
FIG. 8 indicates an example of a variation of an LC element in accordance with the second embodiment.

FIG. 8 indicates an example of a variation of the LC element according to this embodiment wherein an inductor electrode is not used. As indicated in the figure, the ground electrode 18 is provided at one end of the $p^+$ region 20 comprising the pn junction layer 26, while two input/output electrodes 14 and 16 are provided at the respective ends of the n⁺ region 22. In this case, both the p⁺ region 20 and n⁺ region 22 comprising the pn junction layer 26 function as inductors, while the pn junction layer 26 formed by these functions as a distributed constant type capacitor. In the same manner as the LC element 200 indicated in FIG. 6, such advantages as excellent attenuation characteristics and ease of manufacture are obtained. Also, when manufacturing this LC element, the inductor electrode 10 forming process can be omitted.

Also, in the case of the LC element indicated in FIG. 8, the connection relationships of the two input/output electrodes 14 and 16, and the ground electrode 18 can be interchanged, and the p⁺ region 20 used as the signal transmission line.

THIRD EMBODIMENT

Following is a description of a third embodiment of this invention with reference to the attached drawings.

In the case of the above mentioned LC element 100 of the first embodiment, the pn junction layer 26 is formed essentially over the entire length of the inductor electrode 10. According to the third embodiment, the inductor electrode 10 is formed approximately one turn shorter than shown in FIG. 1.

Figure 9:
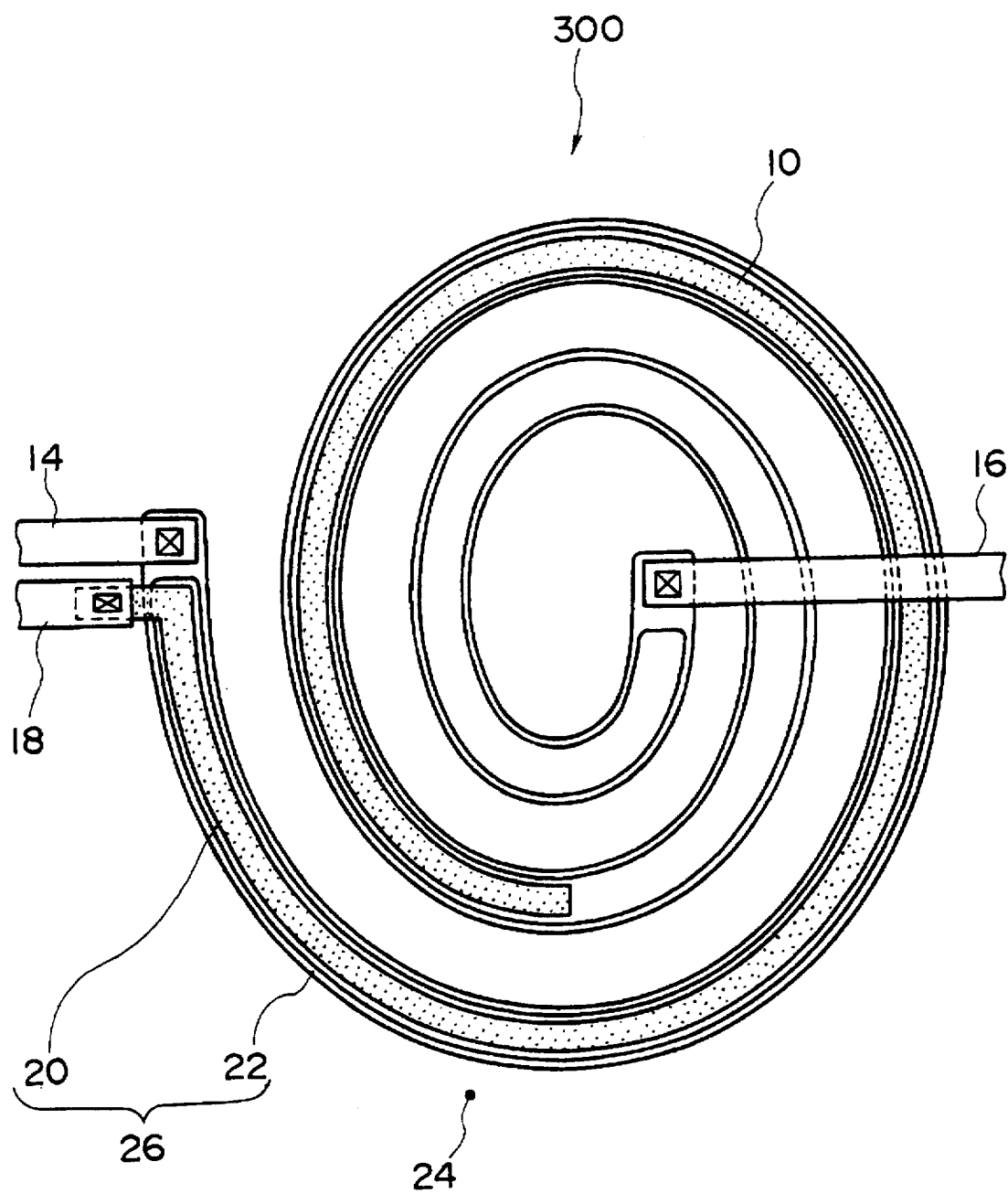
FIG. 9 is a plan view of an LC element in accordance with a third embodiment of this invention.

FIG. 9 is a plan view of the LC element 300 according to the third embodiment. As indicated in the figure, even when the inductor electrode 10 is partially omitted, the shortened inductor electrode 10 and long p⁺ region 22 of the pn junction layer 26 respectively comprise inductors, while the portion of the pn junction layer 26 opposing the shortened inductor electrode 10 comprises a distributed constant type capacitor. Therefore, in the same manner as the LC element 100 indicated in FIG. 1, excellent attenuation characteristics are obtained.

Figure 10A:
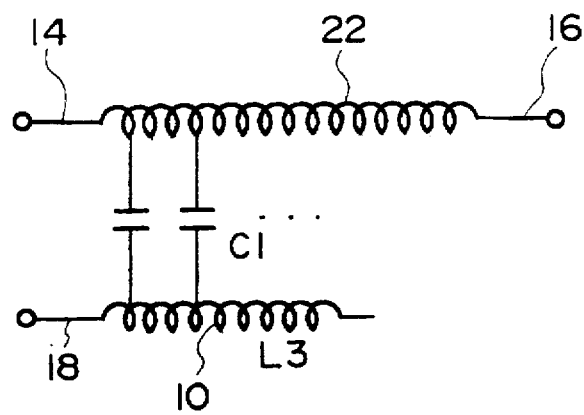
FIGS. 10A, 10B and 10C are schematic diagrams indicating equivalent circuits of LC elements in accordance with the third embodiment.
Figure 10B:
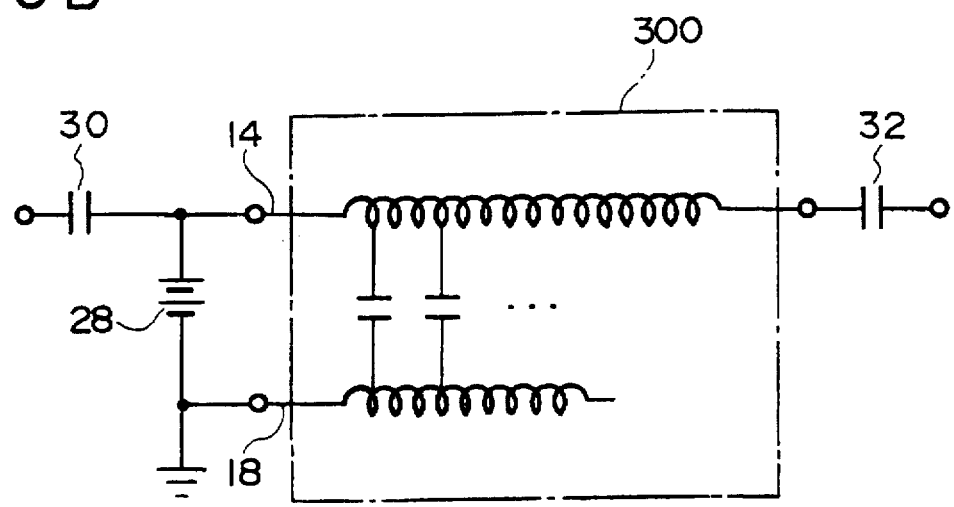
Figure 10C:
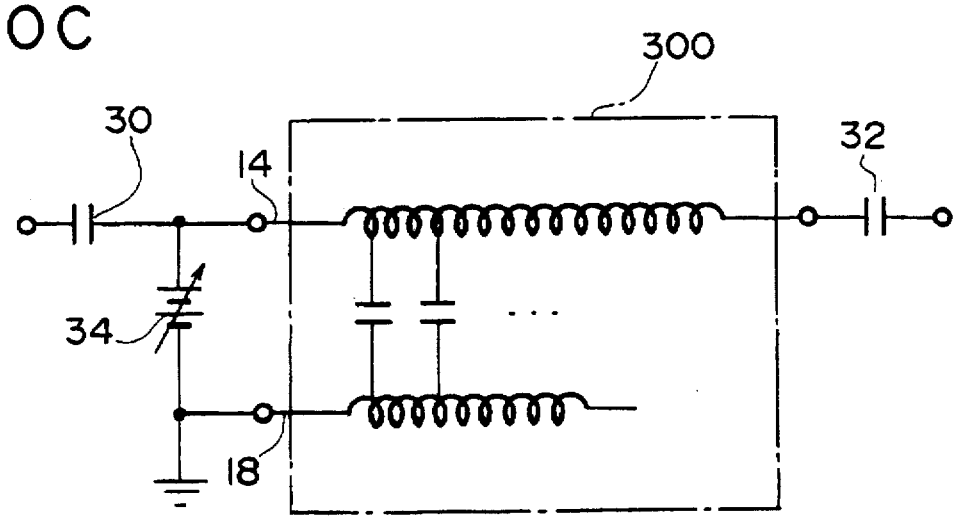

FIGS. 10A, 10B and 10C show equivalent circuits for the LC element 300. As indicated in FIG. 10A, the inductance L3 is reduced by only the extent the inductor electrode 10 turn quantity is reduced, while the corresponding distributed constant type capacitance C1 is also reduced.

As indicated in FIGS. 10B and 10C, in the same manner as each of the above mentioned embodiments, by connecting a bias power supply 28 (or a variable bias power supply 34) between the input/output electrode 14 and ground electrode 18, and connecting a capacitor 30, reverse bias of the pn junction layer 26 can be ensured, while the characteristics can be changed by variably controlling this reverse bias voltage.

In this manner, the inductors formed by the shortened inductor electrode 10 and the n⁺ region 22 of the pn junction layer 26, and the capacitor formed by the pn junction layer 26 are formed as distributed constants to enable function as an element having excellent attenuation characteristics unobtainable with conventional lumped constant type elements. The LC element 300 also features the same advantages as each of the above described LC elements 100 and 200, including manufacture by using semiconductor manufacturing technology and capability of forming as a portion of an LSI or other device, in which case wiring and other work in subsequent processing can be abbreviated.

Compared to the LC element 100 indicated in FIG. 1, the inductor electrode 10 length is shortened while retaining the shape of the pn junction layer 26. However, the portion of the pn junction layer 26 not in opposition to the inductor electrode 10 is not absolutely necessary. Also, the connections of the input/output electrodes 14 and 16, and the ground electrode 18 can be interchanged.

Figure 11:
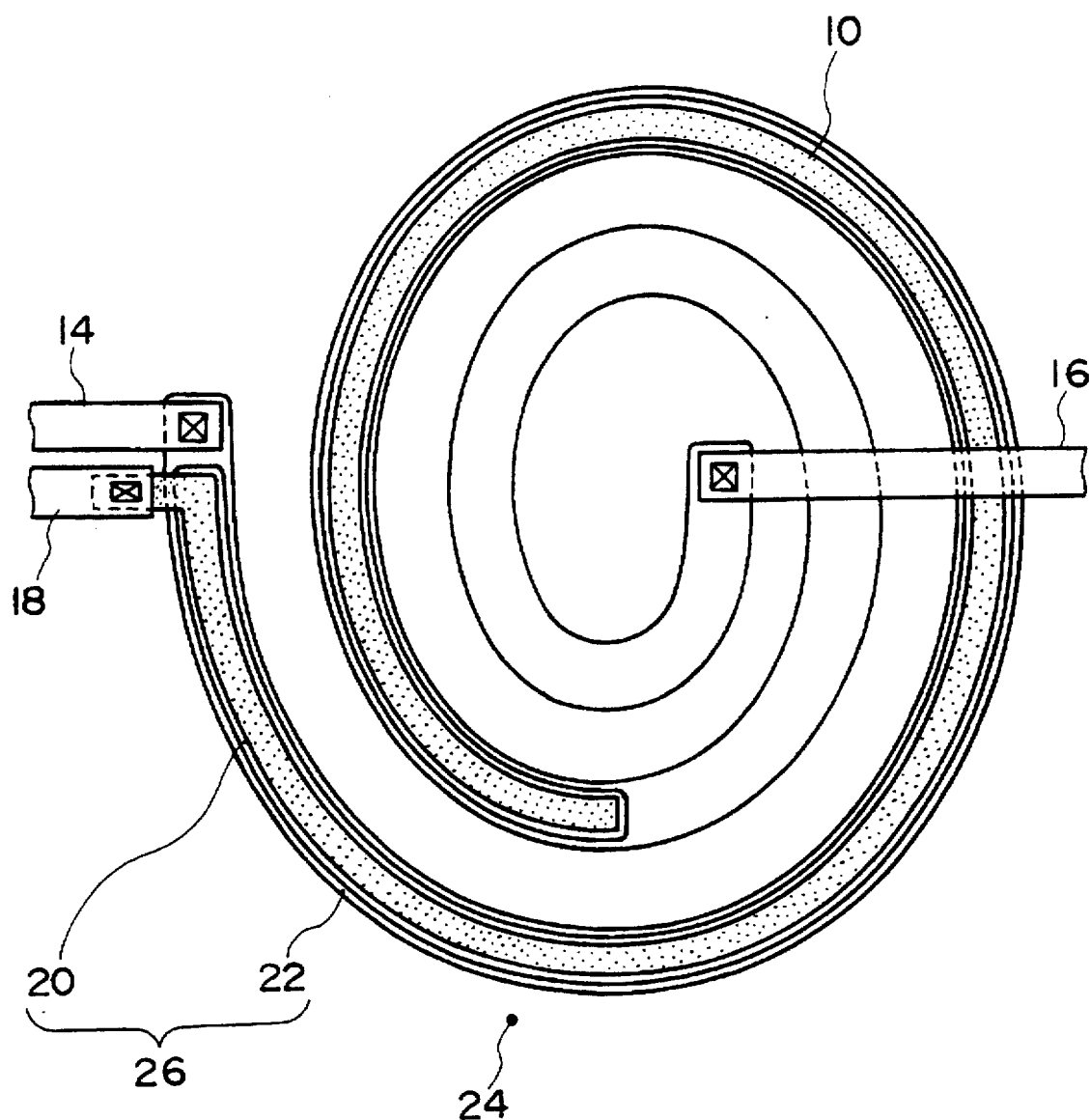
FIG. 11 indicates an example of a variation of an LC element in accordance with the third embodiment.

FIG. 11 shows an example of a variation of the LC element 300 wherein the pn junction layer 26 indicated in FIG. 9 is partially changed. The portion of the p⁺ region 20 of the pn junction layer 26 not opposing the inductor electrode 10 is omitted, while the portion of the pn junction layer 26 not functioning as a capacitor comprises only the n⁺ region 22. This LC element is effectively the same as the LC element indicated in FIG. 9 and has the same characteristics and advantages.

Figure 12:
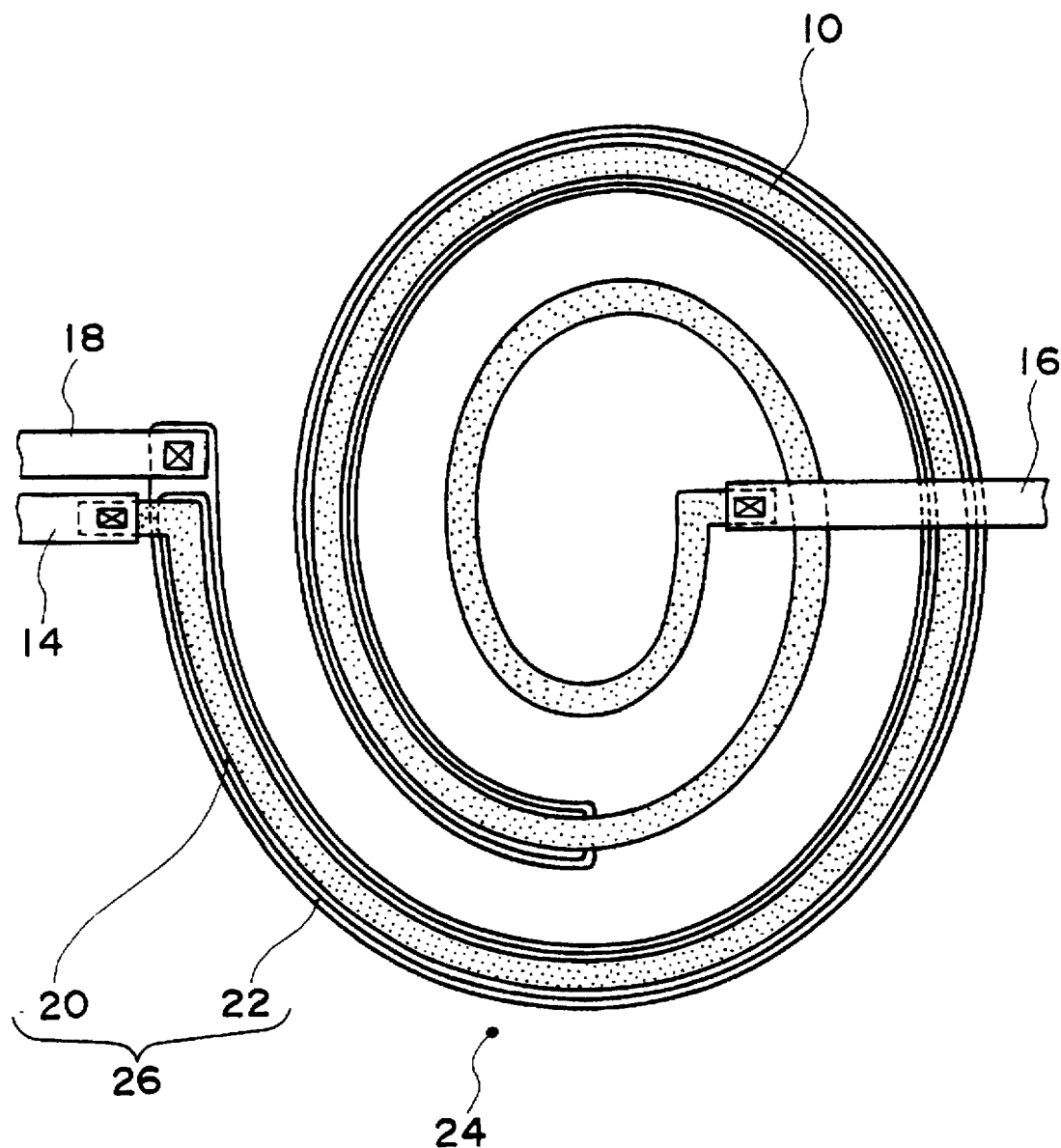
FIG. 12 indicates an example of another variation of an LC element in accordance with the third embodiment.

FIG. 12 shows another example of a variation of the LC element 300 wherein the pn junction layer 26 is formed shorter than the inductor electrode 10 and the inductor electrode 10 is used as the signal transmission line. In this case, since the inductor electrode 10 having a lower resistance than the n⁺ region 22 is used as the signal transmission line, the resulting LC element 300 has different characteristics from the LC element indicated in FIG. 9.

Figure 13:
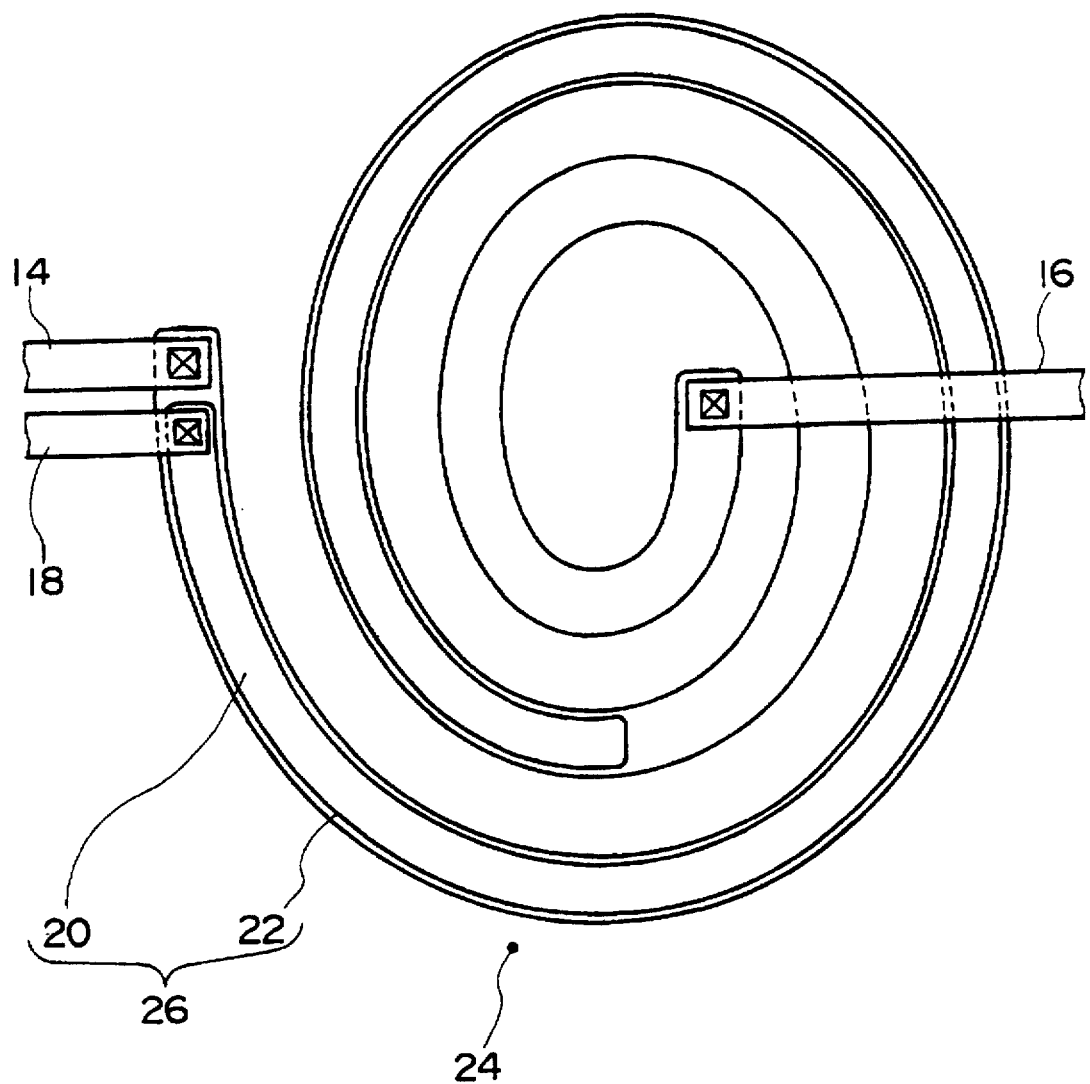
FIG. 13 indicates an example of another variation of an LC element in accordance with the third embodiment.

FIG. 13 shows another example of a variation of the LC element 300 wherein the inductor electrode 10 indicated in FIG. 9 is not used. The spiral shaped pn junction layer 26 comprises a p⁺ region 20 shorter in length than the n⁺ region 22, the input/output electrodes 14 and 16 are provided at the respective ends of the n⁺ region 22, and the ground electrode 18 is provided at one end (for example, the outer side) of the p⁺ region 20. In this case, both the differing length p⁺ region 20 and n⁺ region 22 function as inductors, while the pn junction layer 26 formed by these functions as a distributed constant type capacitor. The resulting LC element has the same advantages as the LC element 300 indicated in FIG. 9 such as the excellent attenuation characteristics and ease of manufacture.

FOURTH EMBODIMENT

An LC element according to a fourth embodiment of this invention is fundamentally the same as the third embodiment and differs mainly by having non-spiral shapes for the inductor electrode 10 and pn junction layer 26. In the drawings, the same designations are used for items that correspond to those of the third embodiment.

In the case of the above mentioned LC element 200 of the second embodiment, the pn junction layer 26 is formed essentially over the entire length of the inductor electrode 10. According to the fourth embodiment, the inductor electrode 10 is formed shorter than the one shown in FIG. 6.

Figure 14:
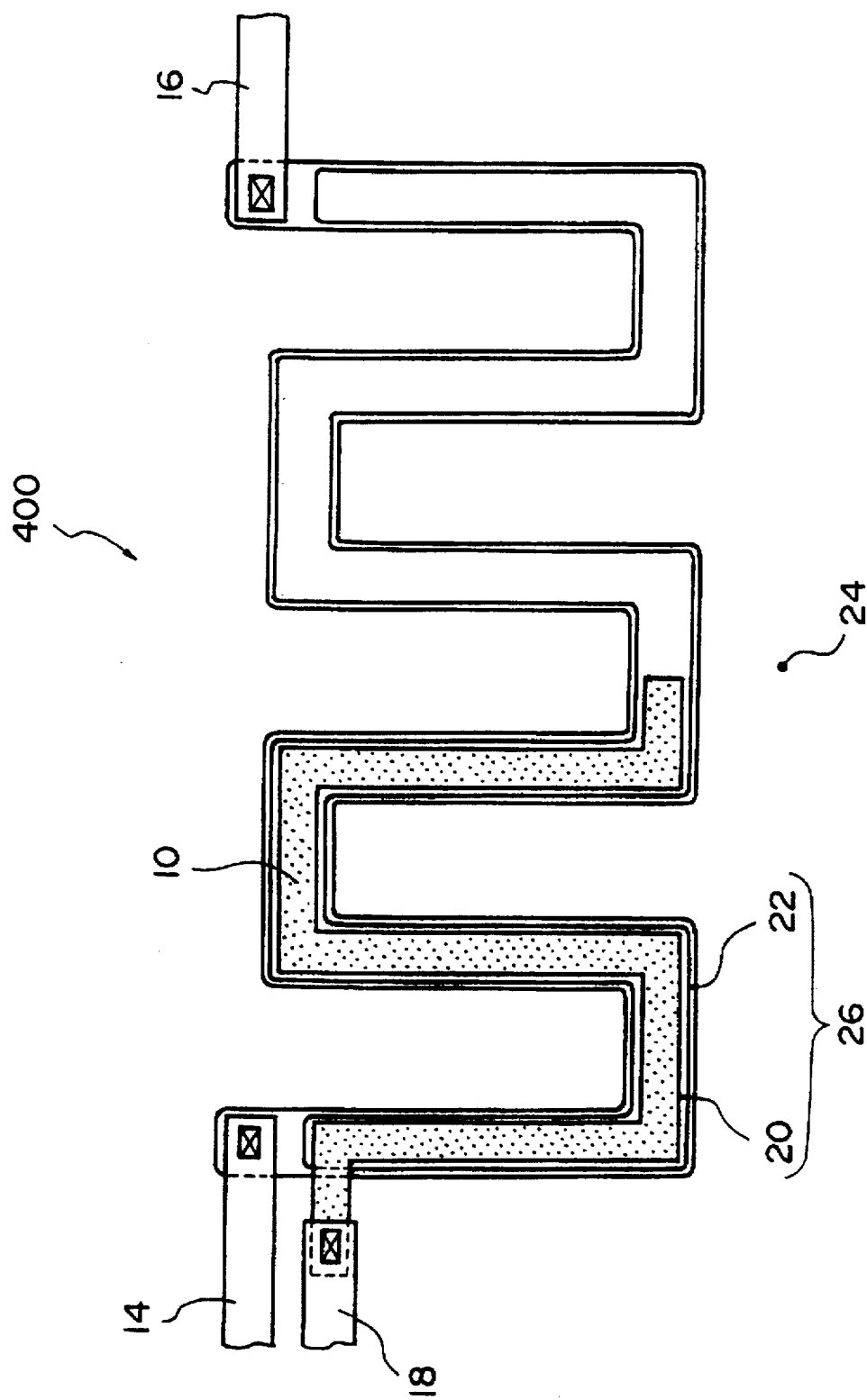
FIG. 14 is a plan view of an LC element in accordance with a fourth embodiment of this invention.

FIG. 14 is a plan view of the LC element 400 according to the fourth embodiment. As indicated in the figure, even when the inductor electrode 10 is partially omitted, the shortened inductor electrode 10 and long n⁺ region 22 of the pn junction layer 26 respectively comprise inductors, while the portion of the pn junction layer 26 opposing the shortened inductor electrode 10 comprises a distributed constant type capacitor. Therefore, in the same manner as the LC element 200 indicated in FIG. 6, excellent attenuation characteristics are obtained.

Equivalent circuits of the LC element 400 are the same as those of the third embodiment indicated in FIGS. 10A, 10B and 10C, and their features are also the same as described above for the third embodiment.

Also, by variably controlling the pn junction layer 26 reverse bias voltage, the characteristics can be changed in the same manner as each of the above mentioned embodiments.

In this manner, the inductors formed by the shortened inductor electrode 10 and the n⁺ region 22 of the pn junction layer 26, and the capacitor formed by the pn junction layer 26 are formed as distributed constants to enable function as an element having excellent attenuation characteristics unobtainable with conventional lumped constant type elements. The LC element 400 also features the same advantages as the above described LC elements, including manufacture by using semiconductor manufacturing technology and capability of forming as a portion of an LSI or other device, in which case wiring and other work in subsequent processing can be abbreviated.

Compared to the LC element 200 indicated in FIG. 6, the inductor electrode 10 length is shortened while retaining the shape of the pn junction layer 26. However, the portion of the pn junction layer 26 not in opposition to the inductor electrode 10 is not absolutely necessary. Also, the connections of the input/output electrodes 14 and 16, and the ground electrode 18 can be interchanged.

Figure 15:
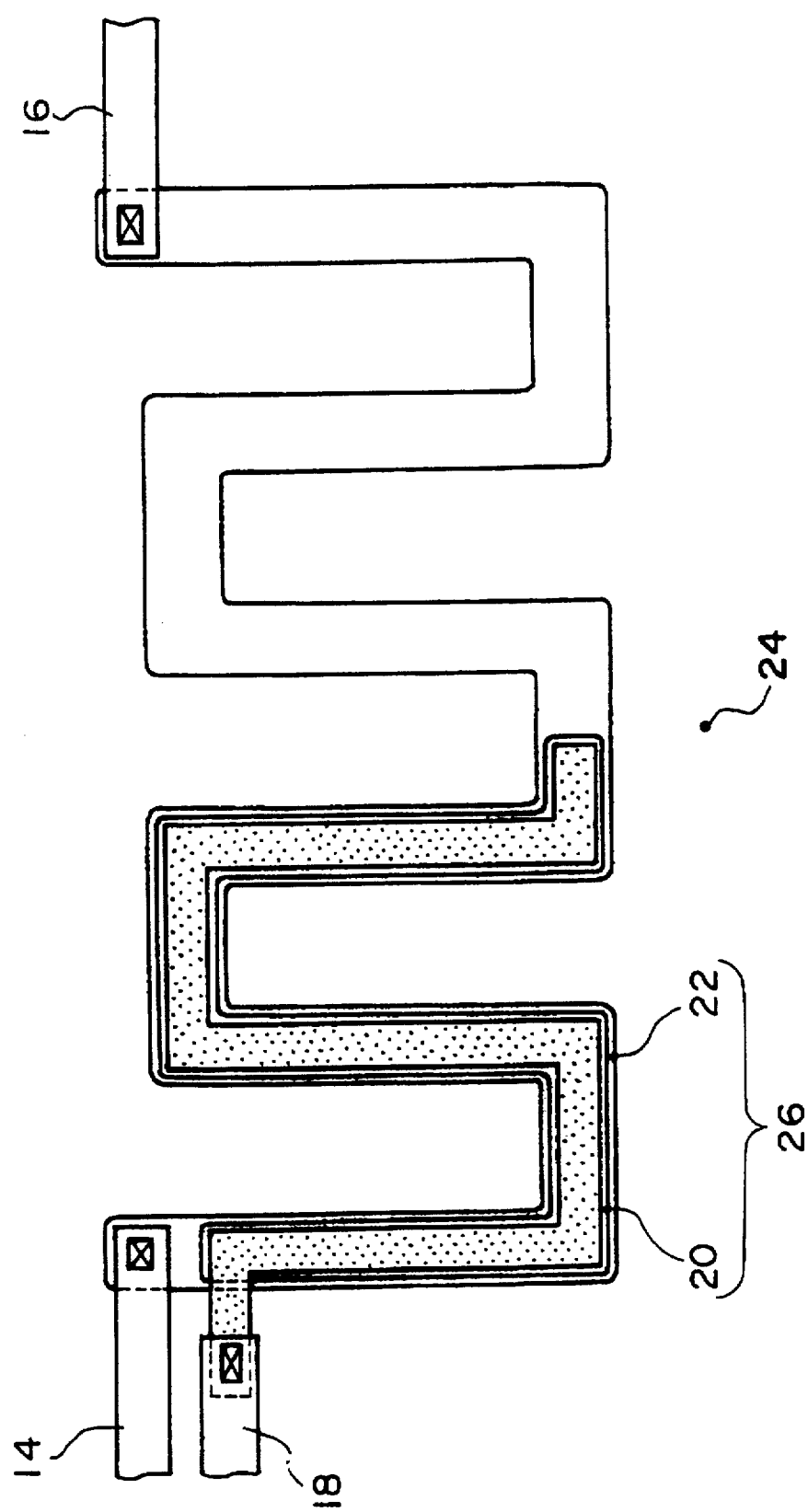
FIG. 15 indicates an example of a variation of an LC element in accordance with the fourth embodiment.

FIG. 15 shows an example of a variation of the LC element 400 wherein the pn junction layer 26 indicated in FIG. 14 is partially changed. The portion of the $p^+$ region 20 of the pn junction layer 26 not opposing the inductor electrode 10 is omitted, while the portion of the pn junction layer 26 not functioning as a capacitor comprises only the $n^+$ region 22. This LC element is effectively the same as the LC element 400 indicated in FIG. 14 and has the same characteristics and advantages.

Figure 16:
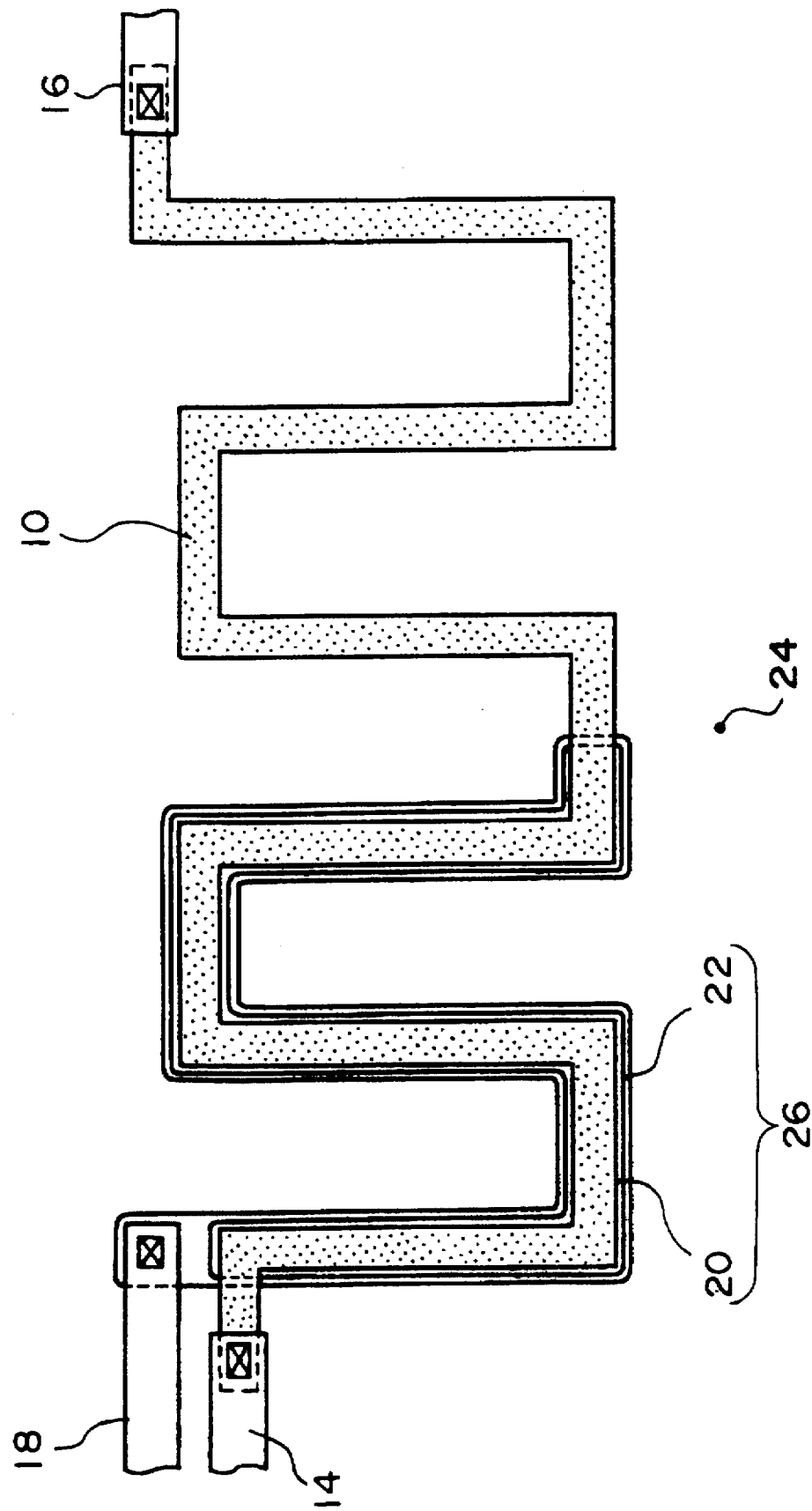
FIG. 16 indicates an example of another variation of an LC element in accordance with the fourth embodiment.

FIG. 16 shows another example of a variation of the LC element 400 wherein the pn junction layer 26 is formed shorter than the inductor electrode 10 and the inductor electrode 10 is used as the signal transmission line. In this case, since the inductor electrode 10 having a lower resistance than the $n^+$ region 22 is used as the signal transmission line, the resulting LC element 400 has different characteristics from the LC element indicated in FIG. 14.

Figure 17:
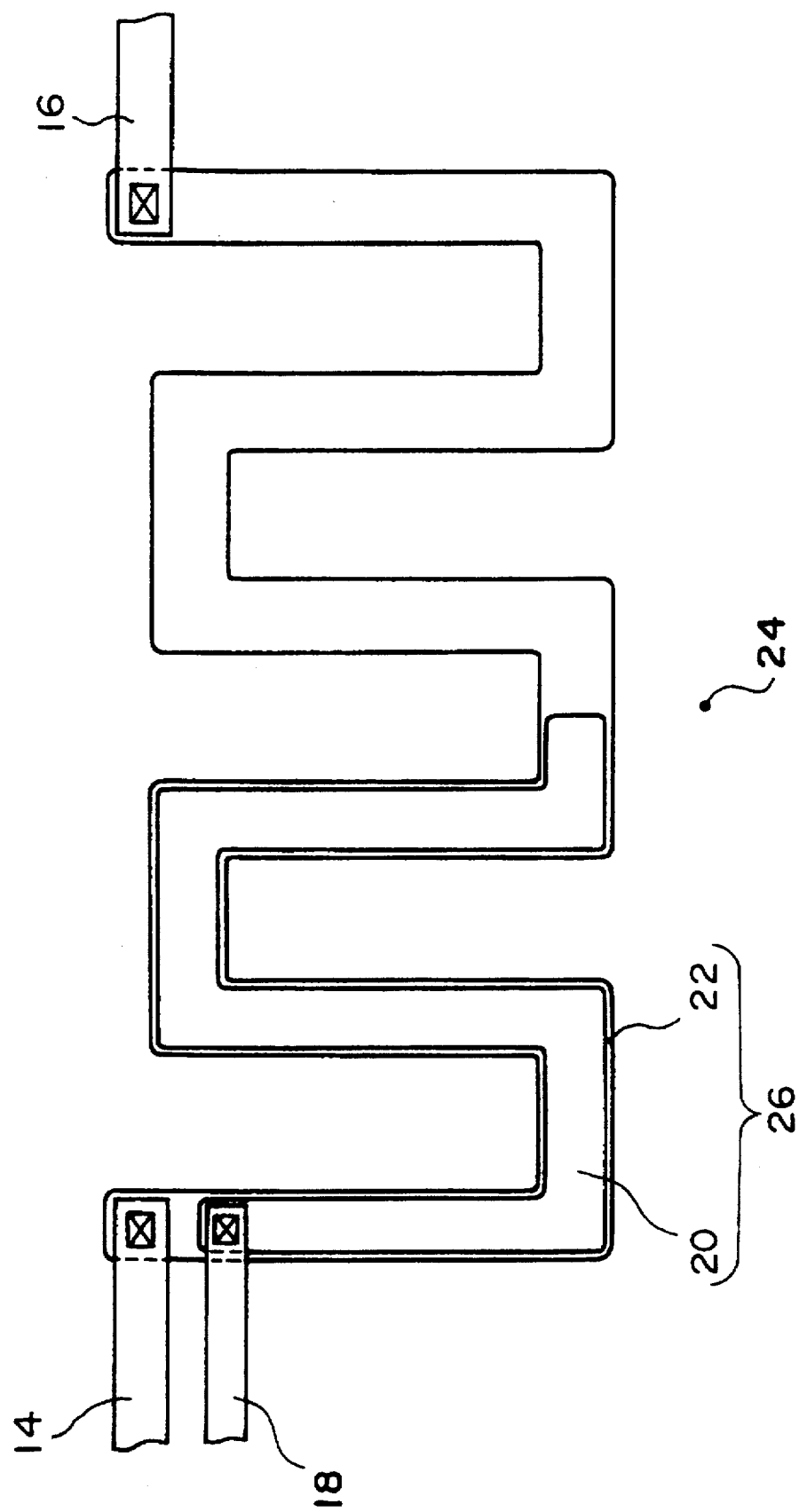
FIG. 17 indicates an example of another variation of an LC element in accordance with the fourth embodiment.

FIG. 17 shows another example of a variation of the LC element 400 wherein the inductor electrode 10 indicated in FIG. 14 is not used. The meander shaped pn junction layer 26 comprises a $p^+$ region 20 shorter in length than the $n^+$ region 22, the input/output electrodes 14 and 16 are provided at the respective ends of the $n^+$ region 22, and the ground electrode 18 is provided at one end (for example, the outer side) of the $p^+$ region 20. In this case, both the differing length $p^+$ region 20 and $n^+$ region 22 function as inductors, while the pn junction layer 26 formed by these functions as a distributed constant type capacitor. The resulting LC element has the same advantages as the LC element 400 shown in FIG. 14 such as excellent attenuation characteristics and ease of manufacture.

FIFTH EMBODIMENT

Following is a description of a fifth embodiment of this invention with reference to the attached drawings.

The above mentioned LC elements of the foregoing embodiments function as three-terminal normal mode type elements. Whereas, the LC element 500 of the fifth embodiment is formed so as to function as a four-terminal common mode type element.

Figure 18:
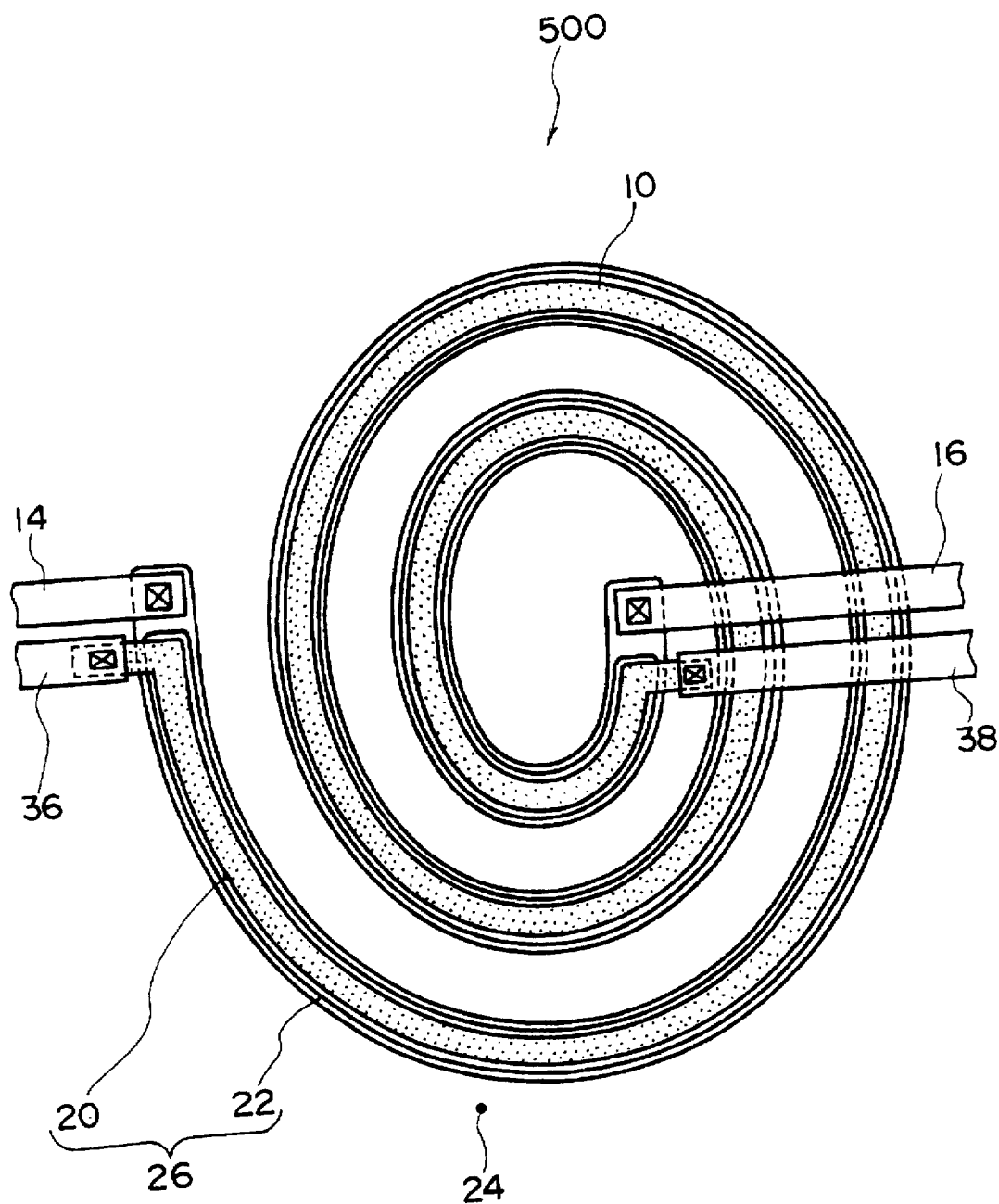
FIG. 18 is a plan view of an LC element in accordance with a fifth embodiment of this invention.

FIG. 18 is a plan view of the LC element 500 of the fifth embodiment. As indicated in the figure, compared to the LC element 100 indicated in FIG. 1, the LC element 500 further comprises input/output electrodes 36 and 38 provided at the respective ends of the inductor electrode 10.

Figure 19A:
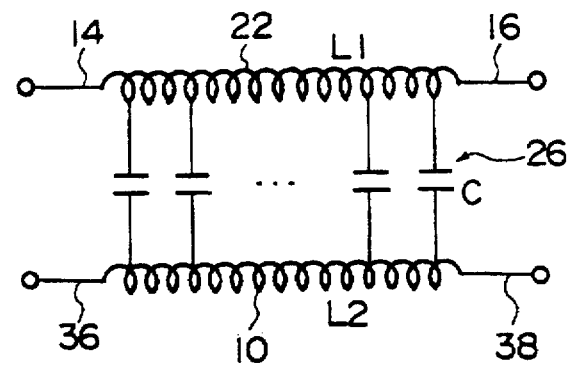
FIGS. 19A, 19B and 19C are schematic diagrams indicating equivalent circuits of LC elements in accordance with the fifth embodiment.
Figure 19B:
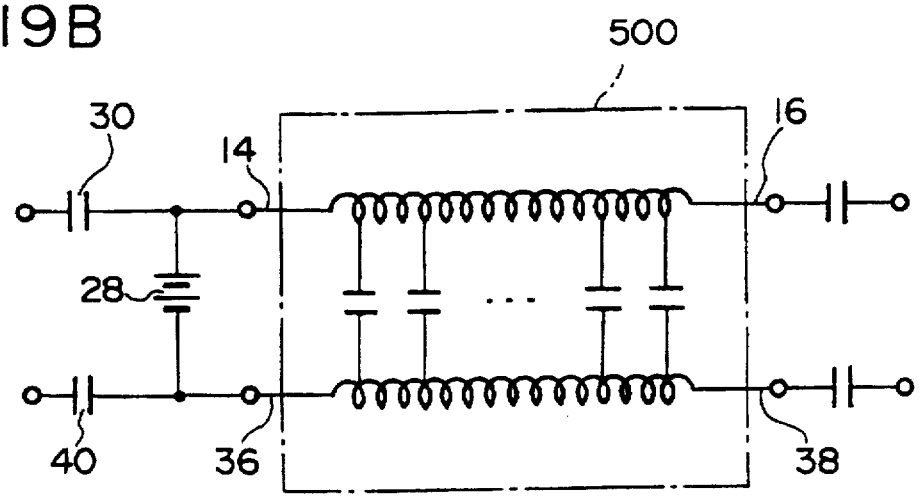
Figure 19C:
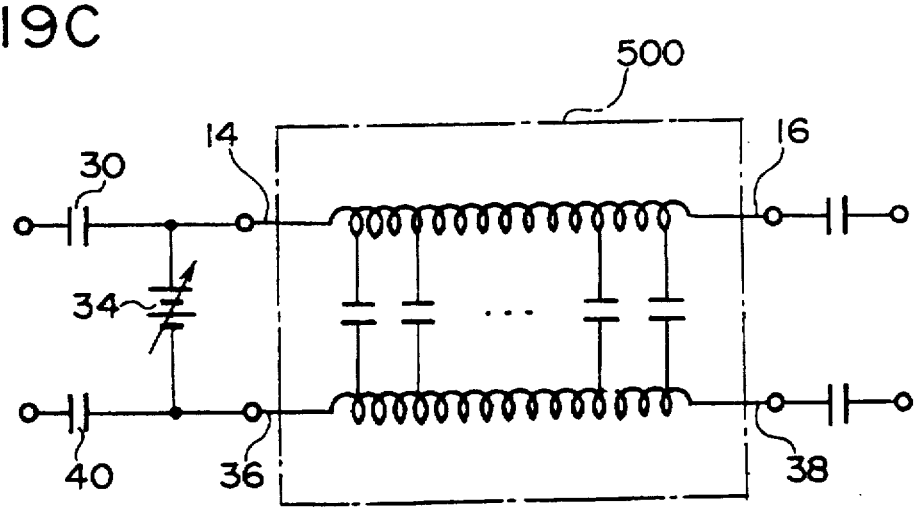

FIGS. 19A, 19B and 19C show equivalent circuits of the LC element 500. As indicated in FIG. 19A, the Spiral shaped $n^+$ region 22 formed between the two input/output electrodes 14 and 16 functions as an inductor having inductance L1, while the inductor electrode 10 formed between the two input/output electrodes 36 and 38 functions as an inductor having inductance L2. Between these inductors, in the same manner as the LC element 100 of the first embodiment, a distributed constant type capacitor having capacitance C is formed by the pn junction layer 26.

In this manner, in addition to those for the $n^+$ region 22, by providing input/output electrodes 36 and 38 also at the respective ends of the inductor electrode 10, the functions of a four-terminal common mode type element having excellent attenuation characteristics can be obtained.

The pn junction layer 26 operates as a capacitor, when the relative potential of the $n^+$ region 22 with respect to the $p^+$ region 20 (i.e., the inductor electrode 10) is higher, or reverse biased. Therefore in order for the LC element 500 to obtain operation as a four-terminal common mode element as mentioned, the input signal level at the $n^+$ region 22 side needs to be set higher than the input signal level at the inductor electrode 10 side.

FIG. 19B shows an example of forcibly applying reverse bias voltage from a bias power supply 28 between the input/output electrodes 14 and 36. Also, since signal inputs are applied to both input/output electrodes 14 and 36, in addition to the capacitor 30 of the first embodiment, the LC element 500 further comprises a capacitor 40 connected to the input/output electrode 36 side.

In this manner, the DC components of the signals respectively input to the two input/output electrodes 14 and 36 are removed by the capacitors 30 and 40. Only the AC components of the respective signals are overlapped on reverse bias voltage applied from the bias power supply 28 and supplied to the LC element 500.

Consequently, reverse bias voltage can be securely applied with respect to the pn junction layer 26 for forming inductors and a distributed constant type capacitor. As a result, excellent attenuation characteristics can be obtained.

FIG. 19C shows an example of replacing the bias power supply 28 of FIG. 19B with a variable bias power supply 34. The variable bias power supply 34 allows variably setting the reverse bias voltage, thereby changing the capacitance C of the pn junction layer 26 and the overall characteristics of the LC element 500.

The LC element 500 also features the same advantages as the LC elements 100 and others of the above described embodiments, including manufacture by using semiconductor manufacturing technology and capability of forming as a portion of an LSI or other device, in which case wiring and other work in subsequent processing can be abbreviated.

The above description referred to an example of using the inductor electrode 10 as one signal transmission line. However, the inductor electrode 10 can be deleted and both the $p^+$ region 20 and $n^+$ region 22 comprising the pn junction layer 26 can be used as respective signal transmission lines.

Figure 45:
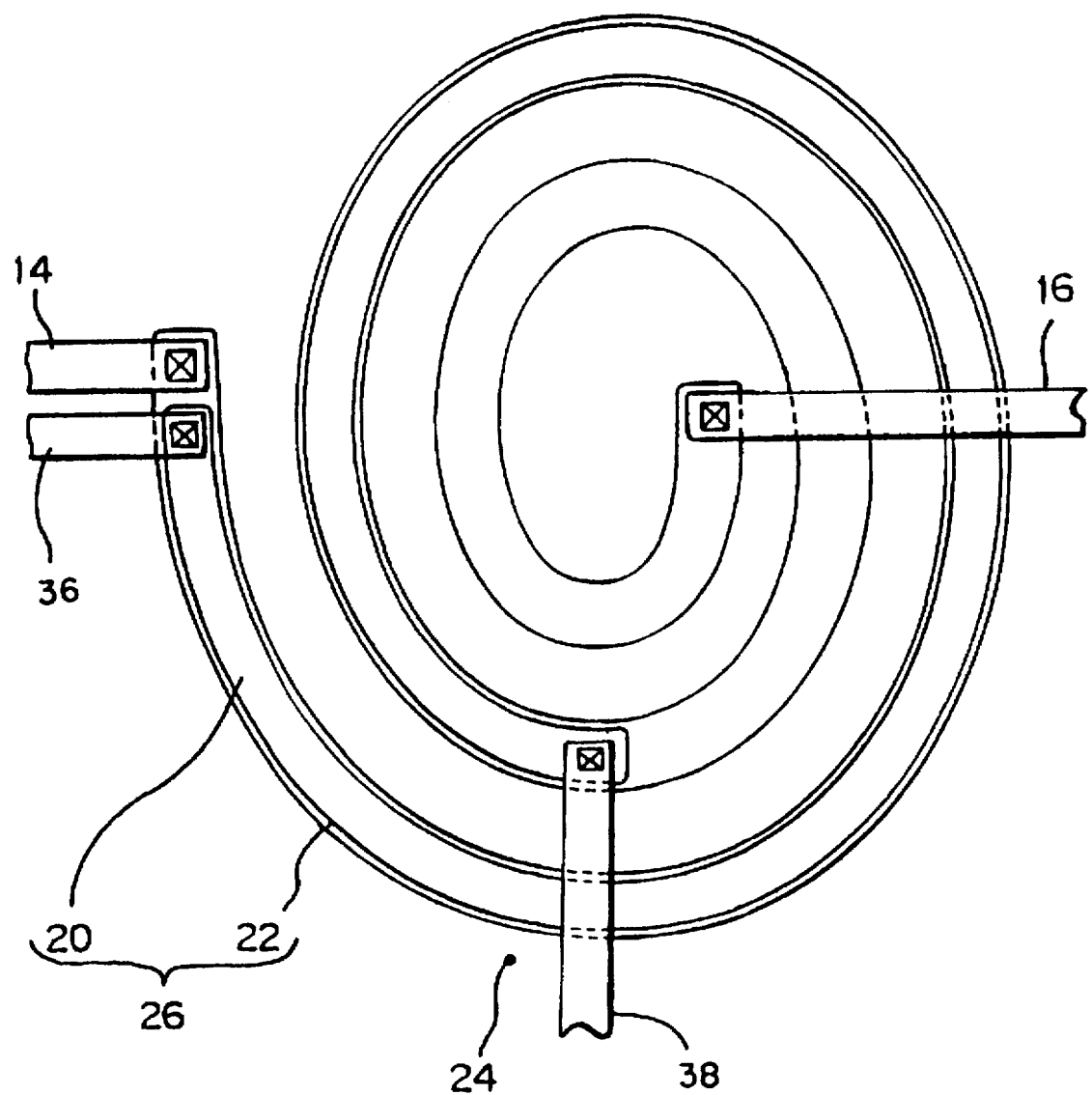
FIG. 45 indicates an example of another variation of an LC element in accordance with the fifth embodiment.

FIG. 20 shows an example of a variation of the LC element 500 wherein the inductor electrode is not used. As indicated in the figure, input/output electrodes 14 and 16 are provided at the respective ends of the $p^+$ region 22, while input/output electrodes 36 and 38 are provided at the respective ends of the $p^+$ region 20. In the case of this LC element, both the $p^+$ region 20 and $n^+$ region 22 are used as signal transmission lines, while these also respectively function as inductors. In addition, the pn junction layer 26 formed by these regions functions as a distributed constant type capacitor. In the same manner as the LC element 500 indicated in FIG. 18, a four-terminal common mode element is comprised having such advantages as excellent attenuation characteristics and ease of manufacture. The LC element shown in FIG. 45 is similar to the LC element shown in FIG. 20, but the length of the region 20 differs from the length of the region 22.

SIXTH EMBODIMENT

An LC element according to a sixth embodiment of this invention is fundamentally the same as the fifth embodiment and differs mainly by having non-spiral shapes for the inductor electrode 10 and pn junction layer 26. In the drawings, the same designations are used for items that correspond to those of the fifth embodiment.

The above mentioned LC elements of the first to fourth embodiments function as three-terminal normal mode type elements. Whereas the LC element 600 of the sixth embodiment is formed so as to function as a four-terminal common mode type element.

Figure 21:
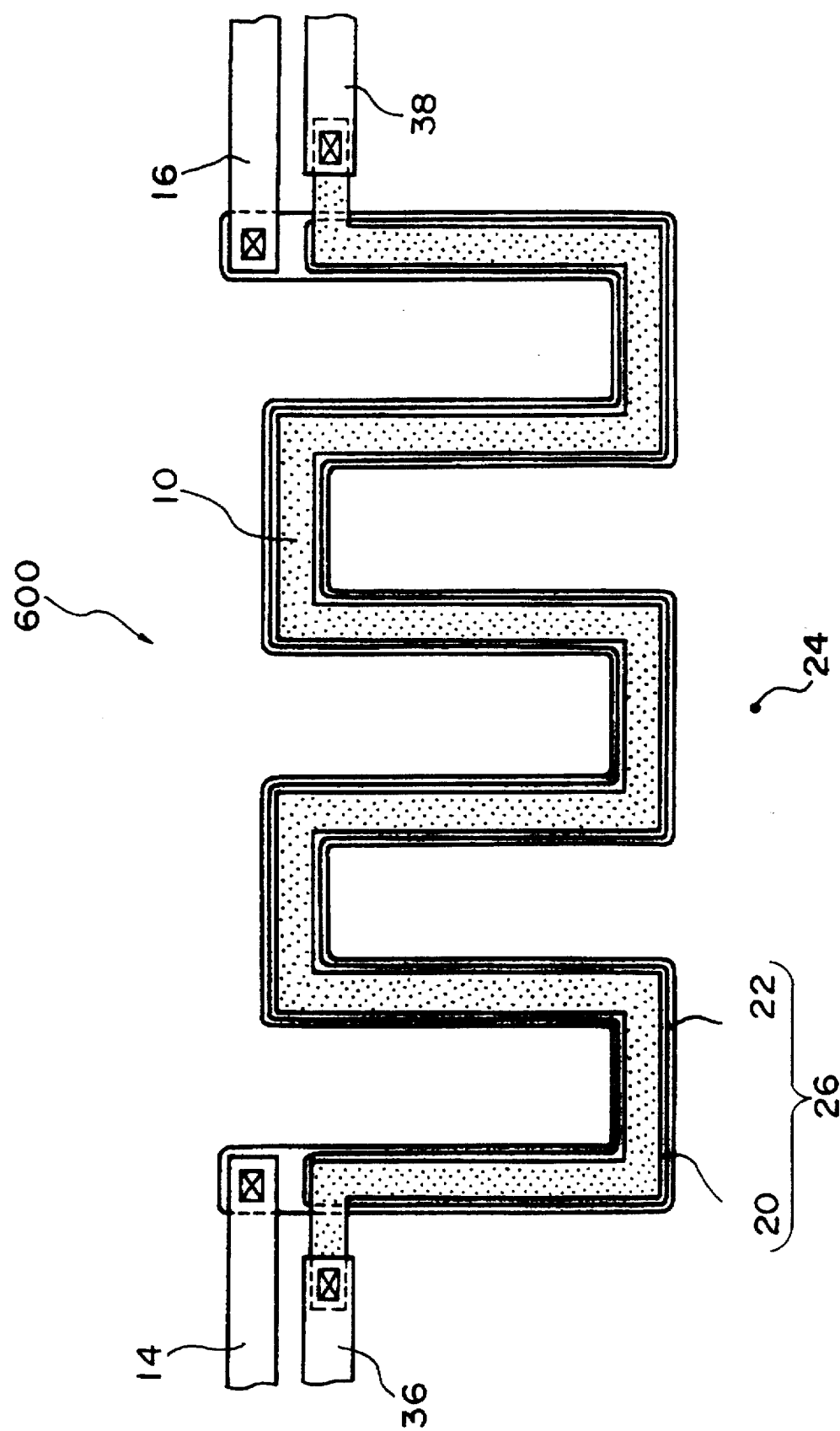
FIG. 21 is a plan view of an LC element in accordance with a sixth embodiment of this invention.

FIG. 21 is a plan view of the LC element 600. As indicated in the figure, compared to the LC element 200 indicated in FIG. 6, the LC element 600 further comprises input/output electrodes 36 and 38 provided at the respective ends of the inductor electrode 10.

Equivalent circuits of the LC element 600 are the same as those of the fifth embodiment shown in FIGS. 19A, 19B and 19C, and their features are also the same as described above for the fifth embodiment.

Also, by changing the reverse bias voltage, the pn junction layer 26 capacitance C is changed, i.e., the overall characteristics of the LC element 600 can be changed, in the same manner as each of the above mentioned embodiments.

The LC element 600 also features the same advantages as the LC elements 100 and others of the above described embodiments, including manufacture by using semiconductor manufacturing technology and capability of forming as a portion of an LSI or other device, in which case wiring and other work in subsequent processing can be abbreviated.

The above description referred to an example of using the inductor electrode 10 as one signal transmission line. However, the inductor electrode 10 can be deleted and both the p$^+$ region 20 and n$^+$ region 22 comprising the pn junction layer 26 can be used as respective signal transmission lines.

Figure 22:
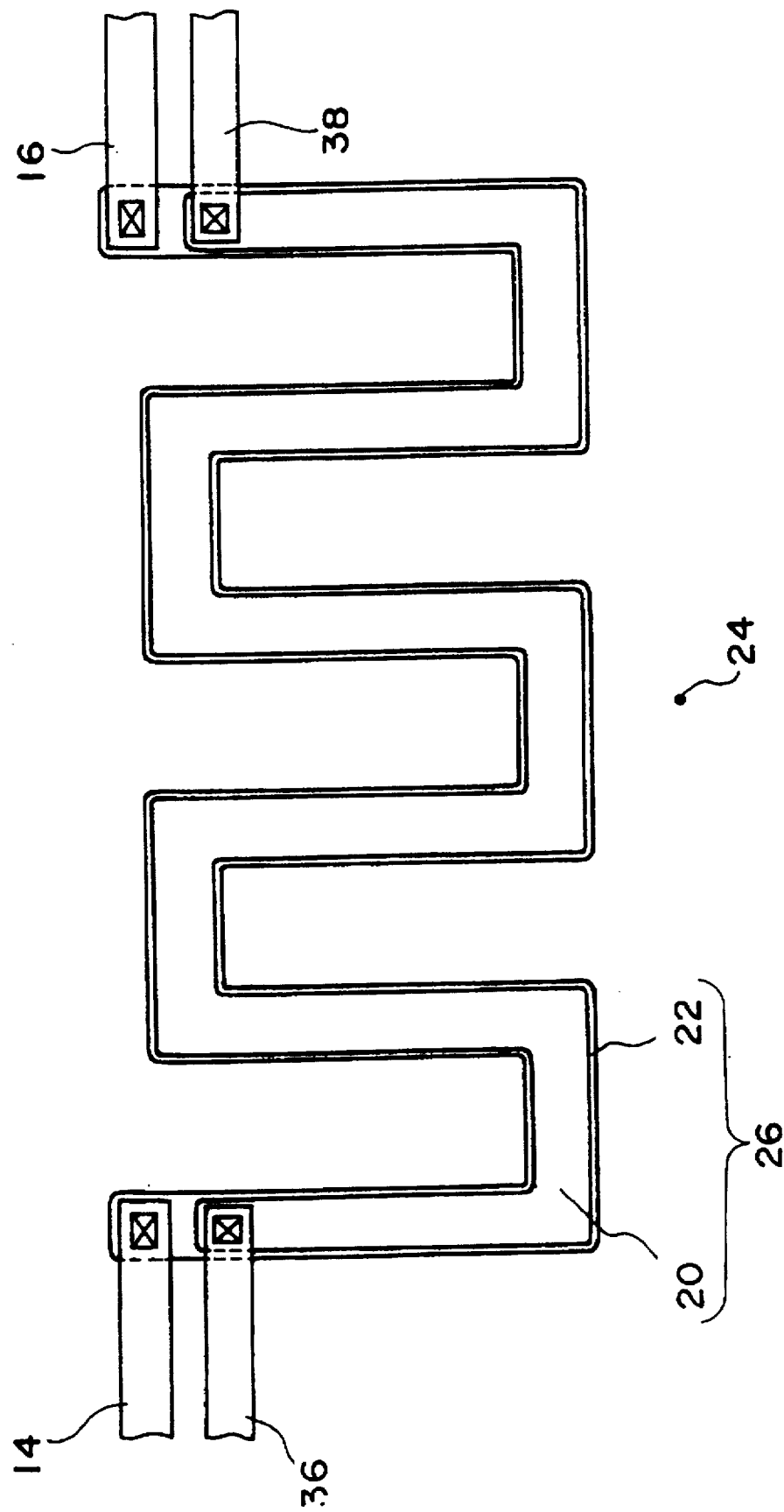
FIG. 22 indicates an example of a variation of an LC element in accordance with the sixth embodiment.
Figure 46:
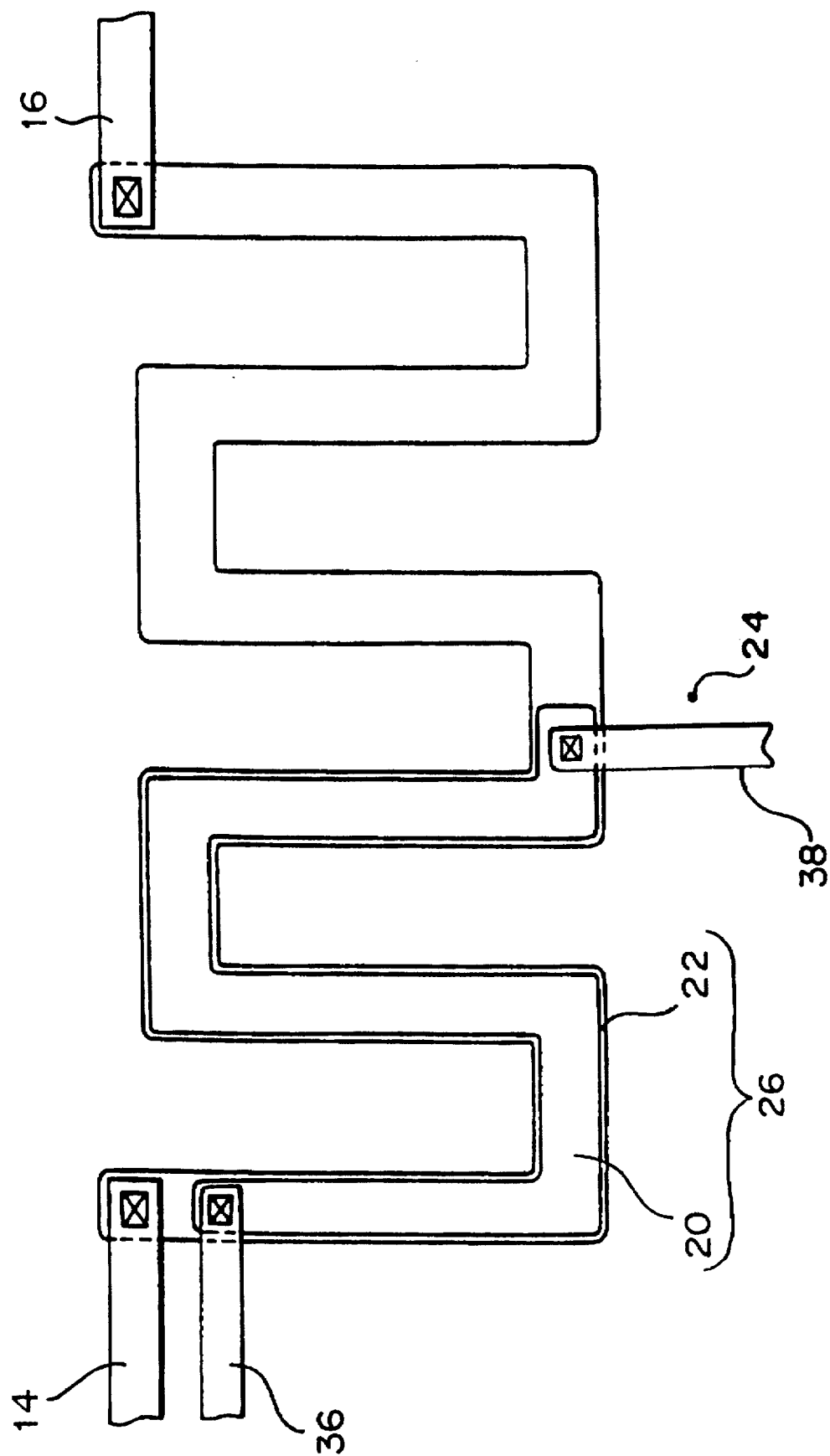
FIG. 46 indicates an example of another variation of an LC element in accordance with the sixth embodiment.

FIG. 22 shows an example of a variation of the LC element 600 wherein the inductor electrode is not used. As indicated in the figure, input/output electrodes 14 and 16 are provided at the respective ends of the n$^+$ region 22, while input/output electrodes 36 and 38 are provided at the respective ends of the p$^+$ region 20. In the case of this LC element, both the p$^+$ region 20 and n$^+$ region 22 are used as signal transmission lines, while these also respectively function as inductors. In addition, the pn junction layer 26 formed by these regions functions as a distributed constant type capacitor. In the same manner as the LC element 600 indicated in FIG. 21, a four-terminal common mode element is comprised having such advantages as excellent attenuation characteristics and ease of manufacture. The LC element shown in FIG. 46 is similar to the LC element shown in FIG. 22, but the length of the region 20 differs from the length of the region 22.

SEVENTH EMBODIMENT

Following is a description of an LC element according to a seventh embodiment of this invention with reference to the attached drawings.

The above descriptions of the LC element 100 and others of the foregoing embodiments referred to examples wherein the inductor electrode 10 was formed as a single conductor. In the case of the LC element 700 of the seventh embodiment, the inductor electrode 10 is divided into a plurality of divided electrode segments 10-1 and 10-2.

Figure 23:
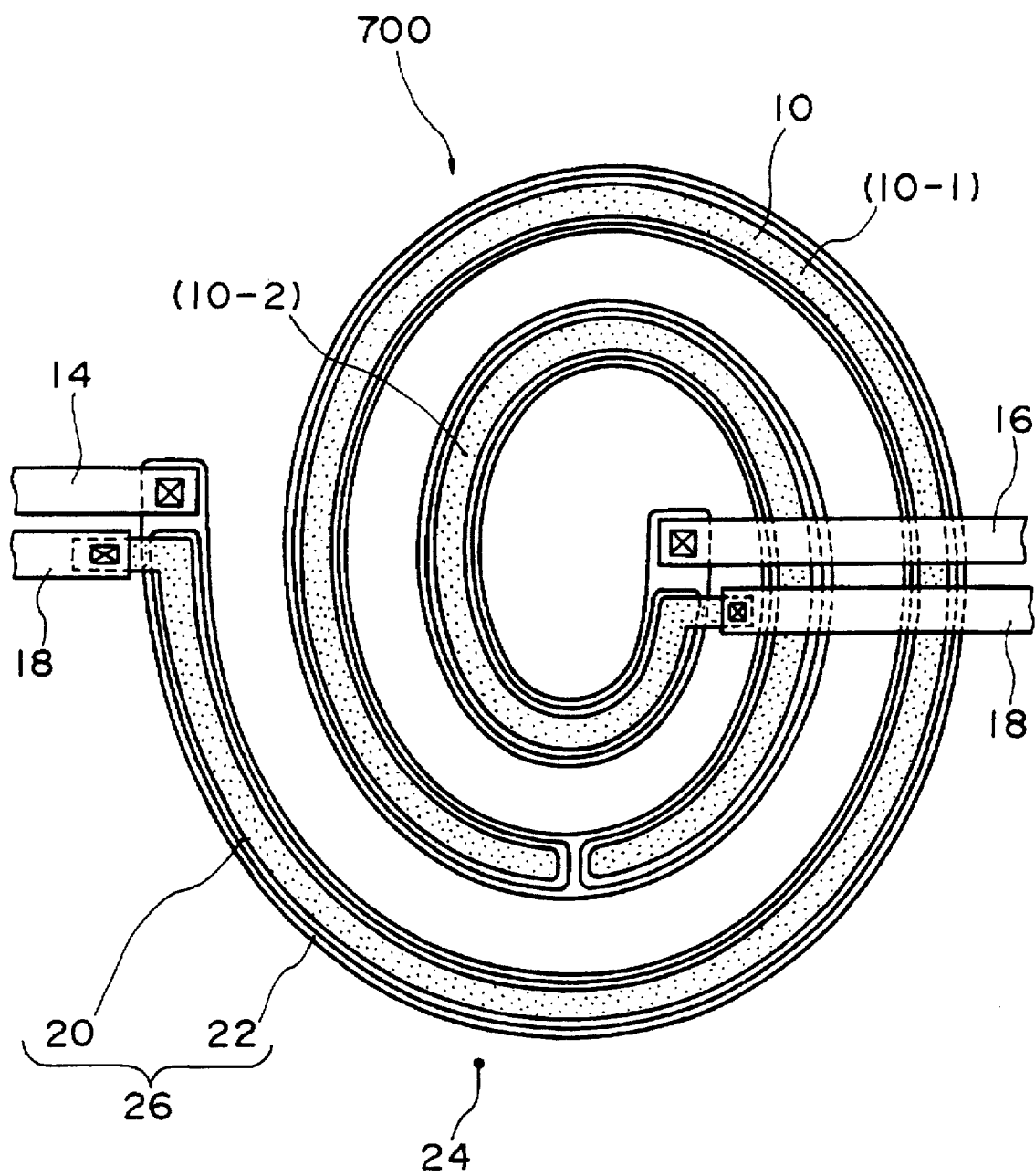
FIG. 23 is a plan view of an LC element in accordance with a seventh embodiment of this invention.

FIG. 23 is a plan view of the LC element 700 according to the seventh embodiment. As indicated in the figure, the inductor electrode 10 used for the LC element 100 indicated in FIG. 1 is replaced by divided electrode segments 10-1 and 10-2, and the p$^+$ region 20 connected to each divided electrode segment is also divided. Ground electrodes 18 are respectively connected to these divided electrode segments 10-1 and 10-2, which have an overall spiral shape. By grounding the two ground electrodes 18, one end of each divided inductor respectively formed by the divided electrode segments 10-1 and 10-2 is grounded. Alternatively, by connecting two ground electrodes 18 to a fixed potential power supply, one end of each inductor respectively formed by the divided electrode segments 10-1 and 10-2 is set to this fixed potential.

Figure 24A:
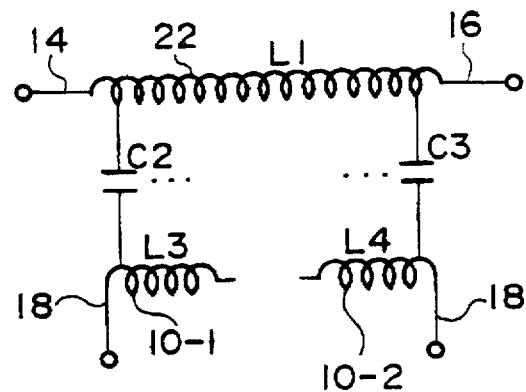
FIGS. 24A, 24B and 24C are schematic diagrams indicating equivalent circuits of LC elements in accordance with the seventh embodiment.
Figure 24B:
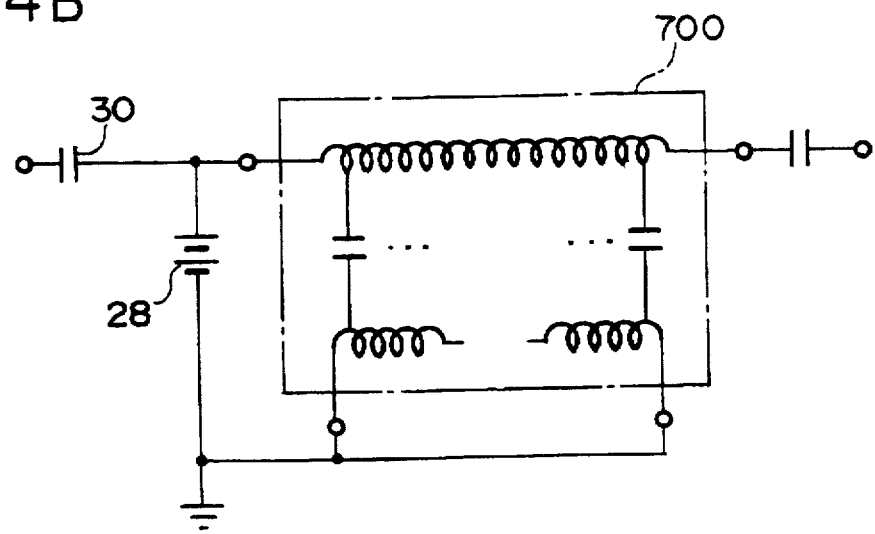
Figure 24C:
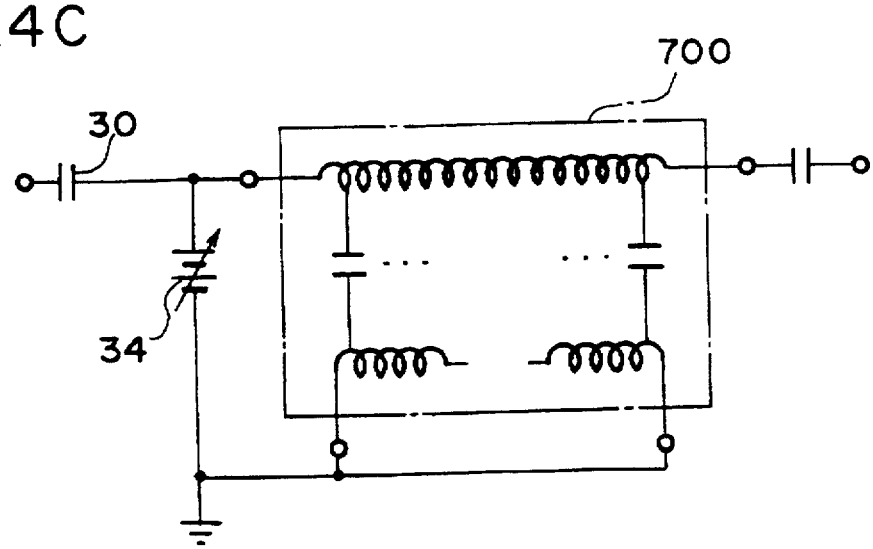

FIGS. 24A, 24B and 24C show equivalent circuits for the LC element 700. As indicated in FIG. 24A, the n$^+$ region 22 of the pn junction layer 26 functions as an inductor with an overall inductance L1, while each of the divided electrode segments 10-1 and 10-2 functions as an inductor with respective inductance L3 and L4. Also, the pn junction layer 26 between the p$^+$ region 22 and the respective divided electrode segments 10-1 and 10-2 functions as distributed constant type capacitors with capacitances C2 and C3.

FIGS. 24B and 24C indicate examples of circuits for respectively applying reverse bias voltage or variable reverse bias voltage. These figures correspond to FIGS. 3B and 3C, and by using these types of circuit construction, operation of the pn junction layer 26 as capacitors can be ensured, or by varying these capacitances, the overall characteristics of the LC element 700 can be varied.

The LC element 700 also features the same advantages as the LC elements 100 and others of the above described embodiments, including manufacture by using semiconductor manufacturing technology and capability of forming as a portion of an LSI or other device, in which case wiring and other work in subsequent processing can be abbreviated.

Also, the respective self-inductance L3 and L4 of the divided electrode segments 10-1 and 10-2 is small. Consequently, the effects of these self-inductances on the overall characteristics of the LC element 700 are small, and the overall characteristics are largely determined by the n$^+$ region 22 inductance L1 and the distributed constant type capacitances C2 and C3.

The above description referred to an example of using the spiral shaped n$^+$ region 22 as the signal transmission line and dividing the inductor electrode 10. However, the opposite configuration can also be used, namely, using the inductor electrode 10 as the signal transmission line and dividing the overall pn junction layer 26 into a plurality.

Figure 25:
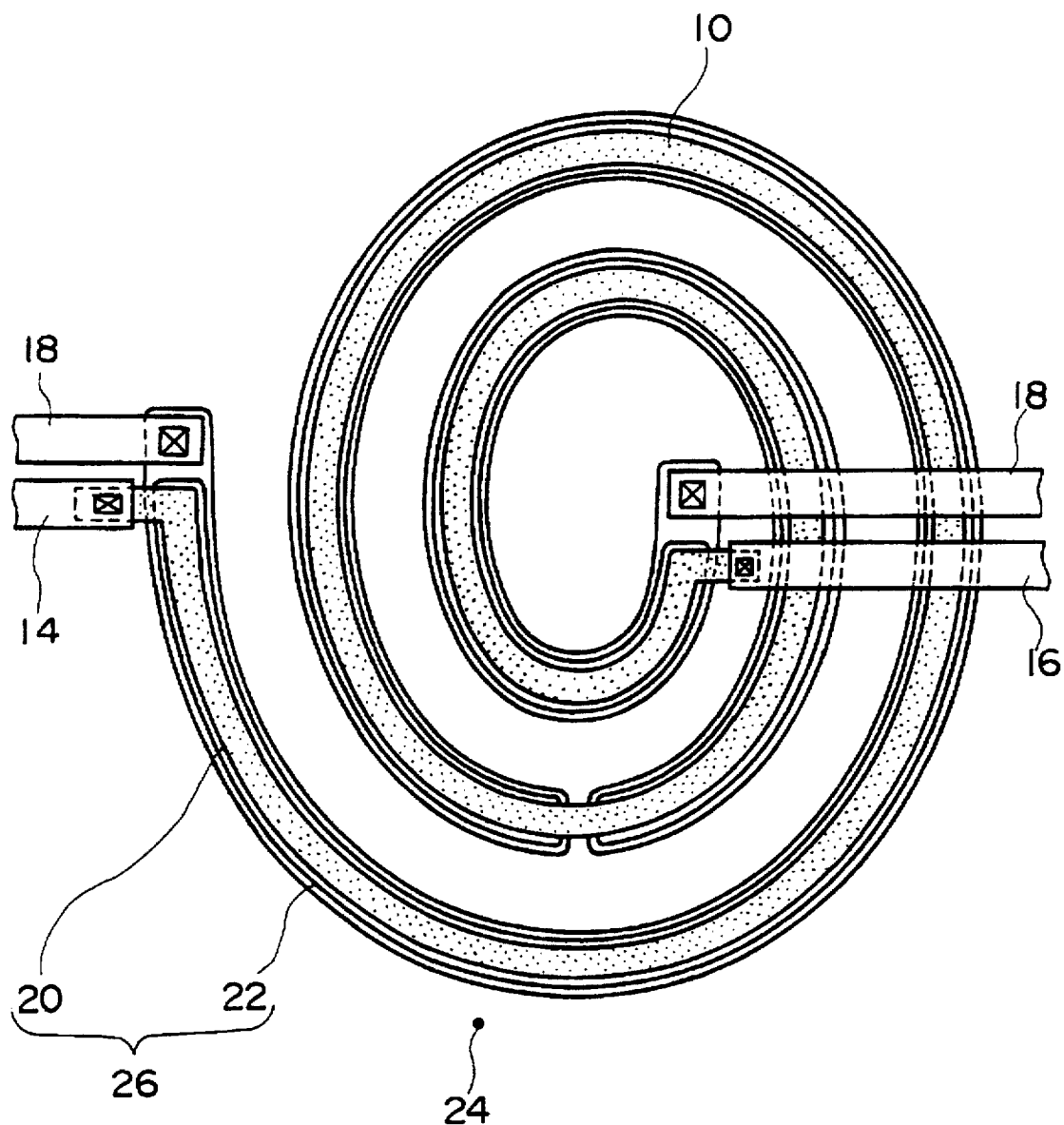
FIG. 25 indicates an example of a variation of an LC element in accordance with the seventh embodiment.

FIG. 25 shows an example of a variation of the present embodiment wherein the inductor electrode 10 is used as the signal transmission line. Input/output electrodes 14 and 16 are connected to the respective ends of the inductor electrode 10, while the pn junction layer 26 is divided into divided segments 26-1 and 26-2. One end of each n$^+$ region 22 comprising each of these divided segments is connected to a ground electrode 18. As a result the functions of the n$^+$ region 22 and inductor electrode 10 are interchanged with respect to the LC element 700 indicated in FIG. 23, while in essence, the same advantages are featured as the LC element indicated in FIG. 23.

Figure 26:
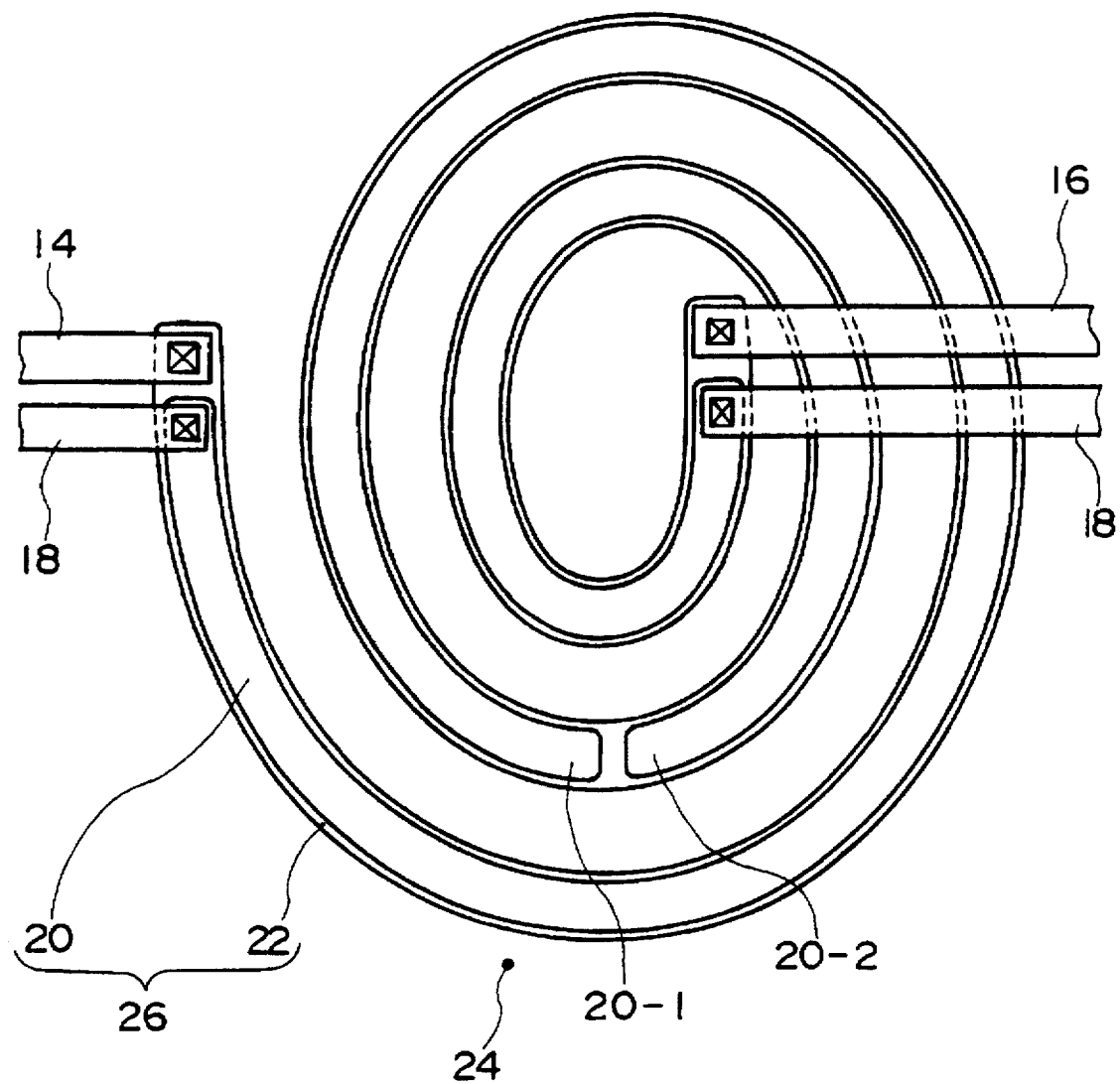
FIG. 26 indicates an example of another variation of an LC element in accordance with the seventh embodiment.

FIG. 26 shows an example of another variation of the present embodiment wherein the inductor electrode 10 indicated in FIG. 23 is not used. As indicated in FIG. 26, the input/output electrodes 14 and 16 are connected to the respective ends of the n$^+$ region 22, while only the p$^+$ region 20 is divided. Ground electrodes 18 are provided at one end of each of these divided segments 20-1 and 20-2. In the case of this LC element, the n⁺ region 22 and divided segments 20-1 and 20-2 respectively function as inductors, while the pn junction layer 26 between these functions as distributed constant type capacitors. The resulting LC element has the same advantages as the LC element 700 indicated in FIG. 23 such as excellent attenuation characteristics and ease of manufacture.

EIGHTH EMBODIMENT

An LC element according to an eighth embodiment of this invention is fundamentally the same as the seventh embodiment and differs mainly by having non-spiral shapes for the inductor electrode 10 and pn junction layer 26. In the drawings, the same designations are used for items that correspond to those of the seventh embodiment.

The above descriptions of LC elements of first to sixth embodiments referred to examples wherein the inductor electrode 10 was formed as a single conductor. In the case of the LC element 800 of the eighth embodiment, the inductor electrode 10 is divided into a plurality (for example, two) of divided electrode segments 10-1 and 10-2.

Figure 27:
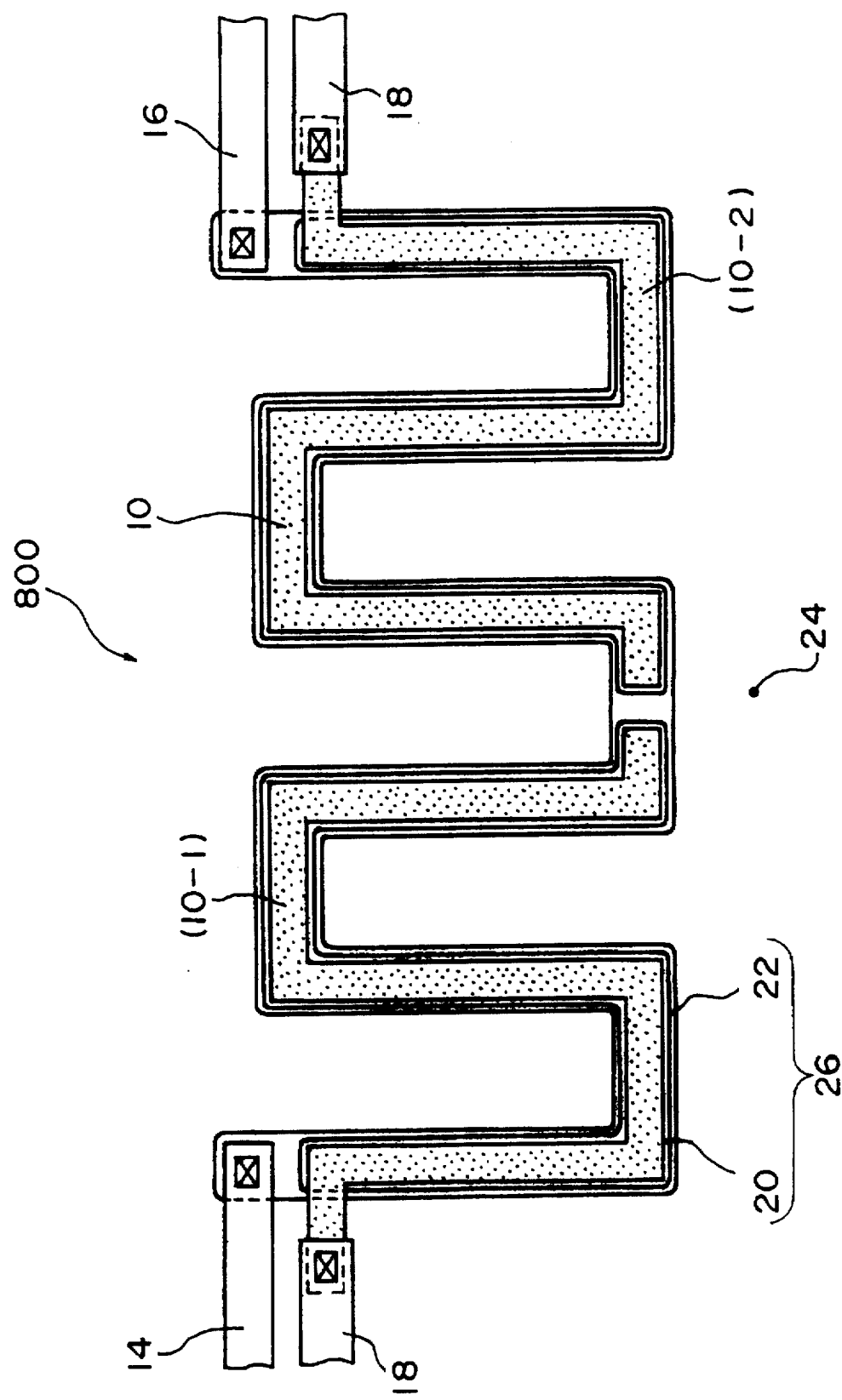
FIG. 27 is a plan view of an LC element in accordance with a eighth embodiment of this invention.

FIG. 27 is a plan view of the LC element 800 according to the eighth embodiment. As indicated in the figure, the inductor electrode 10 used for the LC element 200 indicated in FIG. 6 is replaced by divided electrode segments 10-1 and 10-2, and the p⁺ region 20 connected to each divided electrode segment is also divided. Ground electrodes 18 are respectively connected to these divided electrode segments 10-1 and 10-2, which have an overall meander shape. By grounding the two ground electrodes 18, one end of each inductor respectively formed by the divided electrode segments 10-1 and 10-2 is grounded. Alternatively, by connecting the two ground electrodes 18 to a fixed potential power supply, one end of each inductor respectively formed by the divided electrode segments 10-1 and 10-2 is set to this fixed potential.

Equivalent circuits of the LC element 800 are the same as those of the seventh embodiment indicated in FIGS. 24A, 24B and 24C, and their features are also the same as described above for the seventh embodiment.

Also, by changing the reverse bias voltage, the pn junction layer 26 capacitance is changed, and thus, the overall characteristics of the LC element 800 can be changed, in the same manner as each of the above mentioned LC elements 100 and others.

The LC element 800 also features the same advantages as the LC elements 100 and others of the above described embodiments, including manufacture by using semiconductor manufacturing technology and capability of forming as a portion of an LSI or other device, in which case wiring and other work in subsequent processing can be abbreviated.

The above description referred to an example of using the meander shaped n⁺ region 22 as the signal transmission line and dividing the inductor electrode 10. However, the opposite configuration can also be used, namely, using the inductor electrode 10 as the signal transmission line and dividing the overall pn junction layer 26 into a plurality.

Figure 28:
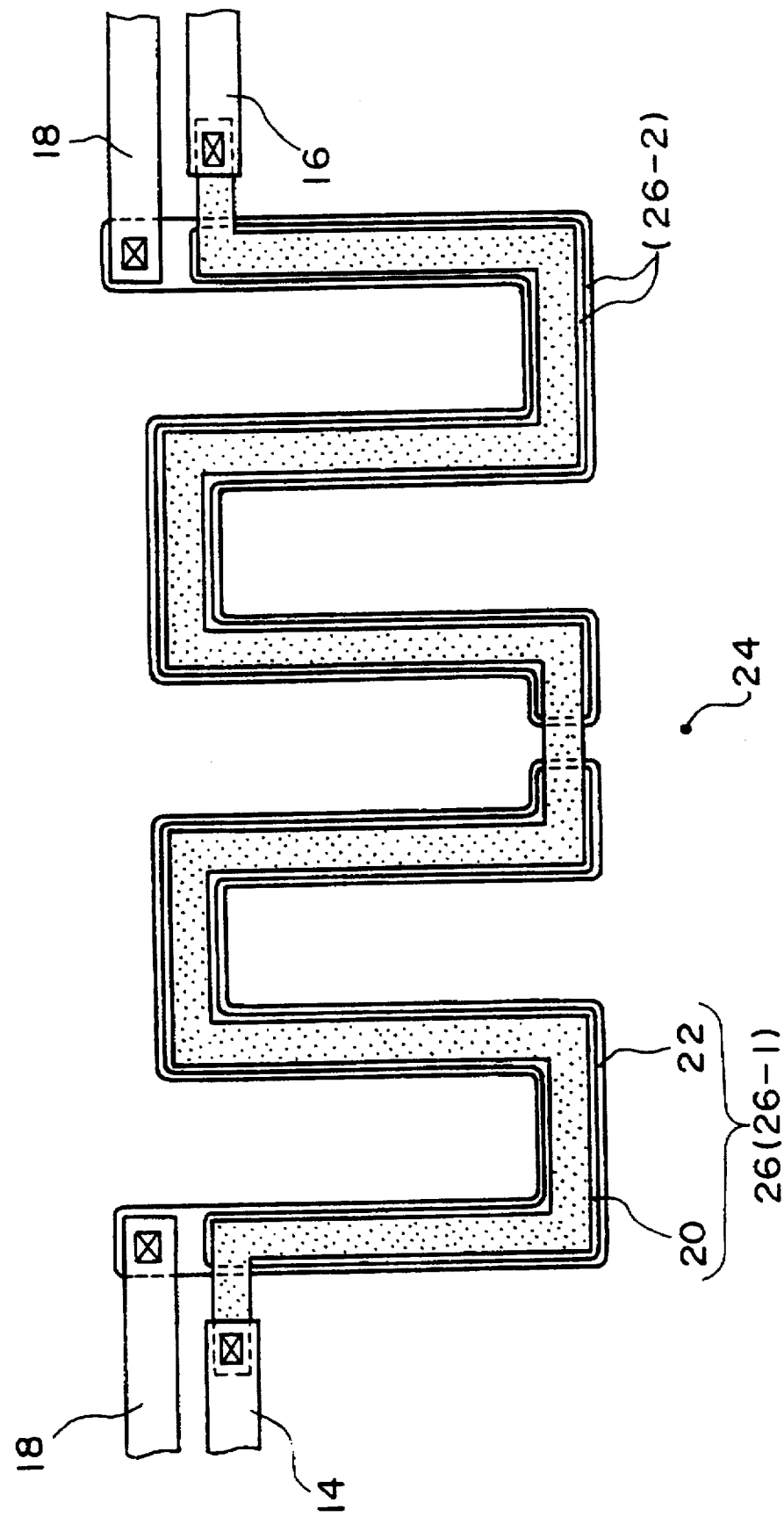
FIG. 28 indicates an example of a variation of an LC element in accordance with the eighth embodiment.

FIG. 28 shows an example of a variation of the present embodiment wherein the inductor electrode 10 is used as the signal transmission line. Input/output electrodes 14 and 16 are connected to the respective ends of the inductor electrode 10, while the pn junction layer 26 is divided into divided segments 26-1 and 26-2. One end of each n⁺ region 22 comprising each of these divided segments is connected to a ground electrode 18. As a result the functions of the n⁺ region 22 and inductor electrode 10 are interchanged with respect to the LC element 800 indicated in FIG. 27, while in essence, the same advantages are featured as the LC element indicated in FIG. 27.

Figure 29:
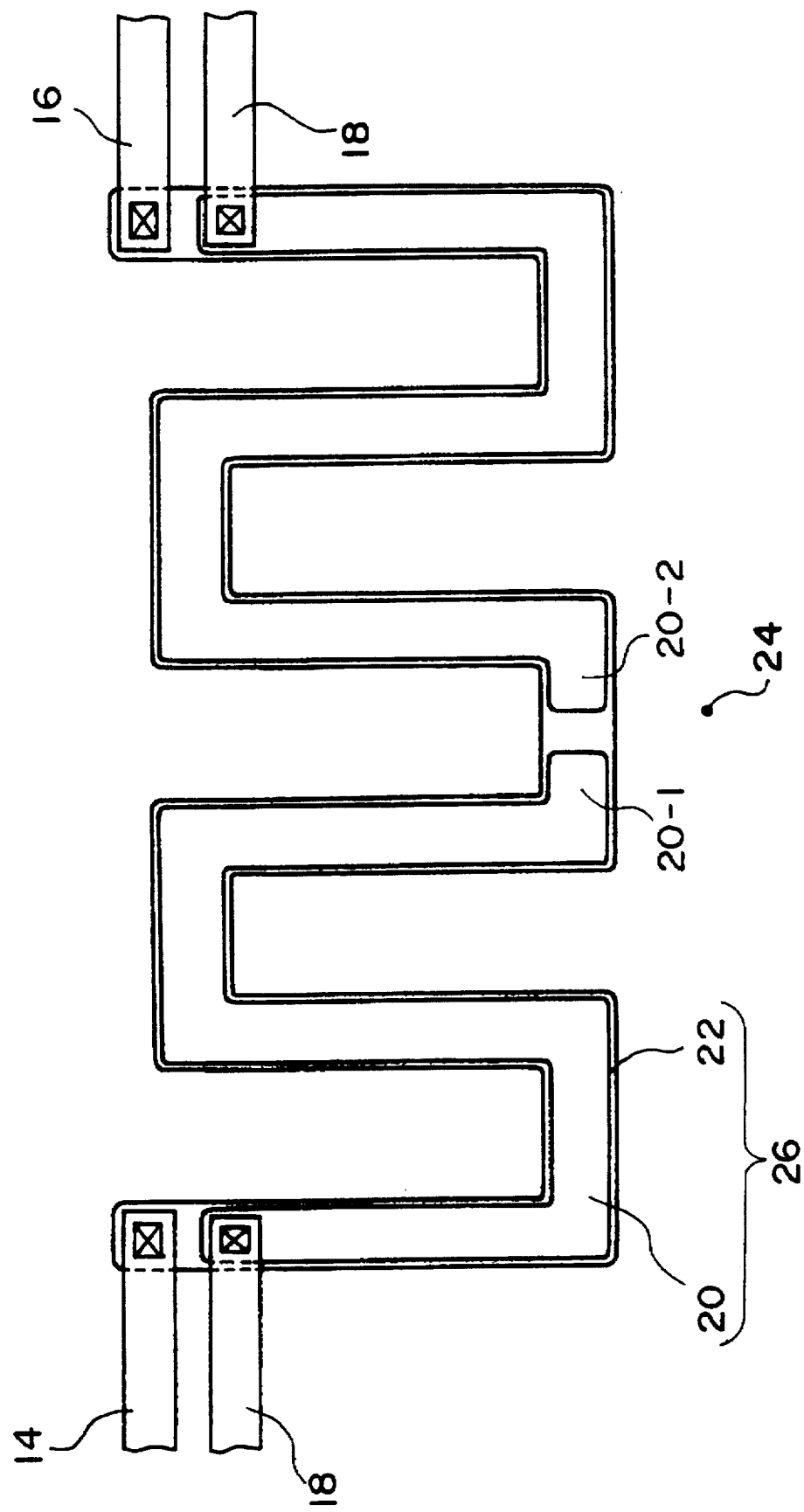
FIG. 29 indicates an example of another variation of an LC element in accordance with the eighth embodiment.

FIG. 29 shows an example of a variation of the LC element 800 wherein the inductor electrode is not used. As indicated in the figure, input/output electrodes 14 and 16 are connected to the respective ends of the p⁺ region 22, while only the p⁺ region 20 is divided and ground electrodes 18 are provided at one end each of the divided segments 20-1 and 20-2. The n⁺ region 22 and divided segments 20-1 and 20-2 respectively function as inductors, while between these, the pn junction layer 26 functions as distributed constant type capacitors. The resulting LC element has the same advantages as the LC element 800 indicated in FIG. 27 such as excellent attenuation characteristics, and ease of manufacture.

NINTH EMBODIMENT

Following is a description of a ninth embodiment of this invention with reference to the attached drawings.

In general, the function as an inductor having a predetermined inductance is obtained by forming a conductor into a spiral shape. Also, as mentioned in the foregoing, the function as an inductor having a predetermined inductance can also be obtained by forming a conductor into a meander shape. In cases where the input signal is limited to the high frequency band, shapes other than spiral or meander, and in extreme cases, even a straight line shape, can function as inductors having inductance components. The present embodiment relates to such cases wherein the LC element comprises an inductor electrode 10 and other components having shapes other than spiral or meander.

FIGS. 30A, 30B, 31A and 31B are plan views of LC elements wherein the inductor electrode 10 and pn junction layer 26 (p⁺ region 20 and n⁺ region 22) respectively have straight line shapes.

FIG. 30A corresponds to the above mentioned FIGS. 1 and 6, and indicates a three-terminal type LC element wherein the inductor electrode 10 and pn junction layer 26 are formed in essentially the same length and essentially in parallel. FIG. 30B corresponds to FIGS. 9 and 15, and indicates an LC element wherein the inductor electrode 10 is provided in correspondence to a portion of the n⁺ region 22.

Figure 31A:
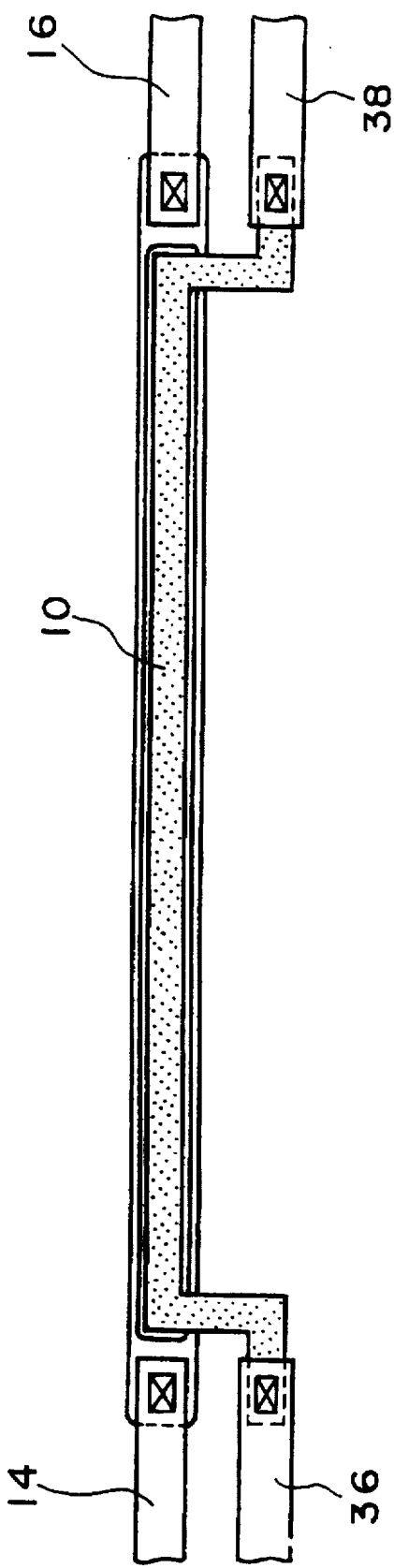
FIGS. 31A and 31B are a plan views of LC elements in accordance with a ninth embodiment of this invention.
Figure 31B:
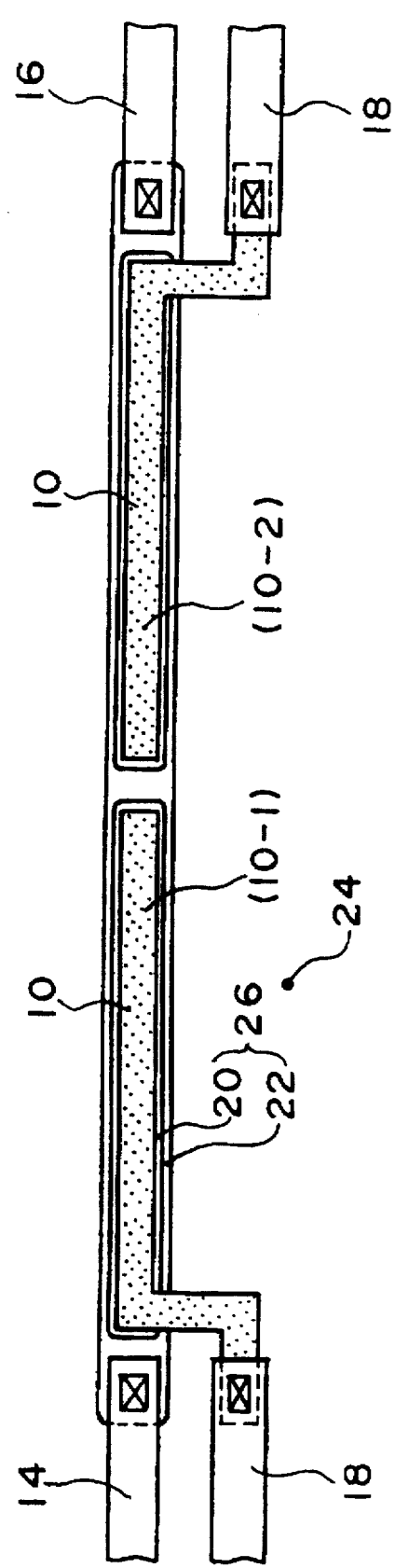

FIG. 31A corresponds to FIGS. 18 and 21, and indicates a four-terminal common mode type LC element wherein input/output electrodes 36 and 38 are respectively provided at one end and the other end of the inductor electrode 10. FIG. 31B corresponds to FIGS. 23 and 27, and indicates an LC element wherein the inductor electrode 10 is divided into two divided electrode segments 10-1 and 10-2.

Figure 32:
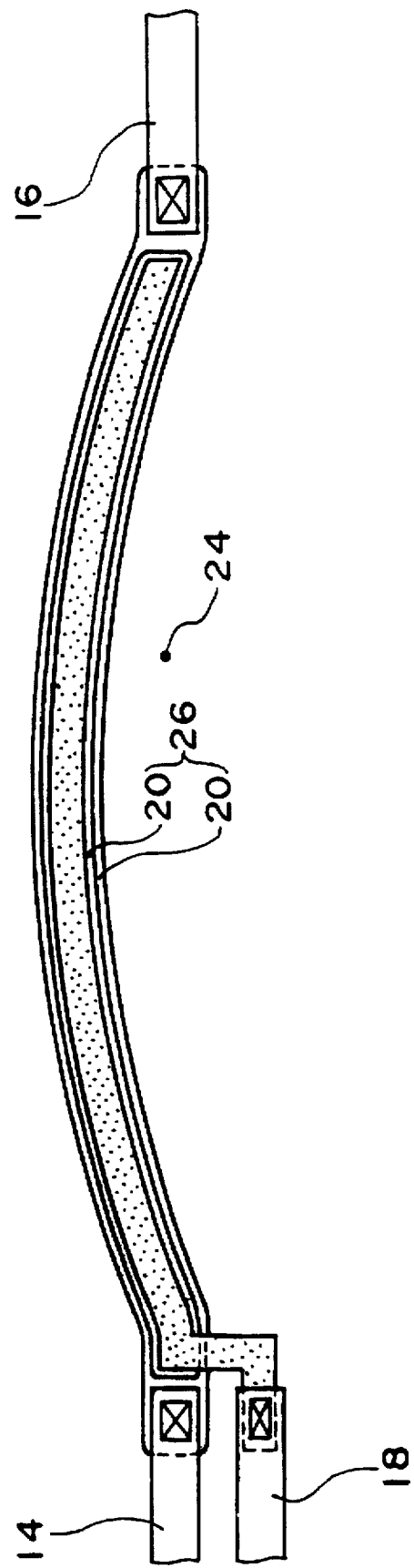
FIG. 32 indicates an example of a variation of an LC element in accordance with the ninth embodiment.

FIG. 32 is a plan view of an LC element wherein the inductor electrode 10 and pn junction layer 26 have curved line shapes with large radii of curvature. These shapes can be used for the inductor electrode 10 and pn junction layer 26 when other components etc. need to be disposed at positions on a straight line joining the two input/output electrodes 14 and 16.

Figure 33:
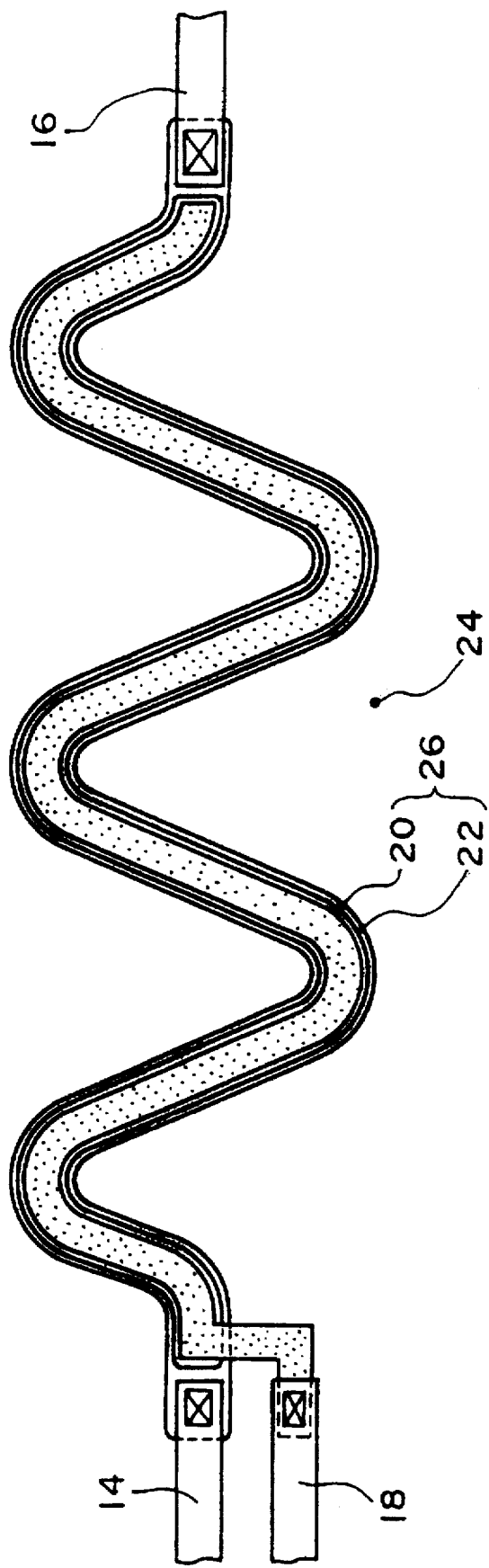
FIG. 33 indicates an example of another variation,of an LC element in accordance with the ninth embodiment.

FIG. 33 is a plan view of an LC element wherein the inductor electrode 10 and pn junction layer 26 have wave shapes. Although not to the extent of the meander shape indicated in FIGS. 6 and others, a wave shape provides a larger inductance than a straight line or large curve shape.

Figure 34:
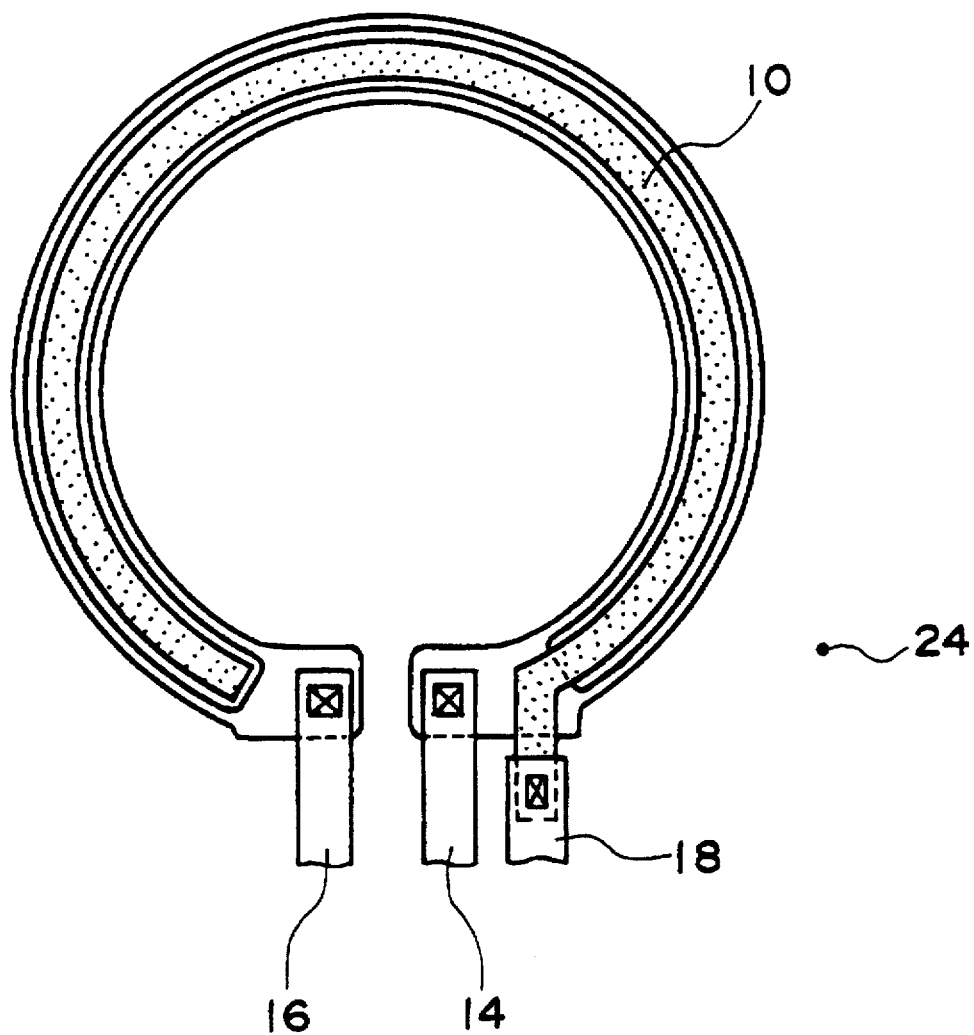
FIG. 34 indicates an example of another variation of an LC element in accordance with the ninth embodiment.

FIG. 34 is a plan view of an LC element wherein the inductor electrode 10 and pn junction layer 26 are formed in partial circle shapes of less than one turn. As indicated in the figure, this shape allows comprising an LC element having a small inductance. Also, by partially folding back one or both ends of the inductor electrode 10 and pn junction layer 26, the generated magnetic flux can be partially cancelled and the inductance reduced. As a result, the overall inductance, i.e., frequency response can be adjusted.

In order to simplify the description, only the LC element example of FIG. 30A is indicated in FIGS. 32-34. However, the LC elements in those figures can be replaced by any one of the LC elements shown in FIGS. 30B, 31A and 31B.

Consequently, the LC elements indicated in FIGS. 30A-34 have different shapes for the inductor electrode 10 and pn junction layer 26, but in the same manner as the above described LC elements 100 and others of the foregoing embodiments, they can function as elements having excellent attenuation characteristics. Also, as in the case of any one of the above mentioned embodiments, by changing the reverse bias voltage applied to the pn junction layer 26, the capacitance of the distributed constant type capacitor can be changed, and the overall characteristics of the LC element can be variably controlled.

The LC element of the present embodiment also features the same advantages as the LC elements of the above described embodiments, including manufacture by using semiconductor manufacturing technology and capability of forming as a portion of an LSI or other device, in which case wiring work in subsequent processing can be abbreviated.

OTHER EMBODIMENTS

Following are descriptions of LC elements according to other embodiments of the present invention with reference to the attached drawings.

The above described embodiments wherein the respective LC elements comprised meander shaped electrodes referred to examples wherein the two input/output electrodes 14 and 16 were disposed at separated positions near the respective ends of the inductor electrode 10 or pn junction layer 26. However, the inductor electrode 10 and/or pn junction layer 26 shape can also be modified in a manner whereby the two input/output electrodes 14 and 16 can be disposed at adjacent positions.

Figure 35:
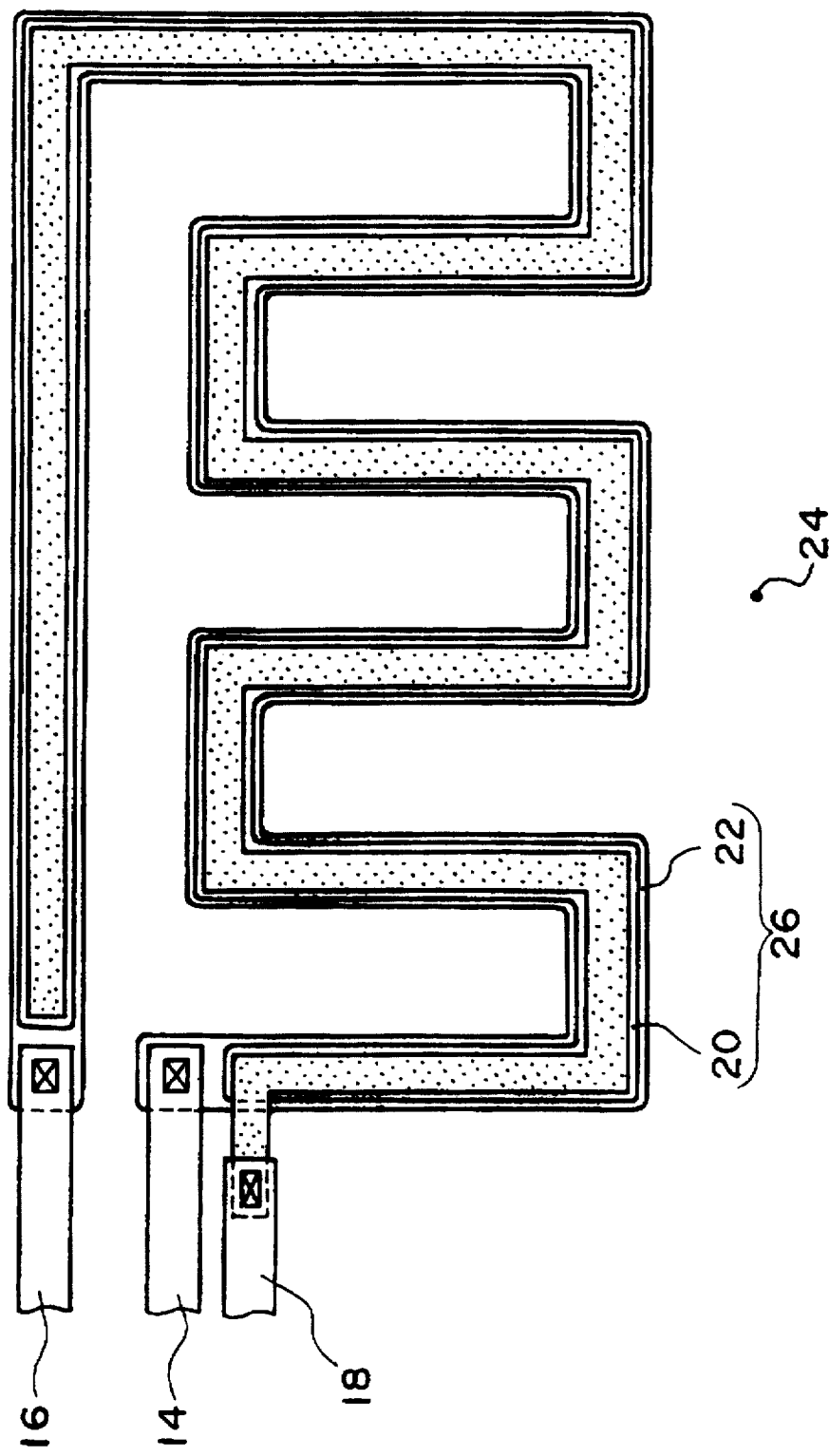
FIG. 35 indicates an example of a variation of the input/output electrode positions.
Figure 36:
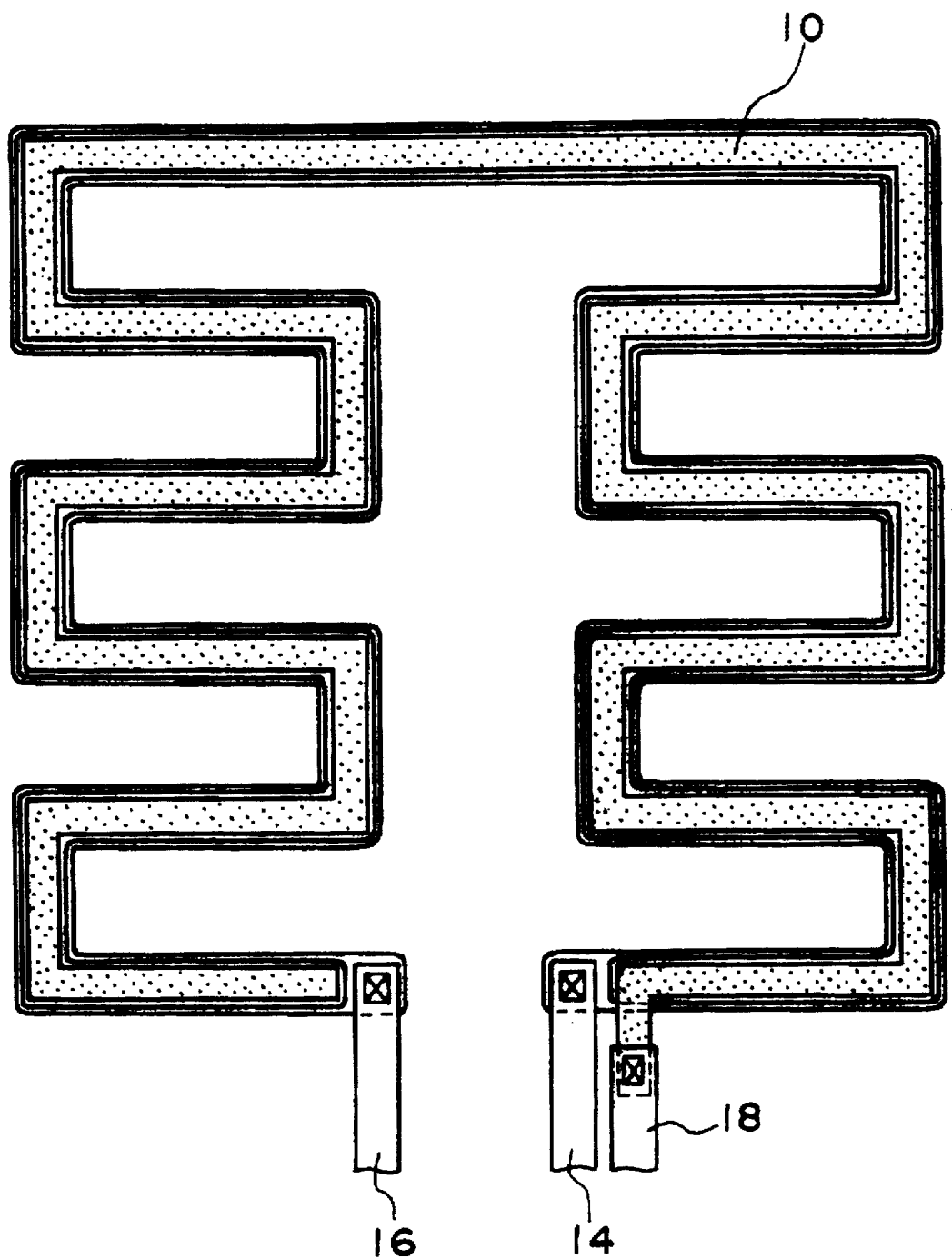
FIG. 36 indicates an example of a variation of the input/output electrode positions.

For example, as indicated in FIG. 35, one end of the inductor electrode 10 and pn junction layer 26 of the LC element 200 indicated in FIG. 6 is extended so as to reach the input/output electrode 16, thereby enabling the two input/output electrodes 14 and 16 to be disposed at adjacent positions. As another example, as indicated in FIG. 36, the inductor electrode 10 and pn junction layer 26 of the LC element 200 indicated in FIG. 6 are folded back while preserving their meander shape, thereby enabling the two input/output electrodes 14 and 16 to be disposed at adjacent positions.

In this manner, by modifying the shape of the inductor electrode 10 and/or pn junction layer 26, the two input/output electrodes 14 and 16 can be disposed adjacently, while the ground electrode 18 and the two input/output electrodes 14 and 16 can be formed at nearly the same position. Consequently, wiring when providing terminals can be performed easily and manufacturing processes can be simplified.

Figure 37:
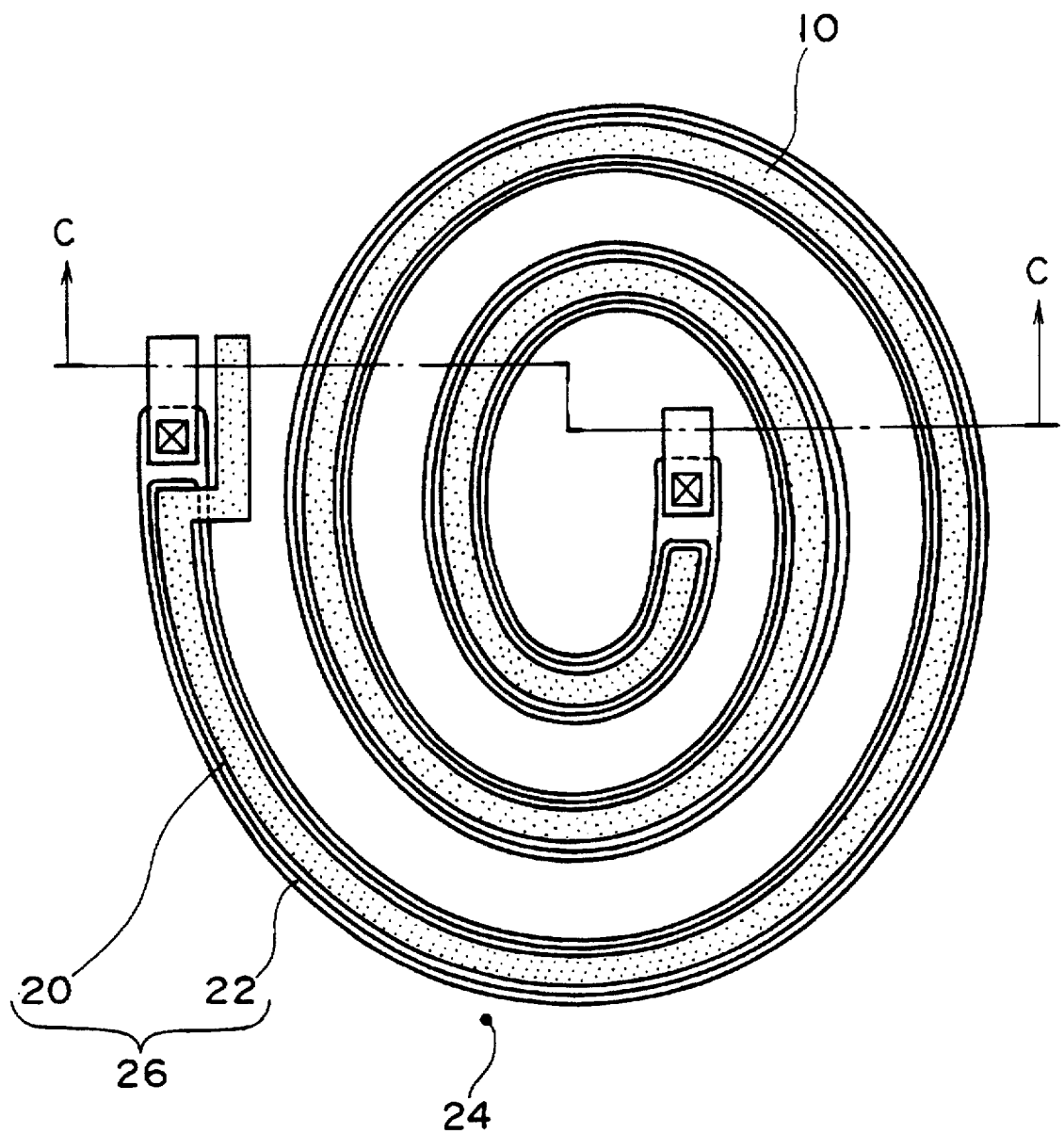
FIGS. 37 and 38 are abbreviated views of providing terminals by chemical liquid phase deposition.
Figure 38:
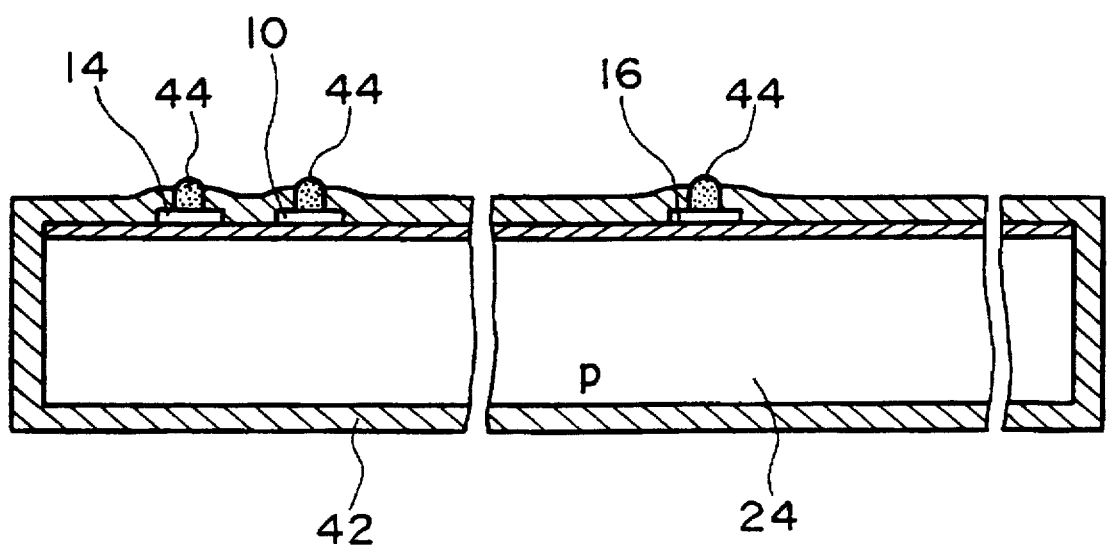

FIGS. 37 and 38 are explanatory drawings for describing the provision of terminals by chemical liquid phase deposition. FIG. 37 is a plan view of an LC element corresponding to FIGS. 1 and others. As indicated in the figure, although input/output electrodes 14 and 16 are provided at the respective ends of the $n^+$ region 22 of the pn junction layer 26, the ground electrode 18 is not provided at one end of the inductor electrode 10. After separating the individual LC elements from a semiconductor substrate having this type of construction, as indicated in the FIG. 38 cross-sectional view corresponding to a view viewed along line C—C in FIG. 37, a silicon oxide film 42 is formed as an insulation film by chemical liquid phase deposition on the entire surface of the individual separated chip (element). Perforations are opened in the silicon film by etching over the inductor electrode 10 and input/output electrodes 14 and 16. The perforations are then closed by applying solder 44 to the extent of protruding slightly from the surface. Since the protruding solder 44 can be brought into direct contact with such structures as printed wiring board lands, the condition is favorable for surface mounting.

A protective film of synthetic resin or other insulating material can also be used on the element surface, and perforations opened in the protective film by laser light.

Figure 39:
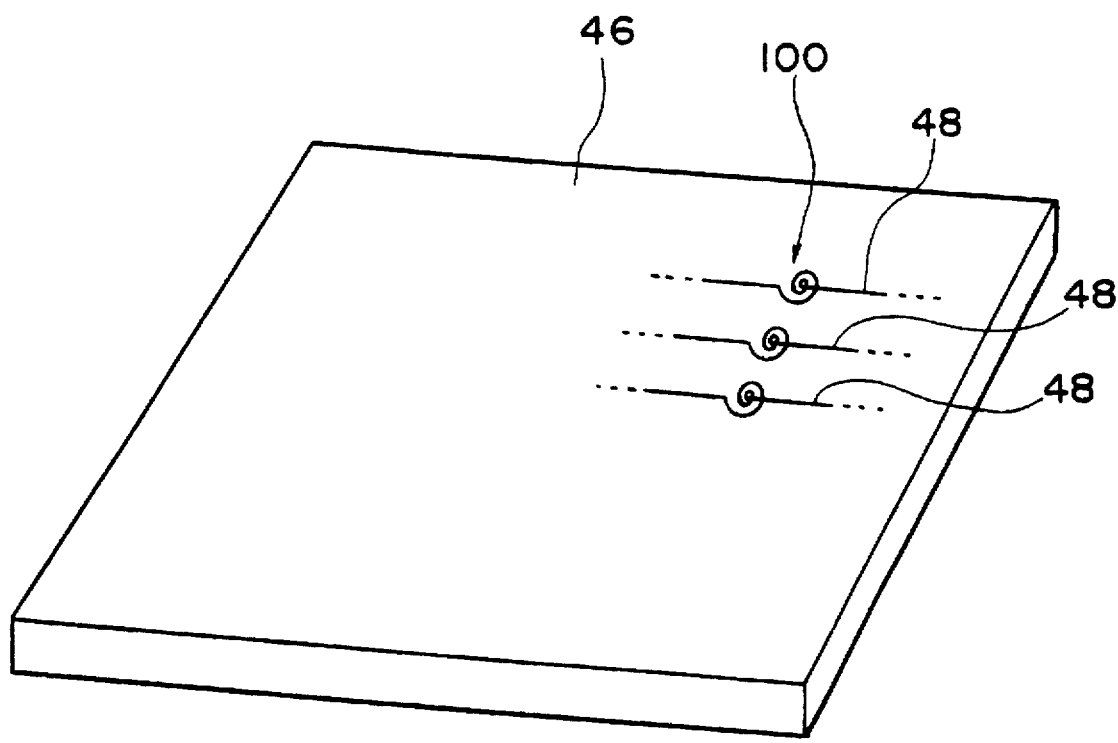
FIG. 39 is an explanatory drawing of forming an LC element of each embodiment as a portion of an LSI or other device.

FIG. 39 is an explanatory drawing for describing formation of LC elements 100, 200, and other LC elements according to any one of the foregoing embodiments as one or more portions of an LSI or other device. As indicated in the figure, the LC elements are incorporated onto the semiconductor chip 46 by inserting them into the signal lines or power supply lines 48. A special advantage of this invention is that the LC elements can be manufactured simultaneously with forming various other circuits on the semiconductor chip 46, thereby eliminating or reducing the need for wiring and other work in subsequent processing.

FIGS. 40A-40E indicate examples of buffer connection to the output side of the LC elements 100, 200 and others of the above mentioned embodiments. In general, since the $n^+$ region 22 and $p^+$ region 20 have higher resistance compared to a metal such as aluminum, when these are used as signal transmission lines, signal attenuation is comparatively significant. Consequently, in many practical applications, a buffer is connected to the output side for amplifying the attenuated signal voltage level. Also, in some cases when the inductor electrode 10 length is long or the thickness is thin and the inductor electrode 10 is used as the signal transmission line, the signal attenuation cannot be ignored. In these cases as well, a practical LC element is comprised by connecting a buffer to the output side.

Figure 40A:
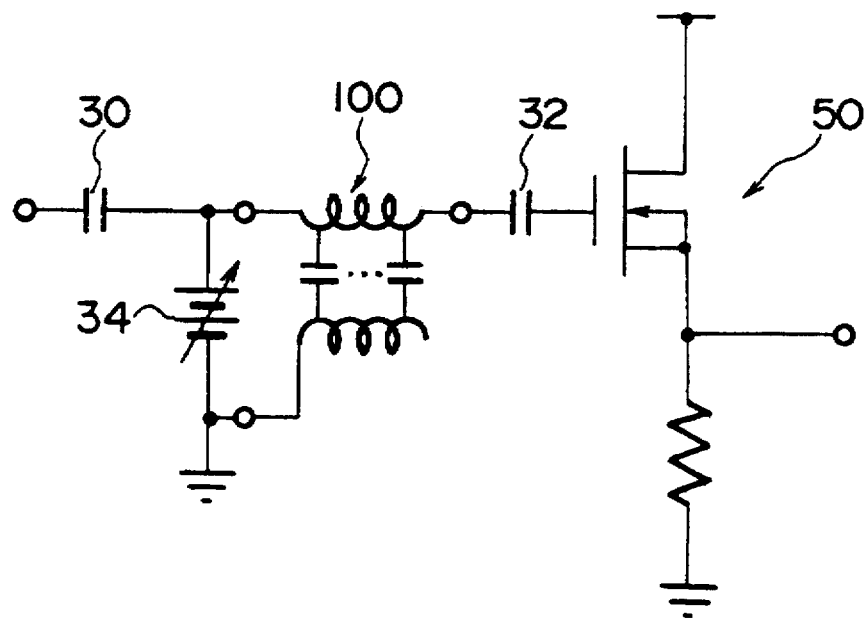
FIGS. 40A–40E are schematic diagrams showing examples of buffer circuit connection to the output side of the LC element of each embodiment.

FIG. 40A indicates use of a source-follower circuit as a buffer comprising a MOSFET and a resistor. Since construction of the MOSFET comprising this source-follower circuit 50 differs only slightly from the LC elements of the foregoing embodiments and can be formed on the same semiconductor substrate, the overall LC element including the source-follower circuit 50 can be formed in a unitized manner.

Figure 40B:
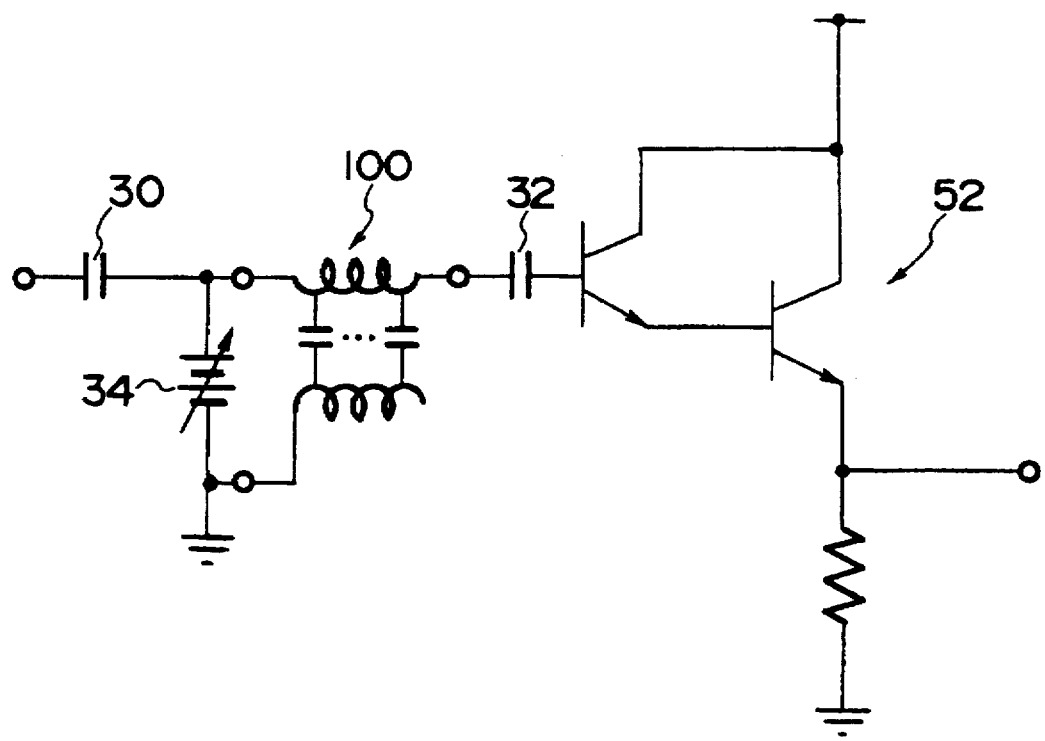

FIG. 40B indicates use of an emitter-follower circuit 52 as a buffer comprising two bipolar transistors in a Darlington connection and a resistor. Since construction of the bipolar transistors comprising this emitter-follower circuit 52 is the same as the LC elements of the foregoing embodiments, the overall LC element including the emitter-follower circuit 52 can be easily formed in a unitized manner. By grounding the base of the transistor closer to the output through a resistor, the operating point of this transistor can be further stabilized.

Figure 40C:
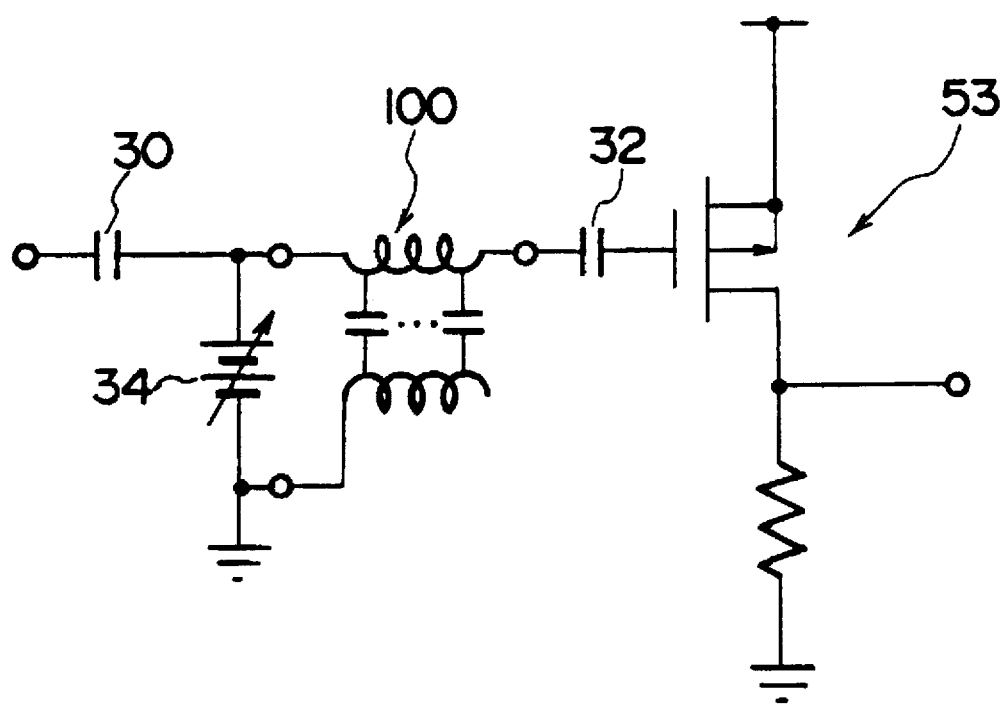

FIG. 40C shows an example of using a circuit comprising a p channel MOSFET with reverse bias as a buffer 53.

Figure 40D:
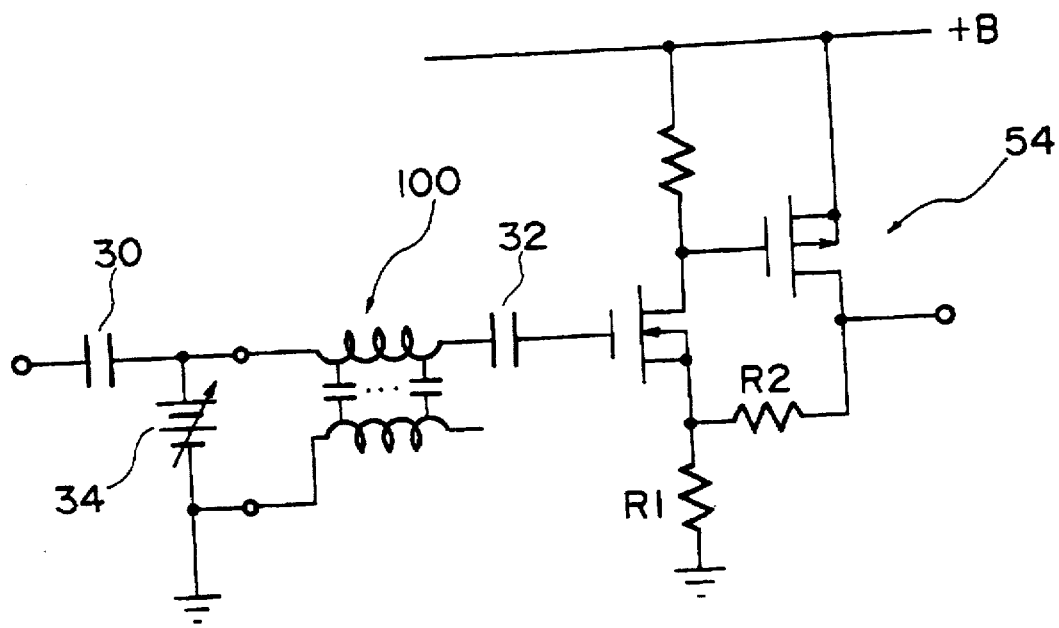

FIG. 40D shows an example of using an amplifier circuit 54 comprising two MOSFET and resistors as a buffer. Since construction of the MOSFETs comprising this amplifier circuit 54 differs only slightly from the LC elements of the foregoing embodiments and can be formed on the same semiconductor substrate, the overall LC element including the amplifier circuit 54 can be formed in a unitized manner. The voltage amplification factor of this circuit is 1+(R2/R1) and by using R2=0, the circuit is equivalent to a source-follower.

Figure 40E:
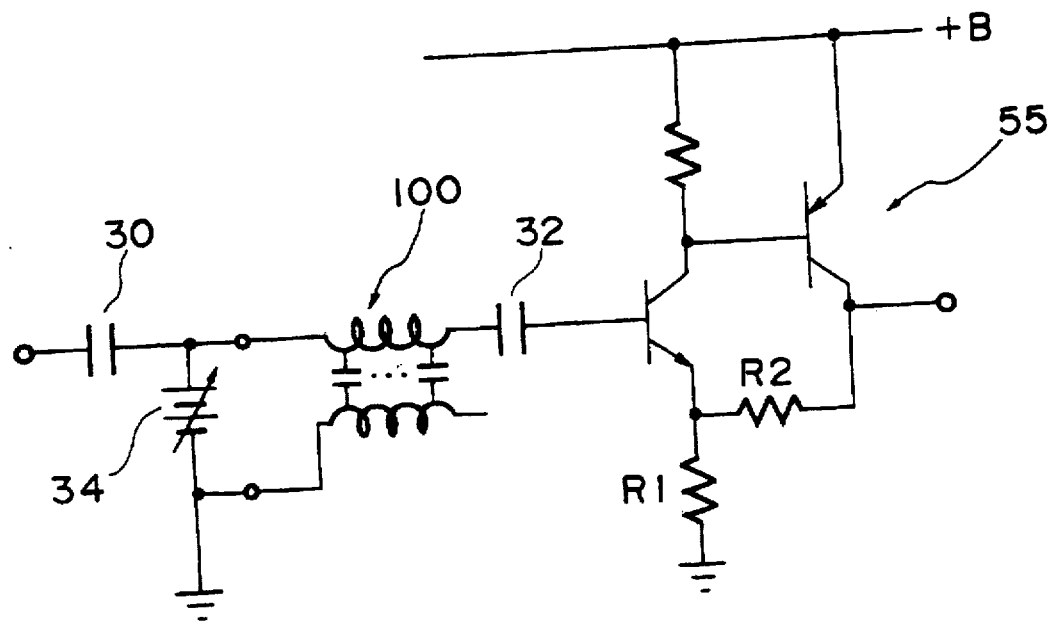

FIG. 40E shows an example of using an amplifier circuit 55 comprising two bipolar transistors and resistors as a buffer. Since construction of the bipolar transistors comprising this amplifier circuit 55 is the same as the LC elements of the foregoing embodiments and can be formed on the same semiconductor substrate, the overall LC element including the amplifier circuit 55 can be formed in a unitized manner. The voltage amplification ratio of this circuit is 1+(R2/R1) and by using R2=0, the circuit is equivalent to an emitter-follower.

When interchanging the LC element 100 indicated in FIGS. 40A–40E with the LC elements 500, 600 etc. of their respective fifth, sixth embodiments, since both the $n^+$ region 22 and inductor electrode 10 are used as signal transmission lines, a buffer such as one of the above mentioned buffers 50, 52, 53, 54 or 55 is also connected to the inductor electrode 10 output side.

In this manner, by providing a buffer at the output side, the signal level attenuated via the $n^+$ region 22 is restored by amplifying, and the frequency components over a comparatively wide band are removed by the LC elements 100, 200 and others. As a result, an output signal with excellent SN ratio can be obtained, and the impedance can be adjusted with respect to subsequent stage circuits.

FIGS. 40A–40E respectively show examples of using the LC element 100 of the first embodiment. However, the LC element 100 can be replaced by any one of the LC elements 200, 300, 400, 500, 600, 700, 800 and others of above described embodiments.

In this manner, by providing a buffer 50, 52, 53, 54, 55 at the output side, the signal level attenuated via the $n^+$ region 22 or inductor electrode 10 is restored by amplifying, and the frequency components over a comparatively wide band are removed by the LC elements 100, 200 and others. As a result, an output signal with excellent SN ratio can be obtained.

Also, by connecting a level converter circuit to the output side, the signal level attenuated via the $n^+$ region etc. can be amplified, converted to a predetermined level or the level corrected. In the same manner as the above mentioned buffers 50, 52, 53, 54 and 55, such level converter circuits can be formed in unitized manner on the same semiconductor substrate with the LC elements 100, 200 and others of the above mentioned embodiments. In the case of the LC elements 500 and 600 of their respective fifth and sixth embodiments, level converter circuits can be connected to the output side of either one or both the signal transmission lines.

The present invention is not limited by the above described embodiments, and numerous variations are possible within the scope of this invention.

For example, the above embodiments referred to examples of forming the inductor electrode 10 in direct contact with the $p^+$ region 20 surface of the pn junction layer 26. However, an insulation layer 62 comprising $SiO_2$ or other material can also be interposed between the inductor electrode 10 and the $p^+$ region 20 of the pn junction layer 26.

Figure 41:
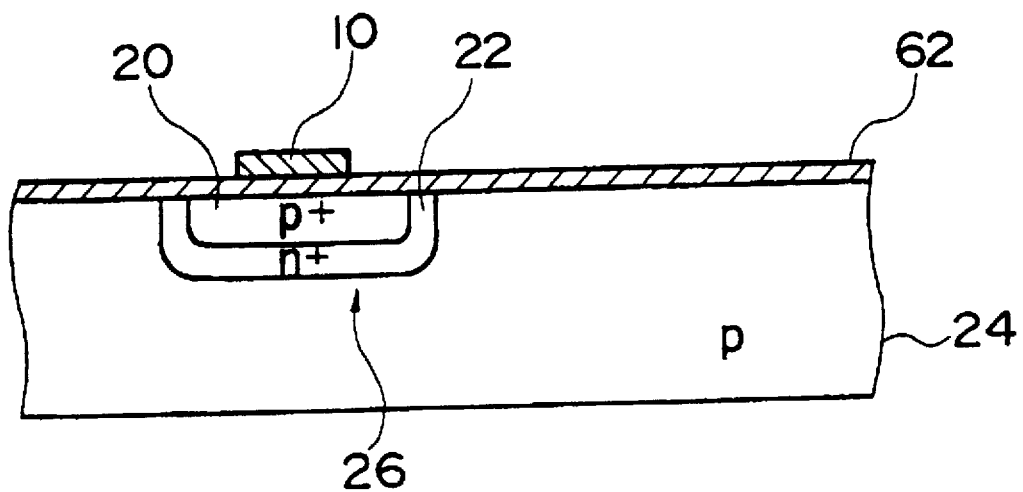
FIG. 41 is a cross-sectional view showing construction when an insulation layer is formed between the pn junction layer and the electrode.

FIG. 41 shows an example of cross-sectional construction when an insulation layer 62 is formed between the inductor electrode 10 and the $p^+$ region of the pn junction layer. In this case, reverse bias voltage can be applied directly to the pn junction layer 62, while a signal can be input directly to the input/output electrode 14 (or 16) provided at one end of the inductor electrode 10. In other words, a capacitor function is comprised by the insulation layer 62 disposed between the inductor electrode 10 and $p^+$ region 20, thereby eliminating the need for the capacitor 30 indicated in FIG. 3B and others for removing the DC component.

Figure 42:
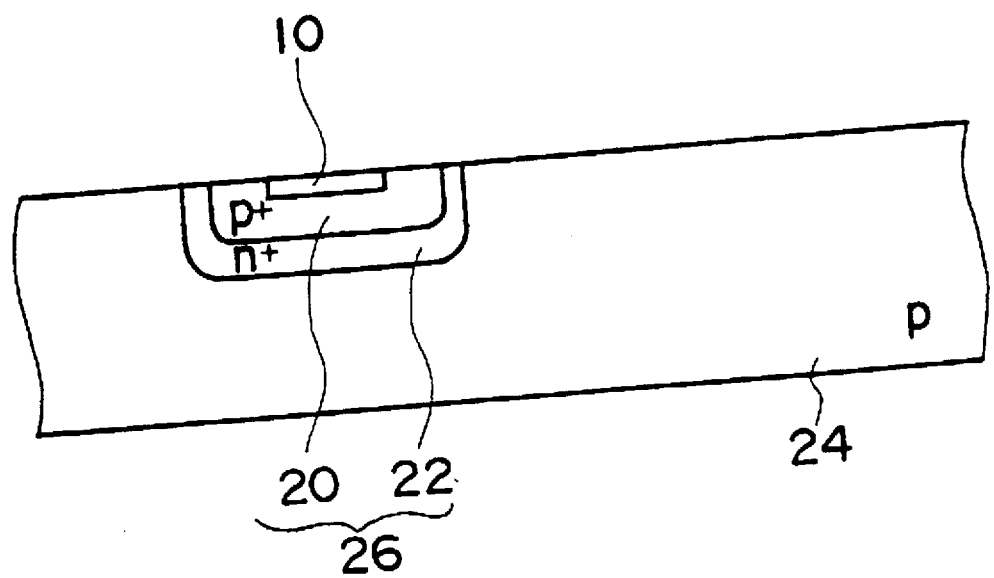
FIG. 42 is a cross-sectional view showing construction when the electrode is embedded.

Also, in the above described embodiments, the inductor electrode 10 is formed in a final process by vapor deposition of aluminum or other material, resulting in the inductor electrode 10 protruding from the surface as indicated by the cross-sectional view of FIG. 2. However, a channel can be formed in a portion of the pn junction layer 26 by etching or other means, thereby allowing the inductor electrode 10 to be embedded in the pn junction layer 26 as indicated in FIG. 42. This type of process eliminates surface irregularities and allows forming an essentially flat LC element, in which case assembly and other work can be performed easily.

Figure 43:
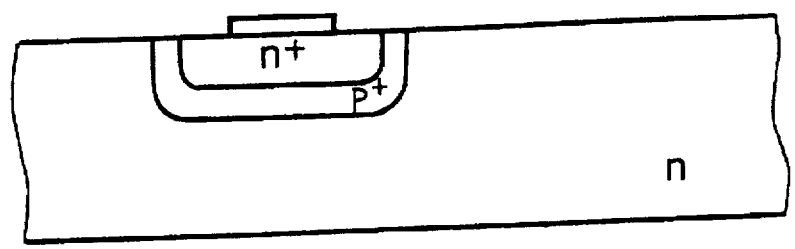
FIG. 43 is a partial cross-sectional view of an LC element having npn construction.
Figure 44:
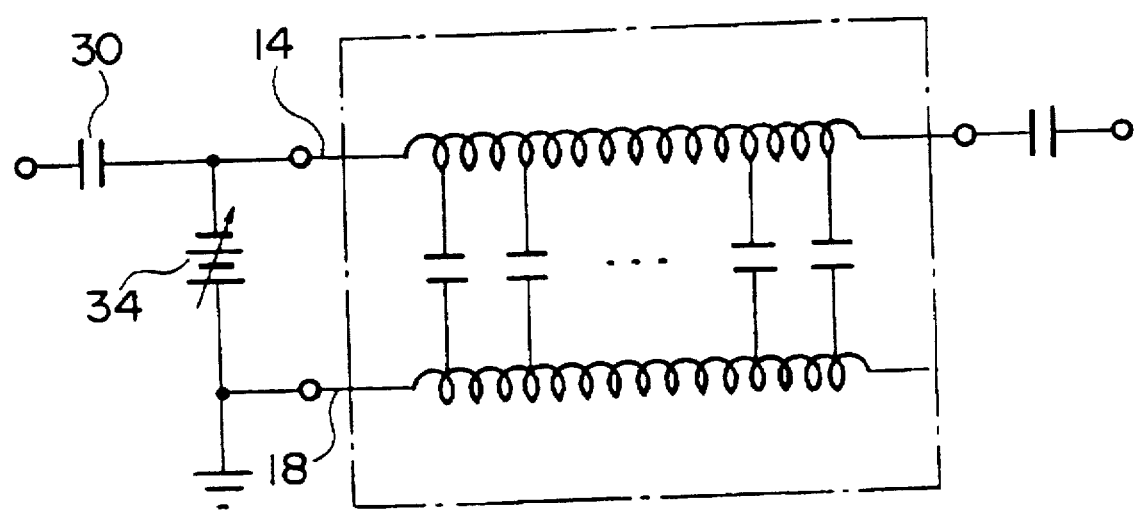
FIG. 44 is a schematic diagram indicating an example of circuit construction when the applied reverse bias voltage polarity is inverted.

The above described embodiments referred to examples of forming LC elements using pnp construction including the p-Si substrate 24. However, npn construction can also be used in the same manner. FIG. 43 is a partial cross-sectional view of an LC element having npn construction. In this case, the polarity of the reverse bias voltage applied to the pn junction layer needs to be inverted. FIG. 44 shows an example of a circuit for applying this inverted polarity reverse bias voltage and corresponds to FIG. 3C.

In the cases of the above mentioned embodiments relating to a spiral shaped inductor electrode, the descriptions referred to essentially circular spiral shapes for the inductor electrode 10 and pn junction layer 26. However, provided an overall spiral shape is formed, a squared type or other type of spiral shape can also be used. Also, these same descriptions referred to examples of connecting the ground electrode 18 to the outer circumference end of the inductor electrode 10. However, the ground electrode 18 can also be provided at the inner circumference end of the inductor electrode 10.

The foregoing descriptions also mentioned the effects of forming the LC elements 100 and others as portions of LSI or other devices. However, formation as portions of LSI or other devices is not essential. After forming the LC element 100 etc. on a semiconductor substrate, terminals can be respectively provided for the input/output electrode 14 and 16, and the ground electrode 18, or chemical liquid phase deposition can be used as indicated in FIG. 38 to provide terminals, thereby forming a discrete element. In this case, a plurality of LC elements can be formed simultaneously on the same semiconductor substrate, which can then be separated and respectively provided with terminals. In this manner, the LC elements can be easily mass produced.

Also, the above mentioned embodiments referred to examples of providing the input/output electrodes 14 and 16, and the ground electrode 18 at the respective ends of the $n^+$ region 22 and inductor electrode 10. However, these need not be the absolute ends, and the attachment positions of the input/output electrodes 14 and 16, and the ground electrode 18 can be shifted according to requirements.

As mentioned in the above descriptions, by changing the reverse bias voltage, the capacitance of the distributed constant type capacitor also changes and thus, the frequency response of the LC element can be variably controlled. Consequently, by using the LC element 100 etc. as a portion of a circuit, variable frequency type circuits, such as tuners, modulators, oscillators and filters can be easily constructed.

The foregoing embodiment descriptions referred to examples of forming the pn junction layer on a p-Si substrate. However, other types of semiconductors, such as germanium or gallium arsenide, or non-crystalline material such as amorphous silicon can also be used.

What is claimed is:

1. An LC element comprising:

an inductor electrode having a predetermined shape formed on a surface of a semiconductor substrate, and a pn junction layer having a predetermined shape formed at a position along said inductor electrode in a portion of said semiconductor substrate, wherein said pn junction layer comprises a first region comprising one of a p region and an n region and a second region in direct contact with the substrate and lying between the substrate and the first region and comprising an inverted region with respect to said first region, and functions as a capacitor when used in the reverse bias state, said first region is directly connected to said inductor electrode, said inductor electrode and said second region respectively comprise inductors, a distributed constant type capacitor is formed by said pn junction layer in correspondence to these inductors, at least one of said inductor electrode and said second region is used as a signal transmission line and the second region is not directly connected along its length to said inductor electrode.

2. An LC element according to claim 1 wherein: said inductor electrode has a spiral shape.

3. An LC element according to claim 2 further comprising:

first and second input/output electrodes provided near the respective ends of one of said inductor electrode and said second region of said pn junction layer, and third and fourth input/output electrodes provided near the respective ends of the other one of said inductor electrode and said second region of said pn junction layer, wherein:

said inductor electrode and the second region of said pn junction layer respectively function as signal transmission lines, thereby enabling use as a common mode type element.

4. An LC element according to claim 3 wherein:

at least said second region of said pn junction layer is formed different in length than said inductor electrode, thereby producing partial correspondence between said inductor electrode and said second region of the pn junction layer.

5. An LC element according to claim 3 wherein:

the capacitance of said pn junction layer is changed by changing the reverse bias voltage applied to said pn junction layer.

6. An LC element according to claim 3 further comprising:

a buffer connected to the output side of said signal transmission line.

7. An LC element according to claim 3 formed in a unitized manner as a portion of substrate wherein:

at least one of said inductor electrode and the second region of said pn junction layer is inserted into one of a signal line and a power supply line.

8. An LC element according to claim 1 wherein: said inductor electrode has a straight line shape.

9. An LC element according to claim 8 further comprising:

first and second input/output electrodes provided near the respective ends of one of said inductor electrode and said second region of said pn junction layer, and third and fourth input/output electrodes provided near the respective ends of the other one of said inductor electrode and said second region of said pn junction layer, wherein:

said inductor electrode and the second region of said pn junction layer respectively function as signal transmission lines, thereby enabling use as a common mode type element.

10. An LC element according to claim 9 wherein:

the capacitance of said pn unction layer is changed by changing the reverse bias voltage applied to said pn junction layer.

11. An LC element according to claim 1 further comprising:

first and second input/output electrodes provided near the respective ends of one of said inductor electrode and said second region of said pn junction layer, and third and fourth input/output electrodes provided near the respective ends of the other one of said inductor electrode and said second region of said pn junction layer, wherein:

said inductor electrode and the second region of said pn junction layer respectively function as signal transmission lines, thereby enabling use as a common mode type element.

12. An LC element according to claim 11 wherein:

at least said second region of said pn junction layer is formed different in length than said inductor electrode, thereby producing partial correspondence between said inductor electrode and said second region of the pn junction layer.

13. An LC element according to claim 11 wherein:

the capacitance of said pn junction layer is changed by changing the reverse bias voltage applied to said pn junction layer.

14. An LC element according to claim 11 further comprising:

a buffer connected to the output side of said signal transmission line.

15. An LC element according to claim 11 formed in a unitized manner as a portion of substrate wherein:

at least one of said inductor electrode and the second region of said pn junction layer is inserted into one of a signal line and a power supply line.

16. An LC element according to claim 1 wherein:

said inductor electrode has a curved line shape.

17. An LC element according to claim 16 further comprising:

first and second input/output electrodes provided near the respective ends of one of said inductor electrode and said second region of said pn junction layer, and third and fourth input/output electrodes provided near the respective ends of the other one of said inductor electrode and said second region of said pn junction layer, wherein:

said inductor electrode and the second region of said pn junction layer respectively function as signal transmission lines, thereby enabling use as a common mode type element.

18. An LC element according to claim 17 wherein:
the capacitance of said pn junction layer is changed by changing the reverse bias voltage applied to said pn junction layer.

19. An LC element according to claim 1 wherein:
said inductor electrode has a meander shape.

20. An LC element according to claim 19 further comprising:
first and second input/output electrodes provided near the respective ends of one of said inductor electrode and said second region of said pn junction layer, and
third and fourth input/output electrodes provided near the respective ends of the other one of said inductor electrode and said second region of said pn junction layer, wherein:
said inductor electrode and the second region of said pn junction layer respectively function as signal transmission lines, thereby enabling use as a common mode type element.

21. An LC element according to claim 20 wherein:
at least said second region of said pn junction layer is formed different in length than said inductor electrode, thereby producing partial correspondence between said inductor electrode and said second region of the pn junction layer.

22. An LC element according to claim 20 wherein:
the capacitance of said pn unction layer is changed by changing the reverse bias voltage applied to said pn junction layer.

23. An LC element according to claim 20 further comprising:
a buffer connected to the output side of said signal transmission line.

24. An LC element according to claim 20 formed in a unitized manner as a portion of substrate wherein:
at least one of said inductor electrode and the second region of said pn junction layer is inserted into one of a signal line and a power supply line.

25. An LC element comprising
an inductor electrode having a spiral shape formed on a surface of a semiconductor substrate, and
a pn junction layer having a predetermined shape formed at a position along said inductor electrode in a portion of said semiconductor substrate, wherein
said pn junction layer comprises a first region comprising one of a p region and an n region and a second region in direct contact with the substrate and lying between the substrate and the first region and comprising an inverted region with respect to said first region and functions as a capacitor when used in the reverse bias state,
said first region is directly connected to said inductor electrode,
said inductor electrode and said second region respectively comprise inductors,
a distributed constant type capacitor is formed by said pn junction layer in correspondence to these inductors,
first and second input/output electrodes connected to respective ends of one of said inductor electrode and the second region of the pn junction layer, and
a ground electrode provided near only one end of the other one of said inductor electrode and the second region of said pn junction layer, wherein:
a signal is input to one of said first input/output electrode and said second input/output electrode and output from the other one thereof, and said ground electrode is connected to at least one of a fixed potential power supply and a ground.

26. An LC element according to claim 25 wherein:
the capacitance of said pn junction layer is changed by changing the reverse bias voltage applied to said pn junction layer.

27. An LC element according to claim 25 wherein:
at least said second region of said pn junction layer is formed different in length than said inductor electrode, thereby producing partial correspondence between said inductor electrode and said second region of the pn junction layer.

28. An LC element according to claim 25 wherein:
at least one of said inductor electrode and said second region of said pn junction layer is divided into a plurality of segments, and each divided segment is respectively connected electrically.

29. An LC element according to claim 25 further comprising:
a buffer connected to the output side of said signal transmission line.

30. An LC element according to claim 25 formed in a unitized manner as a portion of substrate wherein:
at least one of said inductor electrode and the second region of said pn junction layer is inserted into one of a signal line and a power supply line.

31. An LC element comprising:
an inductor electrode having a predetermined shape formed on a surface of a semiconductor substrate, and
a pn junction layer having a predetermined shape formed at a position along said inductor electrode in a portion of said semiconductor substrate, wherein
said pn junction layer comprises a first region comprising one of a p region and an n region and a second region in direct contact with the substrate and lying between the substrate and the first region and comprising an inverted region with respect to said first region, and functions as a capacitor when used in the reverse bias state,
said first region is directly connected to said inductor electrode,
said inductor electrode and said second region respectively comprise inductors,
a distributed constant type capacitor is formed by said pn junction layer in correspondence to these inductors,
first and second input/output electrodes connected to respective ends of one of said inductor electrode and the second region of said pn junction layer, and
a ground electrode provided near only one end of the other one of said inductor electrode and the second region of said pn junction layer, wherein:
a signal is input to one of said first input/output electrode and said second input/output electrode and output from the other one thereof, and
said ground electrode is connected to at least one of a fixed potential power supply and a ground.

32. An LC element according to claim 31 wherein:
at least said second region of said pn junction layer is formed different in length than said inductor electrode, thereby producing partial correspondence between said inductor electrode and said second region of the pn junction layer.

33. An LC element according to claim 31 wherein:
at least one of said inductor electrode and said second region of said pn junction layer is divided into a plurality of segments, and each divided segment is respectively connected electrically.

34. An LC element according to claim 31 wherein:
the capacitance of said pn junction layer is changed by changing the reverse bias voltage applied to said pn junction layer.

35. An LC element according to claim 31 further comprising:
a buffer connected to the output side of said signal transmission line.

36. An LC element according to claim 31 formed in a unitized manner as a portion of substrate wherein:
at least one of said inductor electrode and the second region of said pn junction layer is inserted into one of a signal line and a power supply line.

37. An LC element comprising:
an inductor electrode having a meander shape formed on a surface of a semiconductor substrate, and
a pn junction layer having a predetermined shape formed at a position along said inductor electrode in a portion of said semiconductor substrate, wherein
said pn junction layer comprises a first region comprising one of a p region and an n region and a second region in direct contact with the substrate and lying between the substrate and the first region and comprising an inverted region with respect to said first region, and functions as a capacitor when used in the reverse bias state,
said first region is directly connected to said inductor electrode,
said inductor electrode and said second region respectively comprise inductors,
a distributed constant type capacitor is formed by said pn junction layer in correspondence to these inductors,
first and second input/output electrodes connected to respective ends of one of said inductor electrode and the second region of the pn junction layer, and
a ground electrode provided near only one end of the other one of said inductor electrode and the second region of said pn junction layer, wherein:
a signal is input to one of said first input/output electrode and said second input/output electrode and output from the other one thereof, and
said ground electrode is connected to at least one of a fixed potential power supply and a ground.

38. An LC element according to claim 37 wherein:
at least said second region of said pn junction layer is formed different in length than said inductor electrode, thereby producing partial correspondence between said inductor electrode and said second region of the pn junction layer.

39. An LC element according to claim 37 wherein:
at least one of said inductor electrode and said second region of said pn junction layer is divided into a plurality of segments, and each divided segment is respectively connected electrically.

40. An LC element according to claim 37 wherein:
the capacitance of said pn junction layer is changed by changing the reverse bias voltage applied to said pn junction layer.

41. An LC element according to claim 37 further comprising:
a buffer connected to the output side of said signal transmission line.

42. An LC element according to claim 37 formed in a unitized manner as a portion of substrate wherein:
at least one of said inductor electrode and the second region of said pn junction layer is inserted into one of a signal line and a power supply line.

43. An LC element comprising:
an inductor electrode having a curved line shape formed on a surface of a semiconductor substrate, and
a pn junction layer having a predetermined shape formed at a position along said inductor electrode in a portion of said semiconductor substrate, wherein
said pn junction layer comprises a first region comprising one of a p region and an n region and a second region in direct contact with the substrate and lying between the substrate and the first region and comprising an inverted region with respect to said first region, and functions as a capacitor when used in the reverse bias state,
said first region is directly connected to said inductor electrode,
said inductor electrode and said second region respectively comprise inductors,
a distributed constant type capacitor is formed by said pn junction layer in correspondence to these inductors,
first and second input/output electrodes connected to respective ends of one of said inductor electrode and the second region of the pn junction layer, and
a ground electrode provided near only one end of the other one of said inductor electrode and the second region of said pn junction layer, wherein:
a signal is input to one of said first input/output electrode and said second input/output electrode and output from the other one thereof, and
said ground electrode is connected to at least one of a fixed potential power supply and a ground.

44. An LC element according to claim 43 wherein:
the capacitance of said pn junction layer is changed by changing the reverse bias voltage applied to said pn junction layer.

45. An LC element comprising:
an inductor electrode having a straight line shape formed on a surface of a semiconductor substrate, and
a pn junction layer having a predetermined shape formed at a position along said inductor electrode in a portion of said semiconductor substrate, wherein
said pn junction layer comprises a first region comprising one of a p region and an n region and a second region in direct contact with the substrate and lying between the substrate and the first region and comprising an inverted region with respect to said first region, and functions as a capacitor when used in the reverse bias state,
said first region is directly connected to said inductor electrode,
said inductor electrode and said second region respectively comprise inductors,
a distributed constant type capacitor is formed by said pn junction layer in correspondence to these inductors,
first and second input/output electrodes connected to respective ends of one of said inductor electrode and the second region of the pn junction layer, and
a ground electrode provided near only one end of the other one of said inductor electrode and the second region of said pn junction layer, wherein:

a signal is input to one of said first input/output electrode and said second input/output electrode and output from the other one thereof, and said ground electrode is connected to at least one of a fixed potential power supply and a ground.

46. An LC element according to claim 45 wherein:

the capacitance of said pn unction layer is changed by changing the reverse bias voltage applied to said pn junction layer.

47. An LC element manufacturing method comprising the steps of:

a first process whereby a spiral shaped pn junction layer comprising a first region and a second region inverted with respect thereof is formed in a semiconductor substrate, the second region in direct contact with the substrate and lying between the substrate and the first region, a second process whereby an inductor electrode is formed electrically connected over the entire length of said first region on the surface of said pn junction layer and the second region is not directly connected along its length to the inductor electrode, and a third process whereby a wiring layer is formed respectively connected only to at least one end of said inductor electrode and second region of said pn junction layer.

48. A method of making an LC element, comprising:

forming an inductor electrode on a surface of a semiconductor substrate;

forming a pn junction layer in a portion of the semiconductor substrate and along the inductor electrode;

forming one of a first p region and a first n region in the pn junction layer;

forming a second inverted region with respect to the first region in direct contact with the substrate and lying between the first region and the substrate; and forming a connection between the first region and the inductor electrode, wherein the second inverted region is not directly connected along its length to said inductor electrode.

49. The method of claim 48, further comprising:

providing first and second electrodes near respective ends of one of the inductor electrode and the second region of the pn junction layer;

providing a ground electrode near only one end of the other of the inductor electrode and the second region of the pn junction layer;

connecting at least one of a fixed potential power supply and a ground to the ground electrode;

forming an insulation film on the entire surface of the semiconductor substrate;

opening perforations in portions of the insulation film by one of etching and laser light emission; and closing the perforations by applying solder to the extent of protruding slightly from the surface.

50. The method of claim 48, further comprising:

forming the inductor electrode in a spiral shape;

providing first and second electrodes near respective ends of one of the inductor electrode and the second region of the pn junction layer;

providing a ground electrode near only one end of the other of the inductor electrode and the second region of the pn junction layer;

connecting at least one of a fixed potential power supply and a ground to the ground electrode;

forming an insulation film on the entire surface of the semiconductor substrate;

opening perforations in portions of the insulation film by one of etching and laser light emission; and closing the perforations by applying solder to the extent of protruding slightly from the surface.

51. The method of claim 48, further comprising:

forming the inductor electrode in a meander shape;

providing first and second electrodes near respective ends of one of the inductor electrode and the second region of the pn junction layer;

providing a ground electrode near only one end of the other of the inductor electrode and the second region of the pn junction layer;

connecting at least one of a fixed potential power supply and a ground to the ground electrode;

forming an insulation film on the entire surface of the semiconductor substrate;

opening perforations in portions of the insulation film by one of etching and laser light emission; and closing the perforations by applying solder to the extent of protruding slightly from the surface.

52. The method of claim 48, further comprising:

providing first and second electrodes near respective ends of one of the inductor electrode and the second region of the pn junction layer;

providing third and fourth electrodes near respective ends of the other one of the inductor electrode and the second region of the pn junction layer;

forming an insulation film on the entire surface of the semiconductor substrate;

opening perforations in portions of the insulation film by one of etching and laser light emission; and closing the perforations by applying solder to the extent of protruding slightly from the surface.

53. The method of claim 48, further comprising:

forming the inductor electrode in a spiral shape;

providing first and second electrodes near respective ends of one of the inductor electrode and the second region of the pn junction layer;

providing third and fourth electrodes near respective ends of the other one of the inductor electrode and the second region of the pn junction layer;

forming an insulation film on the entire surface of the semiconductor substrate;

opening perforations in portions of the insulation film by one of etching and laser light emission; and closing the perforations by applying solder to the extent of protruding slightly from the surface.

54. The method of claim 48, further comprising:

forming the inductor electrode in a meander shape;

providing first and second electrodes near respective ends of one of the inductor electrode and the second region of the pn junction layer;

providing third and fourth electrodes near respective ends of the other one of the inductor electrode and the second region of the pn junction layer;

forming an insulation film on the entire surface of the semiconductor substrate;

opening perforations in portions of the insulation film by one of etching and laser light emission; and closing the perforations by applying solder to the extent of protruding slightly from the surface.

55. A method of making an LC element, comprising:

forming a pn junction layer in a portion of a semiconductor substrate;

forming one of a first p region and a first n region in the pn junction layer;

forming a second inverted region with respect to the first region;

providing first and second electrodes near respective ends of one of the first region and the second region of the pn junction layer, wherein the second region is not electrically connected along its entire length to an inductor electrode;

providing a ground electrode near only one end of the other of the first region and the second region of the pn junction layer;

connecting at least one of a fixed potential power supply and a ground to the ground electrode;

forming an insulation film on the entire surface of the semiconductor substrate;

opening perforations in portions of the insulation film by one of etching and laser light emission; and closing the perforations by applying solder to the extent of protruding slightly from the surface.

56. The method of claim 55, further comprising:

forming the pn junction layer in a spiral shape.

57. The method of claim 55, further comprising:

forming the pn junction layer in a meander shape.

58. An LC element formed in a portion of a semiconductor substrate comprising:

a pn junction layer having a predetermined shape and functioning as a capacitor when used in a reverse bias state, said pn junction layer including a first region and a second region inverted with respect to the first region, first and second input/output electrodes provided near the respective ends of one of the first region and the second region comprising said pn junction layer, and a ground electrode provided near only one end of the other one of the first and second regions comprising said pn junction layer, wherein;

inductors are respectively comprised by the first and second regions, a distributed constant type capacitor is formed by the pn junction layer, at least one of the first and second regions is used as a signal transmission line, a signal is input to one of said first input/output electrode and said second input/output electrode and output from the other one thereof, and said ground electrode is connected to at least one of a fixed potential power supply and a ground.

59. An LC element according to claim 58 wherein:

the pn junction layer has a spiral shape.

60. An LC element according to claim 59 wherein:

said second region is set different in length than said first region, thereby producing partial correspondence between the first and second regions.

61. An LC element according to claim 59 wherein:

one of said first region and said second region is divided into a plurality of segments, and each divided segment is respectively connected electrically.

62. An LC element according to claim 59 wherein:

by changing the reverse bias applied to said pn junction layer, the capacitance of said pn junction layer can be changed.

63. An LC element according to claim 59 further comprising:

a buffer connected to the output side of said signal transmission line.

64. An LC element according to claim 59 formed in a unitized manner as a portion of substrate wherein:

at least one of the first and second regions of said pn junction layer is inserted into a signal line or power supply line.

65. An LC element according to claim 58 formed in a unitized manner as a portion of substrate wherein:

at least one of the first and second regions of said pn junction layer is inserted into a signal line or power supply line.

66. An LC element according to claim 58 wherein:

the pn junction layer has a curved line shape.

67. An LC element according to claim 66 wherein:

by changing the reverse bias applied to said pn junction layer, the capacitance of said pn junction layer is changed.

68. An LC element according to claim 58 wherein:

said second region is set different in length than said first region, thereby producing partial correspondence between the first and second regions.

69. An LC element according to claim 58 wherein:

the pn junction layer has a meander shape.

70. An LC element according to claim 69 wherein:

said second region is set different in length than said first region, thereby producing partial correspondence between the first and second regions.

71. An LC element according to claim 69 wherein:

one of said first region and said second region is divided into a plurality of segments, and each divided segment is respectively connected electrically.

72. An LC element according to claim 69 wherein:

by changing the reverse bias applied to said pn junction layer, the capacitance of said pn junction layer is changed.

73. An LC element according to claim 69 further comprising:

a buffer connected to the output side of said signal transmission line.

74. An LC element according to claim 69 formed in a unitized manner as a portion of substrate wherein:

at least one of the first and second regions of said pn junction layer is inserted into a signal line or power supply line.

75. An LC element according to claim 58 wherein:

the pn junction layer has a straight line shape.

76. An LC element according to claim 75 wherein:

by changing the reverse bias applied to said pn junction layer, the capacitance of said pn junction layer is changed.

77. An LC element according to claim 58 wherein:

by changing the reverse bias applied to said pn junction layer, the capacitance of said pn junction layer is changed.

78. An LC element according to claim 58 wherein:

one of said first region and said second region is divided into a plurality of segments, and each divided segment is respectively connected electrically.

79. An LC element according to claim 58 further comprising:

a buffer connected to the output side of said signal transmission line.

80. An LC element formed in a portion of a semiconductor substrate comprising:

a pn junction layer having a predetermined shape and functioning as a capacitor when used in a reverse bias state, said pn junction layer including a first region and a second region inverted with respect to the first region, first and second electrodes provided only near respective ends of one of the first region and the second region comprising said pn junction layer, and third and fourth electrodes provided only near respective ends of the other one of the first and second regions comprising said pn junction layer, wherein;

inductors are respectively comprised by the first and second regions, a distributed constant type capacitor is formed by the pn junction layer, the first and second regions of said pn junction layer respectively function as signal transmission lines, thereby enabling use as a common mode type element.

81. An LC element according to claim 80 wherein:

said second region is set different in length than said first region, thereby producing partial correspondence between the first and second regions.

82. An LC element according to claim 80 wherein:

by changing the reverse bias applied to said pn junction layer, the capacitance of said pn junction layer is changed.

83. An LC element according to claim 80, wherein;

the pn junction layer has a meander shape.

84. An LC element according to claim 83 wherein:

by changing the reverse bias applied to said pn junction layer, the capacitance of said pn junction layer is changed.

85. An LC element according to claim 83 wherein:

said second region is set different in length than said first region, thereby producing partial correspondence between the first and second regions.

86. An LC element according to claim 83 further comprising:

a buffer connected to the output side of said signal transmission line.

87. An LC element according to claim 83 formed in a unitized manner as a portion of substrate wherein:

at least one of the first and second regions of said pn junction layer is inserted into a signal line or power supply line.

88. An LC element according to claim 80 wherein:

the pn junction layer has a spiral shade.

89. An LC element according to claim 88 wherein:

said second region is set different in length than said first region, thereby producing partial correspondence between the first and second regions.

90. An LC element according to claim 88 wherein:

by changing the reverse bias applied to said pn junction layer, the capacitance of said pn junction layer is changed.

91. An LC element according to claim 88 further comprising:

a buffer connected to the output side of said signal transmission line.

92. An LC element according to claim 88 formed in a unitized manner as a portion of substrate wherein:

at least one of the first and second regions of said pn junction layer is inserted into a signal line or power supply line.

93. An LC element according to claim 80 further comprising:

a buffer connected to the output side of said signal transmission line.

94. An LC element according to claim 80 formed in a unitized manner as a portion of substrate wherein:

at least one of the first and second regions of said pn junction layer is inserted into a signal line or power supply line.

95. An LC element according to claim 80 wherein;

the pn junction layer has a curved line shade.

96. An LC element according to claim 95 wherein:

by changing the reverse bias applied to said pn junction layer, the capacitance of said pn junction layer is changed.

97. An LC element according to claim 80 wherein;

the pn junction layer has a straight line shape.

98. An LC element according to claim 97 wherein:

by changing the reverse bias applied to said pn junction layer, the capacitance of said pn junction layer is changed.

99. An LC element manufacturing method comprising the steps of:

a first process whereby a meander shaped pn junction layer comprising a first region and a second region inverted with respect thereof is formed in a semiconductor substrate, the second region in direct contact with the substrate and lying between the substrate and the first region, a second process whereby an inductor electrode is formed electrically connected over the entire length of said first region on the surface of said pn junction layer and the second region is not directly connected along its length to the inductor electrode, and a third process whereby a wiring layer is formed respectively connected only to at least one end of said inductor electrode and second region of said pn junction layer.

100. A method of making an LC element, comprising:

forming a pn junction layer in a portion of a semiconductor substrate;

forming one of a first p region and a first n region in the pn junction layer;

forming a second inverted region with respect to the first region;

providing first and second electrodes near respective ends of one of the first region and the second region of the pn junction layer;

providing third and fourth electrodes near respective ends of the other one of the first region and the second region of the pn junction layer, wherein the second region is not electrically connected along its entire length to an inductor electrode;

forming an insulation film on the entire surface of the semiconductor substrate;

opening perforations in portions of the insulation film by one of etching and laser light emission; and closing the perforations by applying solder to the extent of protruding slightly from the surface.

101. The method of claim 100, further comprising:
forming the pn junction layer in a spiral shape.

102. The method of claim 100, further comprising:
forming the pn junction layer in a meander shape.

* * * * *